(12) United States Patent
Lee et al.

(10) Patent No.: US 12,170,272 B2
(45) Date of Patent: Dec. 17, 2024

(54) DISPLAY DEVICE AND METHOD OF FABRICATING THE SAME

(71) Applicant: Samsung Display Co., LTD., Yongin-si (KR)

(72) Inventors: Jong Chan Lee, Suwon-si (KR); Jeong Hyun Lee, Asan-si (KR); Hyun Kim, Seoul (KR); Jung Gun Nam, Suwon-si (KR); Jang Soon Park, Asan-si (KR); Jeong Su Park, Asan-si (KR); Sung Geun Bae, Hwaseong-si (KR); Myeong Hun Song, Pyeongtaek-si (KR); Da Sol Jeong, Seoul (KR); Won Hyeong Heo, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 489 days.

(21) Appl. No.: 17/494,312

(22) Filed: Oct. 5, 2021

(65) Prior Publication Data

US 2022/0271021 A1     Aug. 25, 2022

(30) Foreign Application Priority Data

Feb. 23, 2021    (KR) ........................ 10-2021-0024047

(51) Int. Cl.
    *H01L 25/16*      (2023.01)
    *H01L 33/38*      (2010.01)
    *H01L 33/62*      (2010.01)

(52) U.S. Cl.
    CPC ............ *H01L 25/167* (2013.01); *H01L 33/38* (2013.01); *H01L 33/62* (2013.01); *H01L 2933/0016* (2013.01); *H01L 2933/0066* (2013.01)

(58) Field of Classification Search
    CPC ........ H01L 25/167; H01L 33/38; H01L 33/62
    See application file for complete search history.

(56) References Cited

U.S. PATENT DOCUMENTS

| | | |
|---|---|---|
| 2020/0409498 A1 | 12/2020 | Rhe et al. |
| 2021/0288217 A1 | 9/2021 | Li et al. |
| 2021/0391503 A1 | 12/2021 | Lee et al. |

(Continued)

FOREIGN PATENT DOCUMENTS

| | | |
|---|---|---|
| KR | 10-2020-0010685 | 1/2020 |
| KR | 10-2020-0010704 | 1/2020 |

(Continued)

OTHER PUBLICATIONS

International Search Report corresponding to International Application No. PCT/KR2022/002584 dated Jun. 7, 2022.

(Continued)

*Primary Examiner* — Joseph L Williams
(74) *Attorney, Agent, or Firm* — KILE PARK REED & HOUTTEMAN PLLC

(57) ABSTRACT

A display device and a method of fabricating a display device. The display device includes a substrate including an emission area and a subarea adjacent to the emission area, a bank disposed in the emission area of the substrate, a height difference compensation pattern disposed in the subarea of the substrate, a first electrode and a second electrode that are disposed on the bank, the first electrode and the second electrode being spaced apart from each other, and a light-emitting element disposed in the emission area, between the first electrode and the second electrode.

15 Claims, 38 Drawing Sheets

(56) References Cited

U.S. PATENT DOCUMENTS

| | | |
|---|---|---|
| 2022/0052107 A1 | 2/2022 | Lee |
| 2022/0077228 A1 | 3/2022 | Do et al. |
| 2022/0093828 A1 | 3/2022 | Kwag et al. |
| 2022/0123026 A1 | 4/2022 | Oh et al. |

FOREIGN PATENT DOCUMENTS

| | | |
|---|---|---|
| KR | 10-2020-0042075 | 4/2020 |
| KR | 10-2020-0063380 | 6/2020 |
| KR | 10-2020-0088954 | 7/2020 |
| KR | 10-2020-0088962 | 7/2020 |
| KR | 10-2021-0001277 | 1/2021 |
| KR | 10-2021-0155440 | 12/2021 |

OTHER PUBLICATIONS

Written Opinion corresponding to International Application No. PCT/KR2022/002584, dated Jun. 7, 2022.

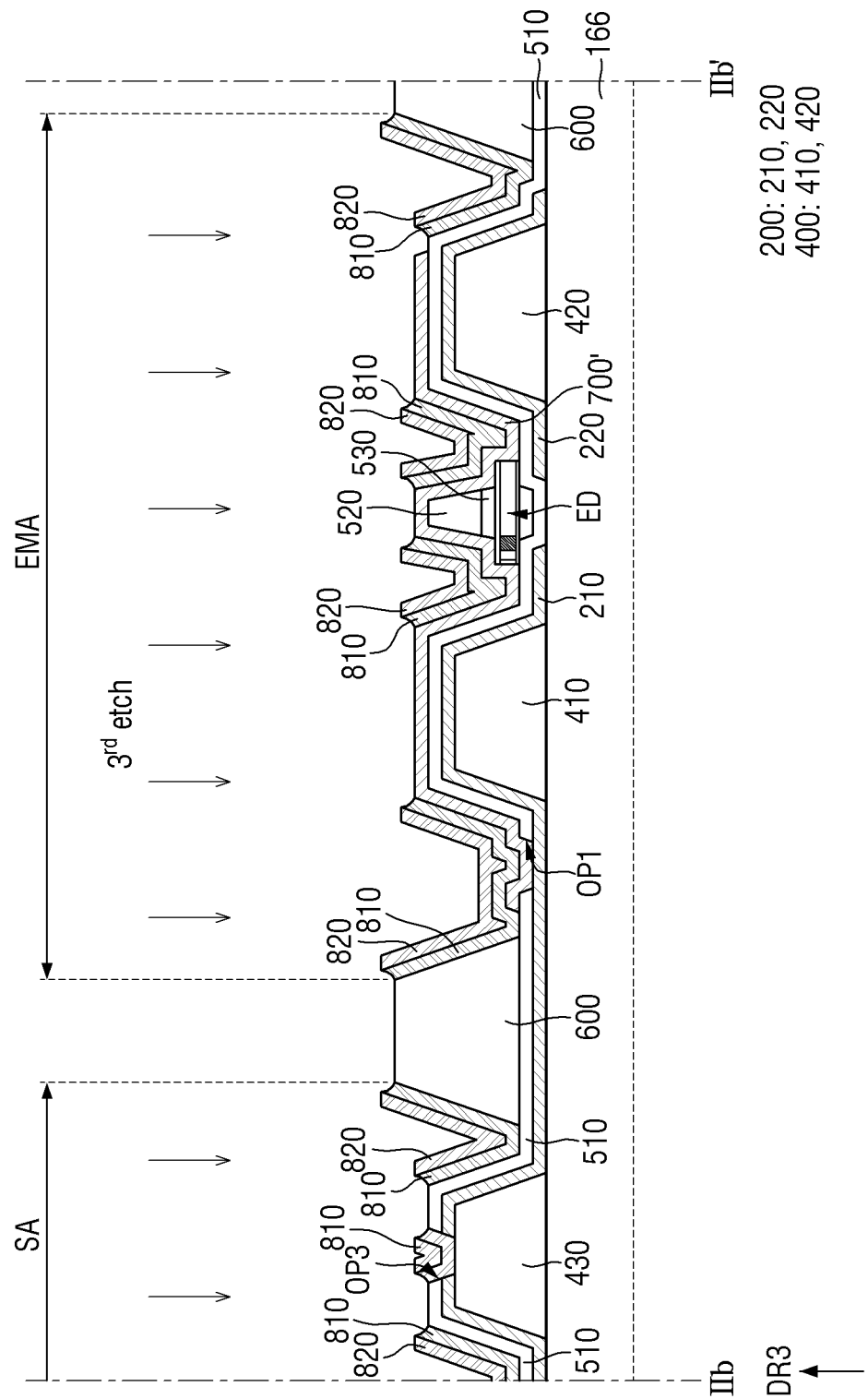

DISPLAY DEVICE AND METHOD OF FABRICATING THE SAME

CROSS-REFERENCE TO RELATED APPLICATION(S)

This application claims priority to and benefits of Korean Patent Application No. 10-2021-0024047 under 35 U.S.C. § 119, filed on Feb. 23, 2021 in the Korean Intellectual Property Office (KIPO), the entire contents of which are incorporated herein by reference.

BACKGROUND

1. Technical Field

The disclosure relates to a display device and a method of fabricating the same.

2. Description of the Related Art

Display devices are becoming more important with developments in multimedia technology. Accordingly, various display devices such as an organic light-emitting diode (OLED) display device and a liquid crystal display (LCD) device, and the like are in use.

A display device, which is a device for displaying an image, includes a display panel such as an OLED display panel or an LCD panel. The display panel may include light-emitting elements such as light-emitting diodes (LEDs), and the LEDs may be classified into OLEDs using an organic material as a light-emitting material and inorganic LEDs (ILEDs) using an inorganic material as a light-emitting material.

SUMMARY

Embodiments of the disclosure provide a display device having an improved process margin for forming contact electrodes by forming the contact electrodes via chemical mechanical polishing (CMP).

Embodiments of the disclosure also provide a method of fabricating a display device having an improved process margin for forming contact electrodes by forming the contact electrodes via CMP.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include a substrate including an emission area and a subarea adjacent to the emission area, a bank disposed in the emission area of the substrate, a height difference compensation pattern disposed in the subarea of the substrate, a first electrode and a second electrode that are disposed on the bank, the first electrode and the second electrode being spaced apart from each other, and a light-emitting element disposed in the emission area, between the first electrode and the second electrode.

A top surface of the bank and a top surface of the height difference compensation pattern may be on a same level.

The bank may include a first sub-bank and a second sub-bank which are spaced apart from each other, and the first electrode and the second electrode may be disposed on the first sub-bank and the second sub-bank, respectively.

The display device may further comprise a first insulating layer disposed on the first electrode and the second electrode, and a second insulating layer disposed on the light-emitting element, the second insulating layer exposing end portions of the light-emitting element. The light-emitting element may be disposed on the first insulating layer.

A top surface of the second insulating layer and a top surface of part of the first insulating layer on the top surface of the bank may be on a same level.

The display device may further include a first contact electrode electrically connected to the first electrode and a first end portion of the light-emitting element, and a second contact electrode electrically connected to the second electrode and a second end portion of the light-emitting element. The first contact electrode and the second contact electrode may be spaced apart from each other, and the second insulating layer may be disposed between the first contact electrode and the second contact electrode.

The first contact electrode and the second contact electrode may not be disposed on the top surface of the bank and on a top surface of the second insulating layer.

The display device may further include a third insulating layer disposed on the first contact electrode and the second contact electrode, and a fourth insulating layer disposed on the third insulating layer. The third insulating layer and the fourth insulating layer include different materials.

The third insulating layer and the fourth insulating layer may not be disposed on the top surface of the bank and on a top surface of the second insulating layer.

The third insulating layer may include silicon nitride ($SiN_x$), and the fourth insulating layer may include silicon oxide ($SiO_x$).

The first electrode and the second electrode may extend to be disposed on the height difference compensation pattern, and the first electrode and the second electrode may expose parts of a top surface of the height difference compensation pattern.

The display device may further include a first insulating layer disposed on the first electrode and the second electrode. The light-emitting element may be disposed on the first insulating layer, and the first insulating layer may include a first opening exposing part of the first electrode in the emission area, a second opening exposing part of the second electrode in the emission area, and a third opening exposing part of a top surface of the height difference compensation pattern in the subarea.

The third opening may not overlap the first electrode and the second electrode in the subarea.

The third opening may be located higher than the first opening and the second opening in a cross-sectional view of the display device.

The bank and the height difference compensation pattern may be formed in a same layer.

According to another embodiment of the disclosure, a method of fabricating a display device may include preparing a substrate including an emission area and a sub-area, forming a first alignment line and a second alignment line which may be disposed in the emission area and the subarea and may be spaced apart from each other, arranging light-emitting elements between the first alignment line and the second alignment line in the emission area, forming a first insulating layer on the light-emitting elements to expose end portions of each of the light emitting elements, forming a contact electrode material layer on the first insulating layer, using chemical mechanical polishing (CMP) to expose part of the contact electrode material layer, and forming a first contact electrode and a second contact electrode by removing the part of the contact electrode material layer using the etching mask, wherein the part of the contact electrode material layer exposed by the etching mask may be disposed on a top surface of the first insulating layer, the first contact electrode and the second contact electrode may be spaced apart from each other, and the first insulating layer may be disposed between the first contact electrode and the second contact electrode.

The forming of the etching mask may include depositing a photoresist layer on an entire surface of the contact electrode material layer, and removing a part of the photoresist layer by a chemical mechanical polishing process using the contact electrode material layer as a polishing stopper, and the part of the photoresist layer is polished by the chemical mechanical polishing process to form the etching mask.

A top surface of the etching mask and a top surface of the contact electrode material layer are on a same level in a region near the first insulating layer.

The forming of the etching mask may include depositing a first insulating material layer on the contact electrode material layer, depositing a second insulating material layer on the first insulating material layer, and forming the second insulating layer by performing chemical mechanical polishing using the first insulating material layer as a polishing stopper to remove part of the second insulating material layer, the second insulating layer exposes part of the first insulating material layer on a top surface of the first insulating layer.

A top surface of the first insulating material layer and a top surface of the second insulating layer are on a same plane in a region near the first insulating layer.

The forming of the etching mask may further include forming a third insulating layer by removing part of the first insulating material layer exposed by the second insulating layer, the second insulating layer and the third insulating layer expose the part of the contact electrode material layer on the top surface of the first insulating layer and form the etching mask.

Each of the first insulating material layer and the second insulating material layer may include an inorganic material, and the first insulating material layer and the second insulating material layer may include different materials.

According to the aforementioned and other embodiments of the disclosure, a contact electrode division process for forming a contact electrode material layer formed on a second insulating layer into first and second contact electrodes that may be spaced apart from each other with the second insulating layer interposed therebetween may be performed by CMP. Specifically, a photoresist pattern may be formed by performing CMP using the contact electrode material layer on the second insulating layer as an etching stopper, and as a result, the first and second contact electrodes may be formed by stably dividing the contact electrode material layer. Thus, as the first and second contact electrodes can be stably formed by CMP, the process margin for a display device can be improved. Also, as a height difference separation pattern may be formed in a subarea to have the same height as, or a similar height to, the top surface of the second insulating layer and an alignment line layer may be formed on the height difference separation pattern, the alignment line layer can be divided into first and second electrodes without a requirement of an additional mask process during an alignment line division process. Thus, the manufacturing efficiency for a display device can be improved.

In other embodiments, the contact electrode division process may be performed by CMP using first and second inorganic films having different materials. Specifically, the first and second inorganic films may be sequentially formed on the contact electrode material layer on the second insulating layer, the second inorganic film may be polished using the first inorganic film as a polishing stopper, and part of the second inorganic film exposed by the first inorganic film may be removed. Accordingly, the contact electrode material layer can be stably divided, thereby forming the first and second contact electrodes.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which:

FIGS. 31 through 38 are schematic plan views or cross-sectional views illustrating steps of a method of fabricating the display device of FIG. 30.

DETAILED DESCRIPTION OF THE EMBODIMENTS

Figure 1:
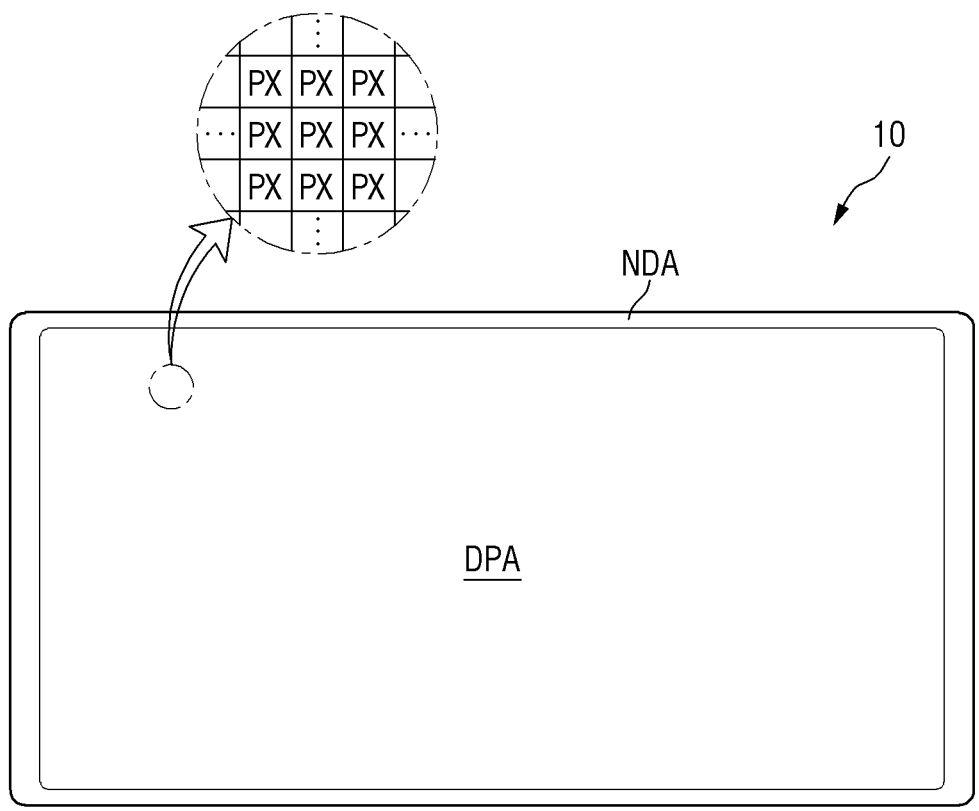
FIG. 1 is a schematic plan view of a display device according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well (and vice versa), unless the context clearly indicates otherwise.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It will be understood that the terms "connected to" or "coupled to" may include a physical or electrical connection or coupling.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as "not overlapping" or "to not overlap" another element, this may include that the elements are spaced apart from each other, offset from each other, or set aside from each other or any other suitable term as would be appreciated and understood by those of ordinary skill in the art.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

"About", "approximately", and "substantially", as used herein are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view of a display device according to an embodiment of the disclosure.

Referring to FIG. 1, a display device 10 may display a moving or still image. The display device 10 may refer to nearly all types of electronic devices that provide a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display, a mobile communication terminal, an electronic notepad, an electronic book, a portable multimedia player (PMP), a navigation device, a gaming console, a digital camera, and a camcorder.

The display device 10 may include a display panel that provides a display screen. Examples of the display panel may include an inorganic light-emitting diode (ILED) display panel, an organic LED (OLED) display panel, a quantum-dot light-emitting diode (QLED) display panel, a plasma display panel (PDP), and a field emission display (FED) panel. The display panel of the display device 10 will hereinafter be described as being an ILED display panel, but the disclosure is not limited thereto.

First, second, and third directions DR1, DR2, and DR3 may be defined as illustrated in the accompanying drawings. Specifically, the first and second directions DR1 and DR2 may be directions that may be perpendicular to each other within a same plane. The third direction DR3 may be a direction that is perpendicular to the plane that may include the first and second directions DR1 and DR2. The third direction DR3 may be perpendicular to each of the first and second directions DR1 and DR2. The third direction DR3 may refer to the thickness direction (or display direction) of the display device 10.

The display device 10 may have a rectangular shape that is longer in the first direction DR1 than in the second direction DR2 in a plan view. The corners at which the long sides and the short sides of the display device 10 meet may be right-angled, but the disclosure is not limited thereto. In other embodiments, the corners at which the long sides and the short sides of the display device 10 meet may be rounded. The planar shape of the display device 10 is not particularly limited but may vary. The display device 10 may have various shapes other than a rectangular shape, such as a square shape, a rectangular shape with rounded corners, a non-tetragonal polygonal shape, or a circular shape.

The display surface of the display device 10 may be disposed on a side, in the third direction DR3 (or the thickness direction), of the display device 10. Unless specified otherwise, the terms "above" and "top", as used herein, may refer to the third direction DR3 (or the display direction of the display device 10), and the term "top surface", as used herein, may refer to a surface that may be directed to the third direction DR3. Also, unless specified otherwise, the terms "below" and "bottom", as used herein, may refer to the opposite direction of the third direction DR3 (or the opposite direction of the display direction of the display device 10), and the term "bottom surface", as used herein, may refer to a surface that may be directed to the opposite direction of the third direction DR3. Also, unless specified otherwise, the terms "left", "right", "upper", and "lower", as used herein, may refer to their respective directions as viewed from above the display device 10. For example, the term "right" may refer to the first direction DR1, the term "left" may refer to the opposite direction of the first direction DR1, the term "upper" may refer to the second direction DR2, and the term "lower" may refer to the opposite direction of the second direction DR2.

The display device 10 may include a display area DPA and a non-display area NDA. The display area DPA may be an area in which a screen may be displayed, and the non-display area NDA may be an area in which a screen may not be displayed.

The shape of the display area DPA may conform to the shape of the display device 10. In one example, the display area DPA may have a similar shape to the display device 10, i.e., a rectangular shape, in a plan view. The display area DPA may generally account for the middle part of the display device 10.

The display area DPA may include pixels PX. The pixels PX may be arranged in row and column directions. The pixels PX may have a rectangular or square shape in a plan view. The pixels PX may be alternately arranged in a stripe or PenTile® fashion. Each of the pixels PX may include light-emitting elements that may be formed of inorganic particles.

The non-display area NDA may be disposed around the display area DPA. The non-display area NDA may surround the entire display area DPA or part of the display area DPA. The non-display area NDA may form the bezel of the display device 10.

Figure 2:
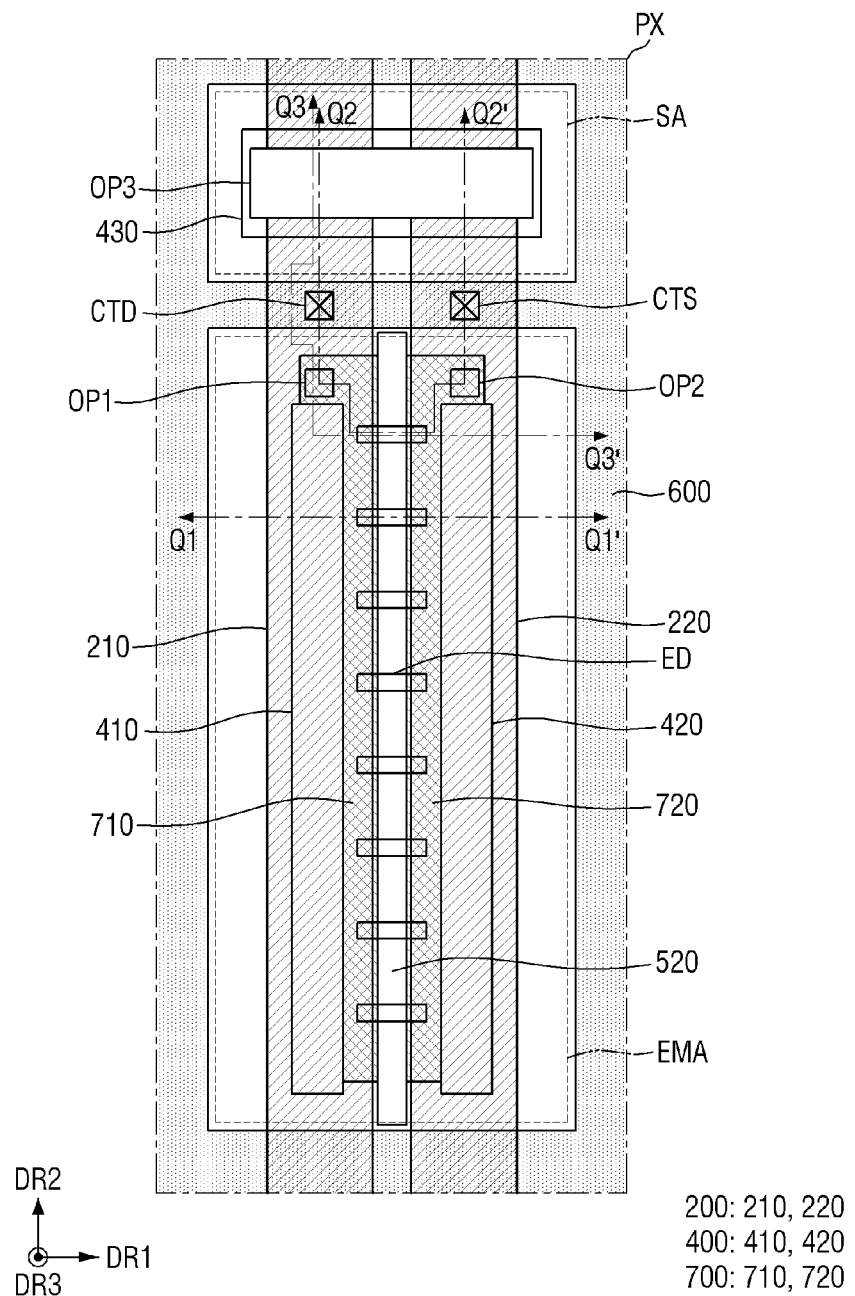
FIG. 2 is a schematic plan view of a pixel of the display device of FIG. 1.

FIG. 2 is a schematic plan view of a pixel of the display device of FIG. 1.

Referring to FIG. 2, a pixel PX of the display device 10 may include an emission area EMA and a non-emission area. The emission area EMA may be defined as a region that outputs light emitted by light-emitting elements ED, and the non-emission area may be defined as a region that may not be reached by light emitted by the light-emitting elements ED and thus does not output light.

The emission area EMA may include a region where the light-emitting elements ED may be disposed and a region around the region where the light-emitting elements ED may be disposed. Also, the emission area EMA may further include a region that outputs light emitted by the light-emitting elements ED and reflected or refracted by other elements.

The pixel PX may include a subarea SA, which may be disposed in the non-emission area. The light-emitting elements ED may not be disposed in the subarea SA. The subarea SA may be disposed above the emission area EMA (or on a first side, in the second direction DR2, of the emission area EMA), in the pixel PX. The subarea SA may be disposed between the emission area EMA and an emission area EMA of a neighboring pixel PX adjacent to the pixel PX in the second direction DR2. The subarea SA may include an area where an electrode layer 200 of the pixel PX and an electrode layer 200 of the neighboring pixel PX may be separate from each other.

The pixel PX may include the electrode layer 200, a first bank 400, a height difference compensation pattern 430, a second bank 600, light-emitting elements ED, a first insulating layer 510 (see FIG. 3), a second insulating layer 520, and a contact electrode layer 700.

The layout of multiple elements in the pixel PX will hereinafter be described.

In a plan view, the second bank 600 may include parts that extend in the first direction DR1 and parts that extend in the second direction DR2 and may be arranged in a lattice pattern, over the entire surface of the display area DPA. The second bank 600 may be disposed along the boundaries of the pixel PX to separate the pixel PX from other neighboring pixels PX. Also, the second bank 600 may be disposed to surround and separate the emission area EMA and the subarea SA, in the pixel PX. For example, the second bank 600 may define the emission area EMA and the subarea SA of the pixel PX.

The second bank 600 may allow ink having light-emitting elements ED dispersed therein to be sprayed properly into the emission area EMA, without spilling over to other neighboring pixels PX, during inkjet printing for aligning the light-emitting elements ED. Also, as the emission area EMA and the subarea SA may be separated by the second bank 600, the light-emitting elements ED may be sprayed into the emission area EMA, but not into the subarea SA, during inkjet printing. Thus, the light-emitting elements ED may be arranged in the emission area EMA, but not in the subarea SA.

The first bank 400 may be disposed in the emission area EMA. The first bank 400 may extend in the second direction DR2 in the emission area EMA. The first bank 400 may extend in the second direction DR2 and may be spaced apart from the second bank 600, which may surround the emission area EMA. For example, the length, in the second direction DR2, of the first bank 400 may be smaller than the length, in the second direction DR2, of the emission area EMA. However, the disclosure is not limited thereto. In other embodiments, the first bank 400 may extend in the second direction DR2 to be disposed in part even in the subarea SA.

The first bank 400 may include sub-banks, which extend in one direction and may be spaced apart from each other in a direction intersecting the direction in which they extend. As the sub-banks may be disposed to be spaced apart from, and face, each other, the sub-banks may provide space in which the light-emitting elements ED may be arranged.

The first bank 400 may include first and second sub-banks 410 and 420, which extend in the second direction DR2 and may be spaced apart from each other in the first direction DR1. In one example, in a plan view, the first sub-bank 410 may be disposed in the left part of the emission area EMA, and the second sub-bank 420 may be disposed in the right part of the emission area EMA. The first bank 400 is illustrated as including two sub-banks (i.e., the first and second sub-banks 410 and 420), but the number of sub-banks included in the first bank 400 is not particularly limited. In other embodiments, the first bank 400 may include three or more sub-banks depending on the number of electrodes provided in the pixel PX.

The height difference compensation pattern 430 may be disposed in the subarea SA. The height difference compensation pattern 430 may have a rectangular shape that extends longer in the first direction DR1 than in the second direction DR2 in a plan view. The height difference compensation pattern 430 may be spaced apart from parts of the second bank 600 surrounding the subarea SA. The height difference compensation pattern 430 may be disposed in the subarea SA to cover parts of the electrode layer 200 in the subarea SA, along the second direction DR2. As will be described later, the height difference compensation pattern 430 may be formed in the subarea SA to protrude in the third direction DR3 in a cross-sectional view, the height difference compensation pattern 430 may compensate for any height differences on the top surface of the electrode layer 200, which may be disposed in and across the emission area EMA and the subarea SA. This will be described later in detail.

The electrode layer 200 may be disposed in and across the emission area EMA and the subarea SA. The electrode layer 200 may extend in one direction. The electrode layer 200 may be initially formed as an alignment line layer 200' (see FIG. 10) during the fabrication of the display device 10 and may be used to generate an electric field for aligning the light-emitting elements ED. In one example, the alignment line layer 200' may extend in the second direction DR2 to be disposed across pixels PX that may be adjacent to one another in the second direction DR2 and may apply the same alignment signal to multiple pixels PX belonging to the same column. The light-emitting elements ED may receive a dielectrophoretic force from an electric field generated on the alignment line layer 200' in accordance with the alignment signal. The electrode layer 200 may be formed by dividing the alignment layer 200' in the subarea SA after the alignment of the light-emitting elements ED. Specifically, the division of the alignment line layer 200', which extends in the second direction DR2, into the electrode layer 200 may be performed on the top surface of the height difference compensation pattern 430 in the subarea SA.

The electrode layer 200 may include electrodes, which may extend in a direction and may be spaced apart from each other in a direction intersecting the direction in which they extend. In one example, the electrode layer 200 may include first and second electrodes 210 and 220, which extend in the second direction DR2 and may be spaced apart from each other in the first direction DR1. The electrode layer 200 is illustrated as including two electrodes (i.e., the first and second electrodes 210 and 220), but the number of electrodes included in the electrode layer 200 is not particularly limited. In another example, the electrode layer 200 may include three or more electrodes that may be spaced apart from one another.

The first electrode 210 may be disposed in the left part of the pixel PX in a plan view. The first electrode 210 may extend in the second direction DR2 and may be disposed in and across the emission area EMA and the subarea SA.

The first electrode 210 may be disposed on the first sub-bank 410, in the emission area EMA, and on the height difference compensation pattern 430, in the subarea SA. In the emission area EMA, the first electrode 210 may extend in the second direction DR2 to completely cover the first sub-bank 410 in the third direction DR3. In the subarea SA, the first electrode 210 may expose at least part of the top surface of the height difference compensation pattern 430 in the third direction DR3. The part of the top surface of the height difference compensation pattern 430 exposed by the first electrode 210 may be a region where the first electrode 210 of the pixel PX may be separate from a first electrode 210 of the neighboring pixel PX adjacent to the pixel PX in the second direction DR2. For example, the first electrode 210 of the pixel PX and the first electrode 210 of the neighboring pixel PX adjacent to the pixel PX in the second direction DR2 may be spaced apart from, and face, each other on the height difference compensation pattern 430.

The second electrode 220 may be disposed in the right part of the pixel PX in a plan view. The second electrode 220 may be spaced apart from, and face, the first electrode 210 in the first direction DR1. The second electrode 220 may extend in the second direction DR2 and may be disposed in and across the emission area EMA and the subarea SA.

The second electrode 220 may be disposed on the second sub-bank 420, in the emission area EMA, and on the height difference compensation pattern 430, in the subarea SA. In the emission area EMA, the second electrode 220 may extend in the second direction DR2 to completely cover the second sub-bank 420 in the third direction DR3. In the subarea SA, the second electrode 220 may expose at least part of the top surface of the height difference compensation pattern 430 in the third direction DR3. The part of the top surface of the height difference compensation pattern 430 exposed by the second electrode 220 may be a region where the second electrode 220 of the pixel PX may be separate from a second electrode 220 of the neighboring pixel PX adjacent to the pixel PX in the second direction DR2. For example, the second electrode 220 of the pixel PX and the second electrode 220 of the neighboring pixel PX adjacent to the pixel PX in the second direction DR2 may be spaced apart from, and face, each other on the height difference compensation pattern 430.

The first and second electrodes 210 and 220 may be formed to have a greater width than the first and second sub-banks 410 and 420, respectively. In one example, the width, in the first direction DR1, of the first electrode 210 may be greater than the width, in the first direction DR1, of the first sub-bank 410, and the width, in the first direction DR1, of the second electrode 220 may be greater than the width, in the first direction DR1, of the second sub-bank 420. Thus, in a plan view, the distance, in the first direction DR1, between the first and second electrodes 210 and 220 may be smaller than the distance, in the first direction DR1, between the first and second sub-banks 410 and 420.

The width, in the first direction DR1, of the height difference compensation pattern 430 may be greater than the sum of the first width, in the first direction DR1, of the first electrode 210, the width, in the first direction DR1, of the second electrode 220, and the distance, in the first direction DR1, between the first and second electrodes 210 and 220. For example, the height difference compensation pattern 430 may cover the first and second electrodes 210 and 220 in the second direction DR2. As the width, in the first direction DR1, of the height difference compensation pattern 430 may be greater than the sum of the first width, in the first direction DR1, of the first electrode 210, the width, in the first direction DR1, of the second electrode 220, and the distance, in the first direction DR1, between the first and second electrodes 210 and 220, a division process (hereinafter, referred to as the alignment line division process) for the alignment line layer 200' for forming electrodes, i.e., the first and second electrodes 210 and 220, may be performed on the top surface of the height difference compensation pattern 430.

The light-emitting elements ED may be disposed in the emission area EMA. The light-emitting elements ED may not be disposed in the subarea SA. The light-emitting elements ED may be disposed between sub-banks, in the emission area EMA. In one example, the light-emitting elements ED may be disposed between the first and second sub-banks 410 and 420.

The light-emitting elements ED may extend in a direction. The light-emitting elements ED may be disposed between the first and second sub-banks 410 and 420. The light-emitting elements ED may be disposed such that end portions of each of the light-emitting elements ED may be placed on the first and second electrodes 210 and 220, between the first and second sub-banks 410 and 420. In one example, first end portions of the light-emitting elements ED may be placed on the first electrode 210, and second end portions of the light-emitting elements ED may be placed on the second electrode 220.

The light-emitting elements ED may be spaced apart from one another in the direction in which the first and second electrodes 210 and 220 extend, i.e., in the second direction DR2, and may be aligned substantially parallel to one another.

The length of the light-emitting elements ED (i.e., the length, in the first direction DR1, of the light-emitting elements ED) may be smaller than the minimum distance between the first and second sub-banks 410 and 420, which may be spaced apart from each other in the first direction DR1. Also, the length of the light-emitting elements ED may be greater than the minimum distance between the first and second electrodes 210 and 220, which may be spaced apart from each other in the first direction DR1. As the distance, in the first direction DR1, between the first and second sub-banks 410 and 420 may be greater than the length of the light-emitting elements ED and the distance, in the first direction DR1, between the first and second electrodes 210 and 220 may be smaller than the length of the light-emitting elements ED, the light-emitting elements ED may be disposed such that end portions of each of the light-emitting elements ED may be placed on the first and second electrodes 210 and 220, between the first and second electrodes 210 and 220.

The second insulating layer 520 may be disposed in the emission area EMA. The second insulating layer 520 may extend in the second direction DR2 in the emission area EMA, in a plan view. The second insulating layer 520 may form a linear or island pattern in the pixel PX.

The second insulating layer 520 may be disposed on the light-emitting elements ED, in the emission area EMA. The second insulating layer 520 may overlap in part with the light-emitting elements ED in the third direction DR3, in the emission area EMA, and may be disposed in part on elements exposed by the light-emitting elements ED. The second insulating layer 520 may be formed on the light-emitting elements ED to surround the outer surfaces of each of the light-emitting elements ED. As the second insulating layer 520 may be formed to surround the outer surfaces of each of the light-emitting elements ED and to extend in the second direction DR2, the second insulating layer 520 may fix the light-emitting elements ED, which may be spaced apart from one another.

The second insulating layer 520 may expose end portions of each of the light-emitting elements ED. Thus, the width, in the first direction DR1, of the second insulating layer 520 may be smaller than the length of the light-emitting elements ED (i.e., the length, in the first direction DR1, of the light-emitting elements ED).

The contact electrode layer 700 may be disposed in the emission area EMA. The contact electrode layer 700 may be disposed on the electrode layer 200, in the emission area EMA. The contact electrode layer 700 may be in contact with the electrode layer 200 and the light-emitting elements ED and may thus connect the electrode layer 200 and the light-emitting elements ED.

The contact electrode layer 700 may include contact electrodes, which may be spaced apart from each other. The contact electrode 700 may include first and second contact electrodes 710 and 720, which may be spaced apart from each other.

The first contact electrode 710 may be disposed on the first electrode 210, in the emission area EMA. The first contact electrode 710 may extend in the second direction DR2 on the first electrode 210. The first contact electrode 710 may be in contact with the first electrode 210 and the first end portions of the light-emitting elements ED, in the emission area EMA. The first contact electrode 710 may be in contact with part of the first electrode 210 exposed by the first opening OP1 of the first insulating layer 510 (see FIG. 4) and with the first end portions of the light-emitting elements ED exposed by the second insulating layer 520. For example, the first contact electrode 710 may electrically connect the first electrode 210 and the first end portions of the light-emitting elements ED.

The first contact electrode 710 may be disposed on a side surface of the first sub-bank 410 on the first electrode 210, but may not be disposed on the top surface of the first sub-bank 410. Also, the first contact electrode 710 may be disposed on a side surface of the second insulating layer 520 on the first end portions of the light-emitting elements ED, but may not be disposed on the top surface of the second insulating layer 520. Thus, in a plan view, the first contact electrode 710 may adjoin, and be in contact with, sides of the first sub-bank 410 and the second insulating layer 520 that may be opposite to each other.

The second contact electrode 720 may be disposed on the second electrode 220, in the emission area EMA. The second contact electrode 720 may extend in the second direction DR2 on the second electrode 220. The second contact electrode 720 may be in contact with the second electrode 220 and the second end portions of the light-emitting elements ED, in the emission area EMA. The second contact electrode 720 may be in contact with part of the second electrode 220 exposed by the second opening OP2 of the first insulating layer 510 and with the second end portions of the light-emitting elements ED exposed by the second insulating layer 520. For example, the second contact electrode 720 may electrically connect the second electrode 220 and the second end portions of the light-emitting elements ED.

The second contact electrode 720 may be disposed on a side surface of the second sub-bank 420 on the second electrode 220, but may not be disposed on the top surface of the second sub-bank 420. Also, the second contact electrode 720 may be disposed on a side surface of the second insulating layer 520 on the second end portions of the light-emitting elements ED, particularly, but may not be disposed on the top surface of the second insulating layer 520. Thus, in a plan view, the second contact electrode 720 may adjoin, and be in contact with, sides of the second sub-bank 420 and the second insulating layer 520 that may be opposite to each other.

The first and second contact electrodes 710 and 720 may be spaced apart from each other with the second insulating layer 520 interposed therebetween. The first and second contact electrodes 710 and 720 may be electrically insulated from each other.

The first and second contact electrodes 710 and 720 may include the same material. The first and second contact electrodes 710 and 720 may be formed in the same layer. In one example, the first and second contact electrodes 710 and 720 may be formed at the same time by the same process. The first and second contact electrodes 710 and 720 may be formed by a process (hereinafter, referred to as a contact electrode division process or a contact electrode patterning process) of forming a contact electrode material layer 700' (see FIG. 20) on the first bank 400 and the second insulating layer 520 and removing parts of the contact electrode material layer 700' on the top surfaces of the first bank 400 and the second insulating layer 520.

Figure 3:
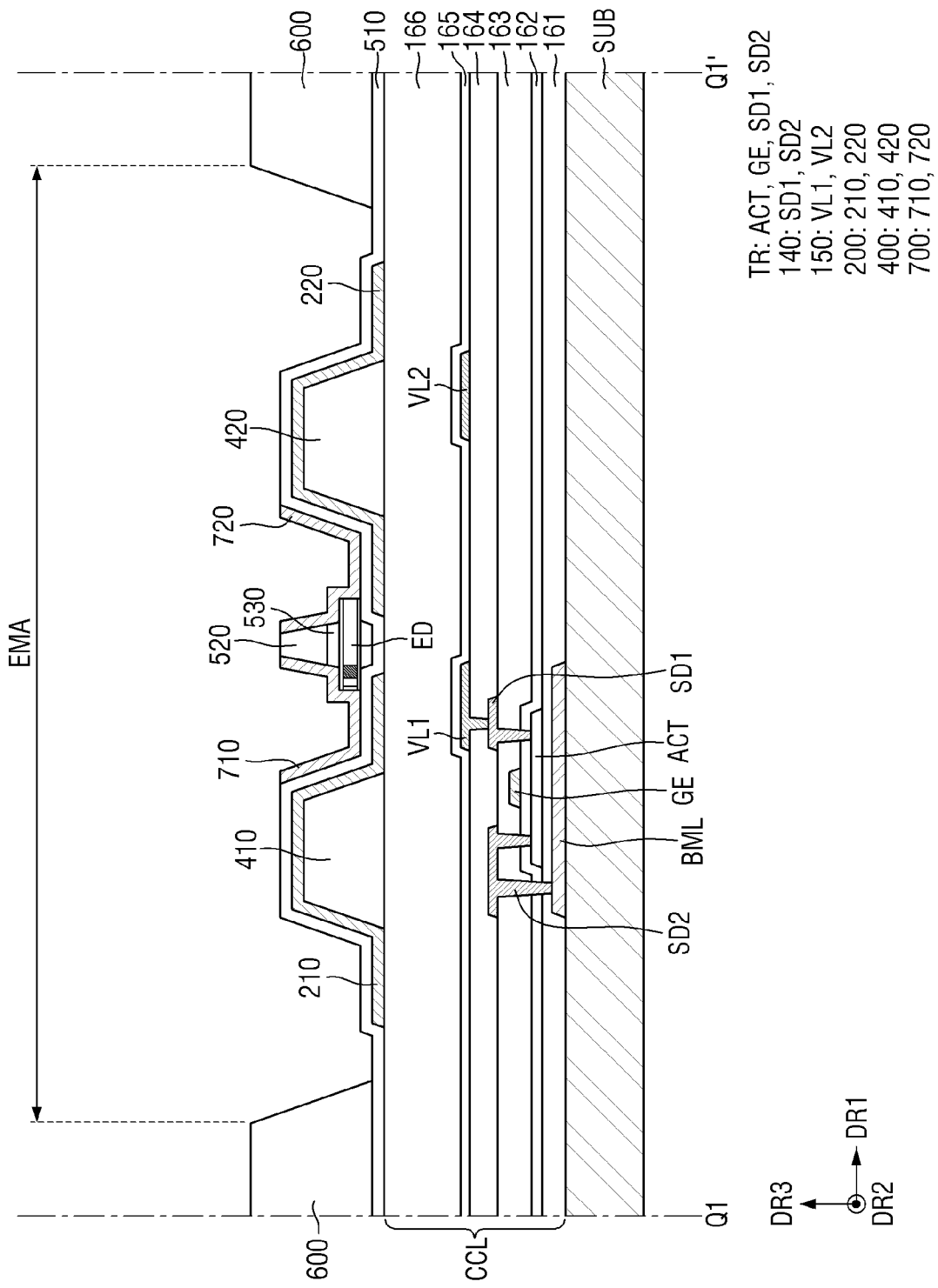
FIG. 3 is a schematic cross-sectional view taken along line Q1-Q1' of FIG. 2.
Figure 4:
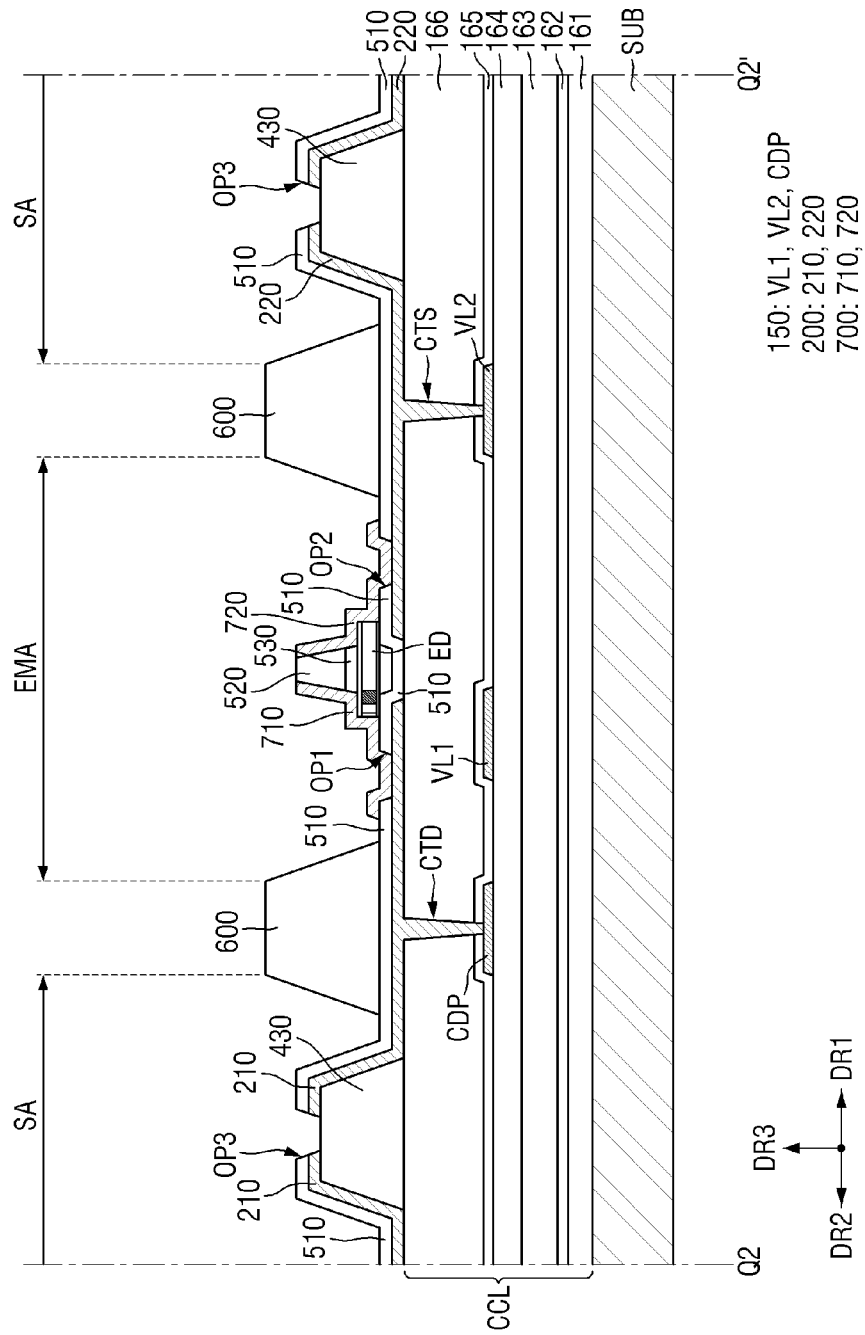
FIG. 4 is a schematic cross-sectional view taken along line Q2-Q2' of FIG. 2.
Figure 5:
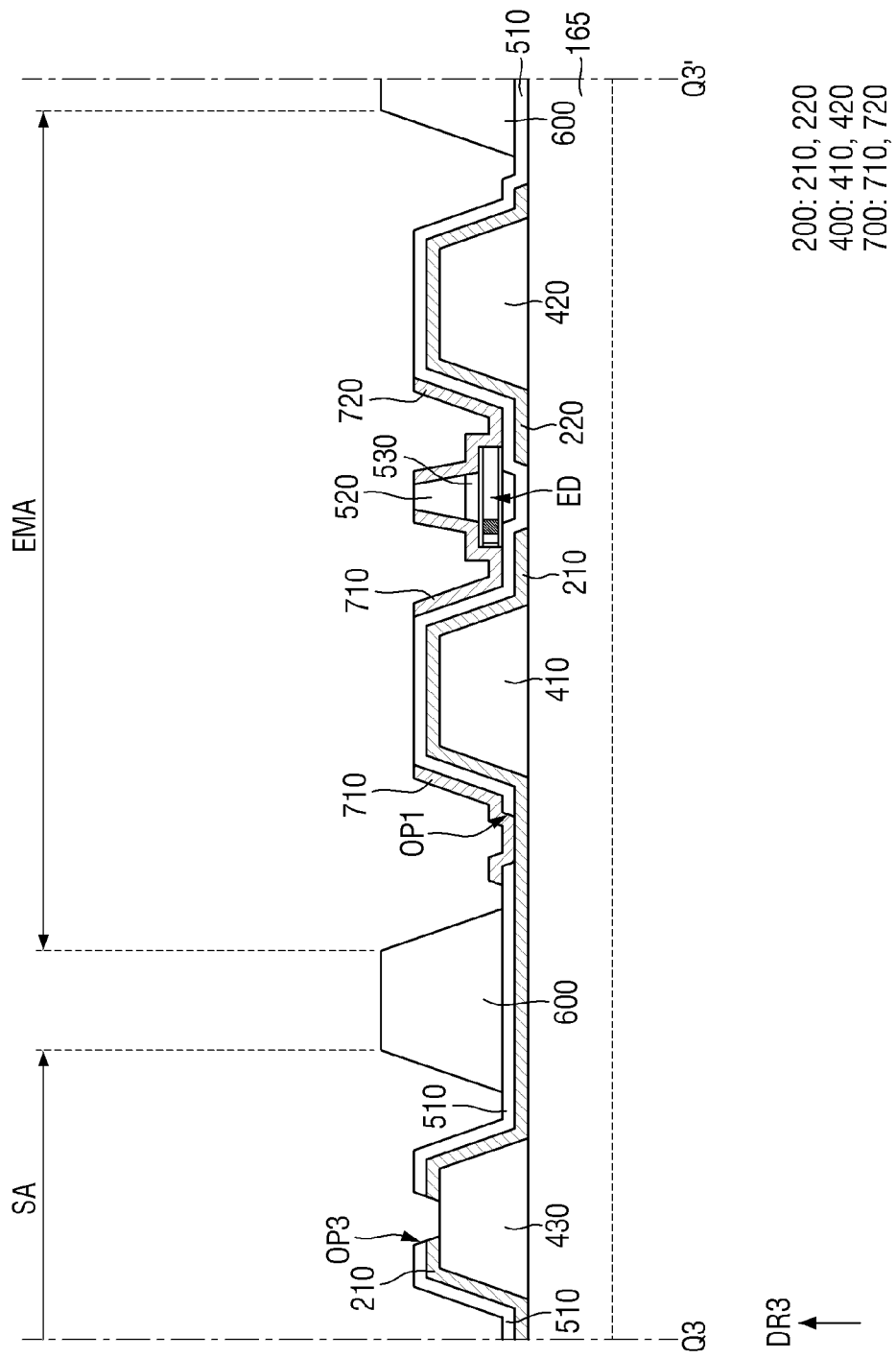
FIG. 5 is a schematic cross-sectional view taken along line Q3-Q3' of FIG. 2.

FIG. 3 is a schematic cross-sectional view taken along line Q1-Q1' of FIG. 2. FIG. 4 is a schematic cross-sectional view taken along line Q2-Q2' of FIG. 2. FIG. 5 is a schematic cross-sectional view taken along line Q3-Q3' of FIG. 2.

Referring to FIGS. 2 through 5, the display device 10 may include, in the pixel of FIG. 2, a substrate SUB, a circuit element layer CCL, which may be disposed on the substrate SUB, the electrode layer 200, which may be disposed on the circuit element layer CCL, and a light-emitting element layer, which includes the first bank 400, the height difference compensation pattern 430, the second bank 600, the light-emitting elements ED, the first insulating layer 510, the second insulating layer 520, a third insulating layer 530, and the contact electrode layer 700.

The substrate SUB and the circuit element layer CCL on the substrate SUB will hereinafter be described first with reference to FIGS. 3 and 4.

The substrate SUB may be an insulating substrate. The substrate SUB may be formed of an insulating material such as glass, quartz, a polymer resin, or a combination thereof. The substrate SUB may be a rigid substrate or a flexible substrate that may be bendable, foldable, or rollable.

The circuit element layer CCL may be disposed on the substrate SUB. The circuit element layer CCL may include conductive layers, at least one transistor TR, insulating films, a first voltage line VL1, and a second voltage line VL2.

A lower metal layer BML, may be disposed on the substrate SUB. The lower metal layer BML may be a light-blocking layer protecting an active layer ACT of the transistor TR. The lower metal layer BML may include a material capable of blocking light. In one example, the lower metal layer BML may include an opaque metallic material capable of blocking the transmission of light.

The lower metal layer BML may be disposed to cover at least the channel region of the active layer ACT of the transistor TR or to cover the entire active layer ACT of the transistor TR, but the disclosure is not limited thereto. In other embodiments, the lower metal layer BML may not be provided.

A buffer layer 161 may be disposed on the lower metal layer BML. The buffer layer 161 may be disposed to cover the entire surface of the substrate SUB where the lower metal layer BML may be disposed. The buffer layer 161 may protect the transistor TR from moisture that may penetrate the substrate SUB, which may be vulnerable to moisture.

A semiconductor layer may be disposed on the buffer layer 161. The semiconductor layer may include the active layer ACT of the transistor TR. As described above, the active layer ACT of the transistor TR may be disposed to overlap the light-blocking layer (i.e., lower metal layer BML).

The semiconductor layer may include polycrystalline silicon, monocrystalline silicon, an oxide semiconductor, or a combination thereof. Here, polycrystalline silicon may be formed by crystallizing amorphous silicon. In an embodiment where the semiconductor layer includes polycrystalline silicon, the active layer ACT of the transistor TR may include doped regions that may be doped with impurities and a channel region between the doped regions. In another embodiment, the semiconductor layer may include an oxide semiconductor. The oxide semiconductor may be, for example, indium tin oxide (ITO), indium zinc oxide (IZO), indium gallium oxide (IGO, indium zinc tin oxide (IZTO), indium gallium zinc oxide (IGZO), indium gallium tin oxide (IGTO), or indium gallium zinc oxide (IGZTO).

A gate insulating film 162 may be disposed on the semiconductor layer. The gate insulating film 162 may serve as the gate insulating film for the transistor TR. The gate insulating film 162 may be formed as a multilayer in which inorganic layers including at least one of, for example, silicon oxide ($SiO_x$), silicon nitride ($SiN_x$), and silicon oxynitride ($SiO_xN_y$) may be alternately stacked on each other.

A first conductive layer may be disposed on the gate insulating film 162. The first conductive layer may include a gate electrode GE of the transistor TR. The gate electrode GE of the transistor TR may be disposed to overlap the channel region of the active layer ACT of the transistor TR in the third direction DR3, which may be the thickness direction of the substrate SUB.

A first interlayer insulating film 163 may be disposed on the first conductive layer. The first interlayer insulating film 163 may be disposed to cover the gate electrode GE of the transistor TR. The first interlayer insulating film 163 may serve as an insulating film between the first conductive layer and layers disposed on the first conductive layer and may protect the first conductive layer.

A second conductive layer 140 may be disposed on the first interlayer insulating film 163. The second conductive layer 140 may include drain and source electrodes SD1 and SD2 of the transistor TR. Although not specifically illustrated, the second conductive layer 140 may include a data line.

The drain and source electrodes SD1 and SD2 of the transistor TR may be electrically connected to ends of the active layer ACT of the transistor TR through contact holes that penetrate the first interlayer insulating film 163 and the gate insulating film 162. Also, the drain electrode SD1 may be electrically connected to the lower metal layer BML, through another contact hole that penetrates the first interlayer insulating film 163, the gate insulating film 162, and the buffer layer 161.

A second interlayer insulating film 164 may be disposed on the second conductive layer 140. The second interlayer insulating film 164 may serve as an insulating film between the second conductive layer 140 and layers disposed above the second conductive layers 140 and may protect the second conductive layer 140.

A third conductive layer 150 may be disposed on the second interlayer insulating film 164. The third conductive layer 150 may include the first voltage line VL1, the second voltage line VL2, and a first conductive pattern CDP.

A high-potential voltage (or a first power supply voltage), which may be supplied to the transistor TR, may be applied to the first voltage line VL1, and a low-potential voltage (or a second power supply voltage), which may be lower than the high-potential voltage applied to the first voltage line VL1, may be applied to the second voltage line VL2.

The first voltage line VL1 may be electrically connected to the drain electrode SD1 of the transistor TR through a contact hole that penetrates the second interlayer insulating film 164.

The second voltage line VL2 may be electrically connected to the second electrode 220 through a second electrode contact hole CTS that penetrates a passivation layer 165 and a via layer 166. The second power supply voltage applied to the second voltage line VL2 may be supplied to the second electrode 220. An alignment signal for aligning the light-emitting elements ED may be applied to the second voltage line VL2 during the fabrication of the display device 10.

The first conductive pattern CDP may be electrically connected to the transistor TR. Although not specifically illustrated, the first conductive pattern CDP may be electrically connected to the source electrode SD2 of the transistor TR through a contact hole that penetrates the second interlayer insulating film 164. Also, the first conductive pattern CDP may be electrically connected to the first electrode 210 through a first electrode contact hole CTD that penetrates the passivation layer 165 and the via layer 166. The transistor TR may transmit the first power supply voltage applied thereto from the first voltage line VL1 to the first electrode 210 through the first conductive pattern CDP.

The passivation layer 165 may be disposed on the third conductive layer 150. The passivation layer 165 may be disposed on the third conductive layer 150 to protect the third conductive layer 150.

The via layer 166 may be disposed on the passivation layer 165. The via layer 166 may perform a surface planarization function. The via layer 166 may include an organic insulating material such as, for example, polyimide (PI).

Each of the buffer layer 161, the gate insulating film 162, the first interlayer insulating film 163, the second interlayer insulating film 164, and the passivation layer 165 may include inorganic layers that may be alternately stacked on each other. In one example, each of the buffer layer 161, the gate insulating film 162, the first interlayer insulating film 163, the second interlayer insulating film 164, and the passivation layer 165 may be formed as a double-layer or a multilayer in which inorganic layers including at least one of, for example, $SiO_x$, $SiN_x$, and $SiO_xN_y$ may be alternately stacked on each other, but the disclosure is not limited thereto. In other embodiments, each of the buffer layer 161, the gate insulating film 162, the first interlayer insulating film 163, the second interlayer insulating film 164, and the passivation layer 165 may be formed as a single inorganic layer of, for example, $SiO_x$, $SiN_x$, and $SiO_xN_y$.

The first conductive layer, the second conductive layer 140, and the third conductive layer 150 may be formed as single- or multilayer films including molybdenum (Mo), aluminum (Al), chromium (Cr), gold (Au), titanium (Ti), nickel (Ni), neodymium (Nd), copper (Cu), or an alloy thereof, but the disclosure is not limited thereto.

A light-emitting element layer may be disposed on the via layer 166. The structure of the light-emitting element layer will hereinafter be described with reference to FIGS. 3 through 5.

The first bank 400 may be disposed on the via layer 166, in the emission area EMA. The first bank 400 may protrude from a surface of the via layer 166 in the thickness direction of the substrate SUB (i.e., in the third direction DR3).

The first and second sub-banks 410 and 420 may be disposed on (e.g., directly on) the surface of the via layer 165. The first and second sub-banks 410 and 420 may protrude from the top surface of the via layer 166 in the thickness direction of the substrate SUB. The first and second sub-banks 410 and 420 may be formed to have a height from the top surface of the via layer 166. Here, the height of each element may be measured as the distance of the uppermost surface (e.g., the top surface) of the element from a reference surface or plane such as the top surface of the substrate SUB or the via layer 166.

Each of the first and second sub-banks 410 and 420 may have a top surface and side surfaces. Protruding parts of the first and second sub-banks 410 and 420 may each have inclined side surfaces. As each of the first and second sub-banks 410 and 420 has inclined side surfaces, the first and second sub-banks 410 and 420 may direct light emitted from the light-emitting elements ED to travel toward the side surfaces of each of the first and second sub-banks 410 and 420 to an upward direction (e.g., the display direction of the display device 10. For example, the first and second sub-banks 410 and 420 may function as reflective barriers capable of changing the direction of light into the display direction of the display device 10, together with the first and second electrodes 210 and 220.

The first and second sub-banks 410 and 420 may be spaced apart from each other in the first direction DR1, in the emission area EMA. Side surfaces of the first and second sub-banks 410 and 420 may be spaced apart from, and face, each other. As the first and second sub-banks 410 and 420 may be disposed to be spaced apart from, and face, each other in the emission area EMA, and may be formed to protrude from the top surface of the via layer 166, the first and second sub-banks 410 and 420 may provide space in which the light-emitting elements ED may be arranged.

The first bank 400 is illustrated as having linearly inclined side surfaces, but the disclosure is not limited thereto. In other embodiments, the side surfaces (or the outer surfaces) of the first bank 400 may be curved into a semicircular or semielliptical shape. Even in this case, the first bank 400 may protrude, in the third direction DR3, to a height from the surface of the via layer 166.

The first bank 400 may include an organic insulating material such as, for example, PI, but the disclosure is not limited thereto.

The height difference compensation pattern 430 may be disposed on the via layer 166, in the subarea SA. The height difference compensation pattern 430 may be disposed on (e.g., directly on) the surface of the via layer 166. The height difference compensation pattern 430 may protrude from the surface of the via layer 166 in the thickness direction of the substrate SUB (i.e., in the third direction DR3). The height difference compensation pattern 430 may be formed to have a height from the top surface of the via layer 166.

The height difference compensation pattern 430 may be formed in the same layer (or level) as the first bank 400. The height difference compensation pattern 430 may have substantially the same height as, or a similar height to, the top surface of the second insulating layer 520 on the light-emitting elements ED. Here, the height of each element may be measured from a reference surface or plane such as the top surface of the substrate SUB or the via layer 166. In some embodiments, the height difference compensation pattern 430 may be formed by the same process as the first bank 400. For example, the height difference compensation pattern 430 may be formed through patterning by the same process as the first bank 400. The height difference compensation pattern 430 may include the same material as the first bank 400. However, the disclosure is not limited thereto. In other embodiments, the height difference compensation pattern 430 may be formed in the same layer as the first bank 400, but may be obtained by a different process from the first bank 400.

As the height difference compensation pattern 430 may be formed to have substantially the same height as the top surface of the second insulating layer 520, in the subarea SA, an alignment line division process for forming the electrode layer 200, which may be separate from the electrode layer 200 of the neighboring pixel PX adjacent to the pixel PX in the second direction DR2, by dividing the alignment line layer 200' in the subarea SA may be performed without a requirement of an additional mask process. Also, as the alignment line layer 200' (see FIG. 11) may be disposed on the height difference compensation pattern 430, in the subarea SA, the alignment line layer 200' may be as high as the height difference compensation pattern 430, in the subarea SA where the alignment line division process may be performed, and as a result, other elements can be prevented from being damaged by an etchant used in the alignment line division process. For example, as the height difference compensation pattern 430 may be formed to have the same height as the top surface of the second insulating layer 520 in the subarea SA, an additional mask process or an additional protective layer for preventing damage to other elements may not be needed in the alignment line division process.

The electrode layer 200 may be disposed on the first bank 400 and the height difference compensation pattern 430. The electrode layer 200 may include the first and second electrodes 210 and 220.

The first electrode 210 may extend in the second direction DR2 and may be disposed in and across the emission area EMA and the subarea SA. The first electrode 210 may be disposed on the first sub-bank 410 and part of the via layer 166 exposed by the first bank 400, in the emission area EMA, and may be disposed on the height difference compensation pattern 430 and part of the via layer 166 exposed by the height difference compensation pattern 430, in the subarea SA.

The first electrode 210 may be disposed on the first sub-bank 410, in the emission area EMA, to cover the outer surfaces of the first sub-bank 410. The first electrode 210 may be disposed on at least the inclined side surfaces of the first sub-bank 410, in the emission area EMA. The first electrode 210 may be disposed to cover at least one inclined side surface of the first sub-bank 410, which may be spaced apart from, and faces, the second sub-bank 420, to reflect light emitted from the light-emitting elements ED, in the display direction of the display device 10.

In the subarea SA, the first electrode 210 may cover parts of the outer surfaces of the height difference compensation pattern 430 and may expose part of the top surface of the height difference compensation pattern 430. The exposed part of the top surface of the height difference compensation pattern 430 may be a region where an alignment line division process for an alignment line layer 200' may be performed.

The first electrode 210 may be electrically connected to the first conductive pattern CDP through the first electrode contact hole CTD, which penetrates the via layer 166. The first electrode 210 may be in contact with part of the top surface of the first conductive pattern CDP exposed by the first electrode contact hole CTD. The first electrode 210 may be electrically connected to the transistor TR through the first conductive pattern CDP. The first electrode contact hole CTD is illustrated as being disposed to overlap the second bank 600 in the third direction DR3, but the location of the first electrode contact hole CTD is not particularly limited.

The second electrode 220 may extend in the second direction DR2 to be disposed in and across the emission area EMA and the subarea SA. The second electrode 220 may be disposed on the second sub-bank 420 and part of the via layer 166 exposed by the first bank 400, in the emission area EMA, and on the height difference compensation pattern 430 and part of the via layer 166 exposed by the height difference compensation pattern 430, in the subarea SA.

The second electrode 220 may be disposed on the second sub-bank 420, in the emission area EMA, to cover the outer surfaces of the second sub-bank 420. The second electrode 220 may be disposed on at least the inclined side surfaces of the second sub-bank 420, in the emission area EMA. The second electrode 220 may be disposed to cover at least one inclined side surface of the second sub-bank 420, which may be spaced apart from, and face, the first sub-bank 410, to reflect light emitted from the light-emitting elements ED, in the display direction of the display device 10.

The second electrode 220 may cover parts of the outer surfaces of the height difference compensation pattern 430, but expose part of the top surface of the height difference compensation pattern 430, in the subarea SA. The part of the top surface of the height difference compensation pattern 430 exposed by the second electrode 220 may be a region where the alignment line division process for the alignment line layer 200' may be performed.

The second electrode 220 may be electrically connected to the second voltage line VL2 through the second electrode contact hole CTS, which penetrates the via layer 166. The second electrode 220 may be in contact with part of the top surface of the second voltage line VL2 exposed by the second electrode contact hole CTS. The second power supply voltage may be applied to the second electrode 220 through the second voltage line VL2. The second electrode contact hole CTS is illustrated as overlapping the second bank 600 in the third direction DR3, but the location of the second electrode contact hole CTS is not particularly limited.

Each of the first and second electrodes 210 and 220 may have a stepped structure that reflects the pattern or shape of the underlying element. For example, each of the first and second electrodes 210 and 220 may have a stepped structure having different heights in different regions. Specifically, parts of the first and second electrodes 210 and 220 on the first bank 400 and on the height difference compensation pattern 430 may be higher than part of the first electrode 210 on the via layer 166.

The first and second electrodes 210 and 220 may extend in the second direction DR2 in a plan view and may be separate from first and second electrodes 210 and 220 of the neighboring pixel PX adjacent to the pixel PX in the second direction DR2, on the top surface of the height difference compensation pattern 430 in the subarea SA.

The first and second electrodes 210 and 220 may be electrically connected to the light-emitting elements ED. The first and second electrodes 210 and 220 may be connected to end portions of each of the light-emitting elements ED through the first and second contact electrodes 710 and 720, respectively, and may transmit electrical signals applied thereto from the circuit element layer CCL to the light-emitting elements ED.

The electrode layer 200 may include a conductive material with high reflectance. In one example, the electrode layer 200 may include a metal with high reflectance such as silver (Ag), Cu, Al, Mo, or Ti or an alloy of Al, Ni, or lanthanum (La). The electrode layer 200 may reflect light emitted by the light-emitting elements ED toward the side surfaces of the second bank 400, in an upward direction of the pixel PX. However, the disclosure is not limited thereto. The electrode layer 200 may further include a transparent conductive material. In one example, the electrode layer 200 may include a material such as ITO, IZO, ITZO, or a combination thereof. In one example, the electrode layer 200 may be formed as a multilayer structure in which a transparent conductive material and a high-reflectance metal layer may be stacked on each other or as a single layer including the transparent conductive material and the high-reflectance metal layer. The electrode layer 200 may have a stack of, for example, ITO/Ag/ITO/, ITO/Ag/IZO, or ITO/Ag/ITZO/IZO.

The first insulating layer 510 may be disposed on the electrode layer 200. The first insulating layer 510 may be disposed to cover the electrode layer 200 and part of the via layer 166 exposed by the electrode layer 200.

The first insulating layer 510 may include openings that penetrate the first insulating layer 510. Specifically, the first insulating layer 510 may include first, second, and third openings OP1, OP2, and OP3, which may be spaced apart from one another.

The first opening OP1 may be disposed in the emission area EMA. The first opening OP1 may expose part of the top surface of the first electrode 210, in the emission area EMA. The first opening OP1 may not overlap the first bank 400 in the third direction DR3. Specifically, the first opening OP1 may not overlap the first sub-bank 410 in the third direction DR3.

The first contact electrode 710 may be electrically connected to the first electrode 210 through the first opening OP1. Specifically, as the first contact electrode 710 may be in contact with part of the top surface of the first electrode 210 exposed by the first opening OP1, the first contact electrode 710 may be electrically connected to the first electrode 210. For example, the first opening OP1 may be a contact part where the first electrode 210 and the first contact electrode 710 may be placed in contact with each other.

The second opening OP2 may be spaced apart from the first opening OP1, in the emission area EMA. The second opening OP2 may expose part of the top surface of the second electrode 220, in the emission area EMA. The second opening OP2 may not overlap the first bank 400 in the third direction DR3. Specifically, the second opening OP2 may not overlap the second sub-bank 420 in the third direction DR3.

The second contact electrode 720 may be electrically connected to the second electrode 220 through the second opening OP2. Specifically, as the second contact electrode 720 may be in contact with the part of the top surface of the second electrode 220 exposed by the second opening OP2, the second contact electrode 720 may be electrically connected to the second electrode 220. For example, the second opening OP2 may be a contact part where the second electrode 220 and the second contact electrode 720 may be placed in contact with each other.

The third opening OP3 may be disposed in the subarea SA. The third opening OP3 may be spaced apart from the first and second openings OP1 and OP2. The third opening OP3 may be formed on the top surface of the height difference compensation pattern 430. The third opening OP3 may expose part of the top surface of the height difference compensation pattern 430, in the subarea SA. The part of the top surface of the height difference compensation pattern 430 exposed by the third opening OP3 may overlap a region where the first and second electrodes 210 and 220 of the pixel PX may be separate from the first and second electrodes 210 and 220 of the neighboring pixel PX adjacent to the pixel PX in the second direction DR2. Thus, the third opening OP3 may not overlap the first and second electrodes 210 and 220 in the third direction DR3. In a plan view, the first and second electrodes 210 and 220 of the pixel PX may be spaced apart from the first and second electrodes 210 and 220, respectively, of the neighboring pixel PX adjacent to the pixel PX in the second direction DR2 by the third opening OP3. For example, the third opening OP3 may be a region where the alignment line division process for the alignment line layer 200' for forming the first and second electrodes 210 and 220 may be performed.

The first and second openings OP1 and OP2 may have substantially the same height. The third opening OP3 may have a different height from the first and second openings OP1 and OP2. The height of the third opening OP3 may be greater than the height of the first and second openings OP1 and OP2. As the third opening OP3 may be formed on the top surface of the height difference compensation pattern 430, the height of the third opening OP3 may be greater than the height of the first and second openings OP1 and OP2 by as much as the thickness of the height difference compensation pattern 430.

The first insulating layer 510 may not only protect the electrode layer 200, but also may insulate the first and second electrodes 210 and 220. Also, the first insulating layer 510 prevents the light-emitting elements ED, which may be disposed on the first insulating layer 510, from being in direct contact with, and damaged by, the underlying elements. The first insulating layer 510 may include an inorganic insulating material, but the disclosure is not limited thereto.

The second bank 600 may be disposed on the first insulating layer 510. In a plan view, the second bank 600 may include parts that extend in the first direction DR1 and parts that extend in the second direction DR2 and may be arranged in a lattice pattern.

As the second bank 600 may be formed to have a greater height than the first bank 400 and defines the emission area EMA and the subarea SA of the pixel PX, ink having the light-emitting elements ED dispersed therein can be sprayed into the emission area EMA of the pixel PX without infiltrating into other pixels PX. The second bank 600 may include an organic insulating material such as, for example, PI, but the disclosure is not limited thereto.

The light-emitting elements ED may be disposed on the first insulating layer 510, in the emission area EMA. The light-emitting elements ED may be disposed between the first and second sub-banks 410 and 420. The light-emitting elements ED may be disposed on the first insulating layer 510 such that end portions thereof may be placed on the first and second electrodes 210 and 220, between the first and second sub-banks 410 and 420.

The second insulating layer 520 may be disposed on the light-emitting elements ED. Part of the second insulating layer 520 may partially surround the outer surfaces of each of the light-emitting elements ED, and part of the second insulating layer 520 may be disposed on parts of the first insulating layer 510 exposed by the light-emitting elements ED. Part of the second insulating layer 520 on the light-emitting elements ED may not cover end portions of each of the light-emitting elements ED. Thus, the width, in the first direction DR1, of the second insulating layer 520 may be smaller than the length, in the first direction DR1, of the light-emitting elements ED. As the part of the second insulating layer 520 on the light-emitting elements ED extend in the first direction DR2 on the first insulating layer 510 in a plan view, the second insulating layer 520 may form a linear or island pattern in the pixel PX.

The second insulating layer 520 may protect and fix the light-emitting elements ED during the fabrication of the display device 10. In one example, the second insulating layer 520 may fix the light-emitting elements ED such that the light-emitting elements ED can be prevented from being detached from the first insulating layer 510 during processes that follow the alignment of the light-emitting elements ED.

Figure 20:
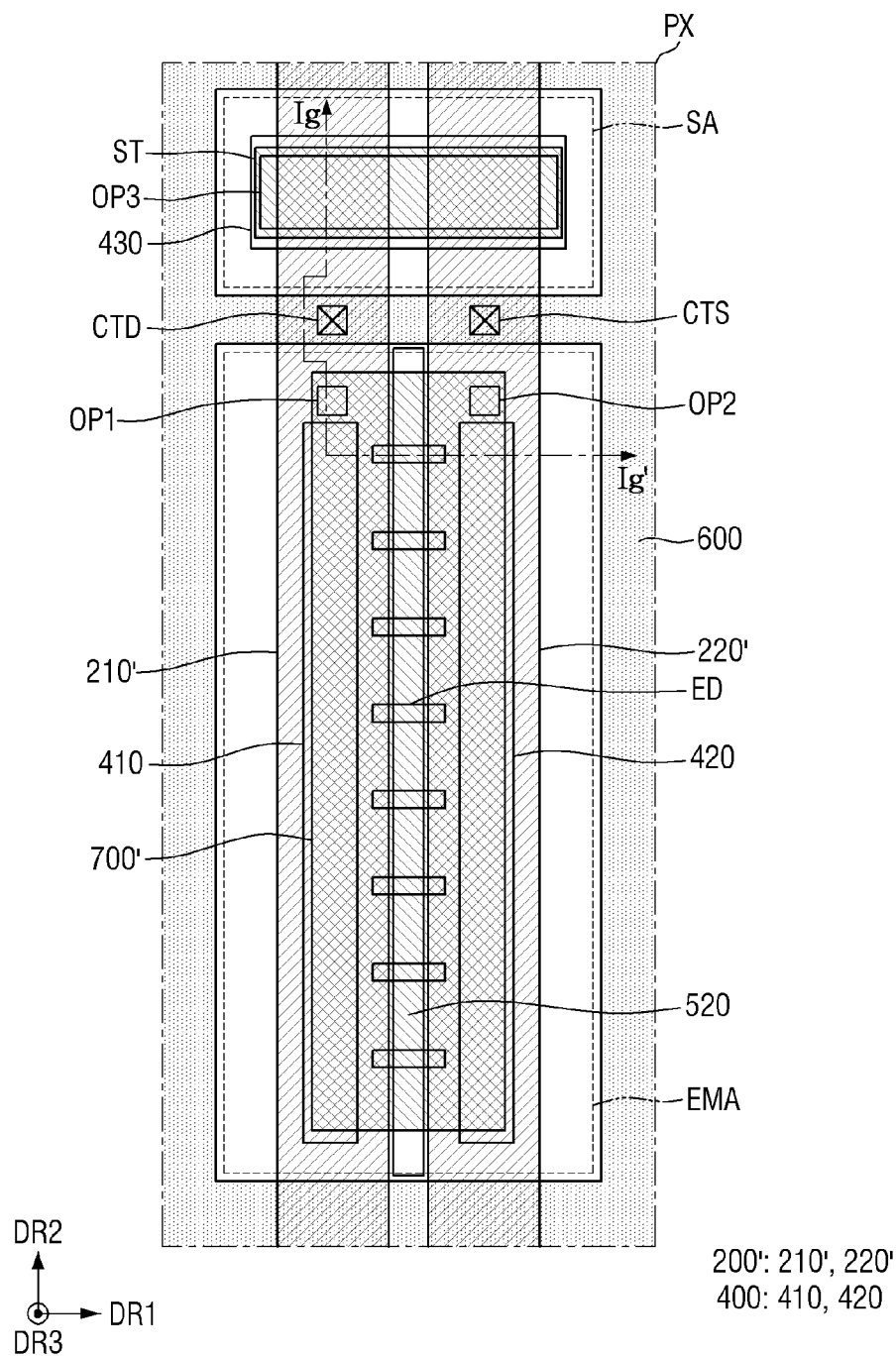

Also, as the second insulating layer 520 may be formed to have a thickness, the second insulating layer 520 may be used in the contact electrode division process for forming the first and second contact electrodes 710 and 720, which may be spaced apart from each other, by dividing the contact electrode material layer 700' (see FIG. 20). The contact electrode division process may be performed using a height difference in the contact electrode material layer 700' that may be formed by the second insulating layer 520.

The second insulating layer 520 may include an organic insulating material such as, for example, PI, but the disclosure is not limited thereto.

The third insulating layer 530 may be interposed between the first and second insulating layers 510 and 520 or between the second insulating layer 520 and the light-emitting elements ED, in the emission area EMA. In one example, the third insulating layer 530 may be interposed between the second insulating layer 520 and the light-emitting elements ED and between the second insulating layer 520 and the parts of the first insulating layer 510 exposed by the light-emitting elements ED.

The third insulating layer 530 may be formed earlier than the second insulating layer 520 and may protect the light-emitting elements ED and fix the light-emitting elements ED on the first insulating layer 510. In one example, in a case where the second insulating layer 520 includes an organic insulating material, the light-emitting elements ED, which may be aligned in a region between the first and second electrodes 210 and 220, may deviate from the region between the first and second electrodes 210 and 220 due to the fluidity of the second insulating layer 520. Thus, the third insulating layer 530, which includes an inorganic insulating material, may be formed before the formation of the second insulating layer 520, which includes an organic insulating material, and as a result, the light-emitting elements ED can be stably fixed on the first insulating layer 510, in the region between the first and second electrodes 210 and 220. Thus, the deviation of the light-emitting elements ED can be prevented.

In one example, third insulating layer 530 may be formed by the same mask process as the second insulating layer 520. Thus, the third insulating layer 530 may generally have a similar pattern to the second insulating layer 520. In one example, a third insulating material layer may be applied on the light-emitting elements ED and the first insulating layer 510, the second insulating layer 520, which may be patterned, may be formed on the third insulating material layer through a mask process, and the third insulating layer 530, which may be patterned, may be formed through etching by using the second insulating layer 520 as a mask. Thus, the third insulating layer 530 may generally have a similar pattern to the second insulating layer 520.

The contact electrode layer 700 may be disposed in the emission area EMA. The contact electrode layer 700 may be disposed on the second insulating layer 520. The contact electrode layer 700 may include the first and second contact electrodes 710 and 720, which may be spaced apart from each other.

The first contact electrode 710 may be disposed on the first electrode 210.

Part of the first contact electrode 710 may be disposed between the first sub-bank 410 and the second insulating layer 520, which may be spaced apart from, and face, each other. The first contact electrode 710 may be disposed to cover the first end portions of the light-emitting elements ED and side surfaces of the first sub-bank 410 and the second insulating layer 520 that may be opposite to each other.

Specifically, the first contact electrode 710 may be disposed on a side surface of the first sub-bank 410 that faces the first end portions of the light-emitting elements ED in a cross-sectional view, and may extend in a direction toward the light-emitting elements ED to cover the first end portions of the light-emitting elements ED. Also, the first contact electrode 710 may extend from the first end portions of the light-emitting elements ED to the second insulating layer 520 to be disposed on side surfaces of the second and third insulating layers 520 and 530 that may be spaced apart from, and face, the first sub-bank 410.

The first contact electrode 710 may be disposed on the side surface of the first sub-bank 410, but not on the top surface of the first sub-bank 410. Also, the first contact electrode 710 may be disposed on the side surface of the second insulating layer 520, but not on the top surface of the second insulating layer 520.

Part of the first contact electrode 710 may be in contact with the part of the top surface of the first electrode 210 exposed by the first opening OP1. The first contact electrode 710 may be electrically connected to the first electrode 210 through the first opening OP1.

The second contact electrode 720 may be spaced apart from the first contact electrode 710. The second contact electrode 720 may be spaced apart from the first contact electrode 710 by the second and third insulating layers 520 and 530.

The second contact electrode 720 may be disposed on the second electrode 220. Part of the second contact electrode 720 may be disposed between the second sub-bank 420 and the second insulating layer 520, which may be spaced apart from, and face, each other. The second contact electrode 720 may be disposed to cover the second end portions of the light-emitting elements ED and side surfaces of the second sub-bank 420 and the second insulating layer 520 that may be opposite to each other.

Specifically, the second contact electrode 720 may be disposed on a side surface of the second sub-bank 420 that faces the second end portions of the light-emitting elements ED in a cross-sectional view, and may extend in a direction toward the light-emitting elements ED to cover the second end portions of the light-emitting elements ED. Also, the second contact electrode 720 may extend from the second end portions of the light-emitting elements ED to the second insulating layer 520 to be disposed on side surfaces of the second and third insulating layers 520 and 530 that may be spaced apart from, and face, the second sub-bank 420.

The second contact electrode 720 may be disposed on the side surface of the second sub-bank 420, but not on the top surface of the second sub-bank 420. Also, the second contact electrode 720 may be disposed on the side surface of the second insulating layer 520, but not on the top surface of the second insulating layer 520.

Part of the second contact electrode 720 may be in contact with the part of the top surface of the second electrode 220 exposed by the second opening OP2. The second contact electrode 720 may be electrically connected to the second electrode 220 through the second opening OP2.

The first contact electrode 710 may be in contact with the first electrode 210 through the first opening OP1 and with the first end portions of the light-emitting elements ED exposed by the second and third insulating layers 520 and 530. As the first contact electrode 710 may be in contact with the first electrode 210 and the first end portions of the light-emitting elements ED, the first contact electrode 710 may electrically connect the first electrode 210 and the light-emitting elements ED. The second contact electrode 720 may be in contact with the second electrode 220 through the second opening OP2 and with the second end portions of the light-emitting elements ED exposed by the second and third insulating layers 520 and 530. As the second contact electrode 720 may be in contact with the second electrode 220 and the second end portions of the light-emitting elements ED, the second contact electrode 720 may electrically connect the second electrode 220 and the light-emitting elements ED.

The first and second contact electrodes 710 and 720 may include the same material. In one example, the first and second contact electrodes 710 and 720 may include a conductive material. In one example, the first and second contact electrodes 710 and 720 may include ITO, IZO, ITZO, Al, or a combination thereof. In one example, the first and second contact electrodes 710 and 720 may include a transparent conductive material. As the first and second contact electrodes 710 and 720 include a transparent conductive material, light emitted by the light-emitting elements ED may travel toward the first and second electrodes 210 and 220 through the first and second contact electrodes 710 and 720 and may thus be reflected by the surfaces of the first and second electrodes 210 and 220.

The first and second contact electrodes 710 and 720 may include the same material and may be formed in the same layer. The first and second contact electrodes 710 and 720 may be formed at the same time by the same process.

Figure 6:
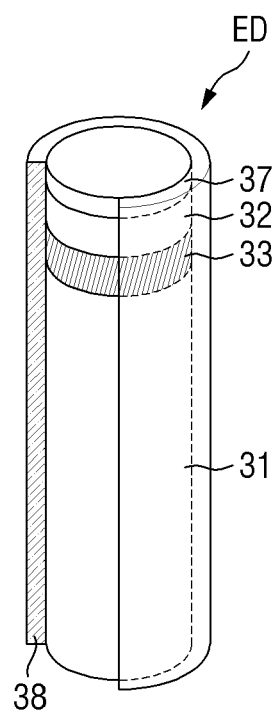
FIG. 6 is a schematic perspective view of a light-emitting element according to an embodiment of the disclosure.

FIG. 6 is a schematic perspective view of a light-emitting element according to an embodiment of the disclosure.

Referring to FIG. 6, the light-emitting element ED, which may be a particulate element, may have a rod- or cylindrical shape with an aspect ratio. The length of the light-emitting element ED may be greater than the diameter of the light-emitting element ED, and the aspect ratio of the light-emitting element ED may be about 6:5 to about 100:1. However, the disclosure is not limited thereto.

The light-emitting element ED may have a nanometer-scale size of about 1 nm to about 1 μm or a micrometer-scale size of about 1 μm to about 1 mm. In one example, the diameter and the length of the light-emitting element ED may both be at a nanometer scale or at a micrometer scale. In another example, the diameter of the light-emitting element ED may be at a nanometer scale, but the length of the light-emitting element ED may be at a micrometer scale. In another example, in a case where there may be light-emitting elements ED, some of the light-emitting elements ED may have a nanometer-scale diameter and/or length, and some of the light-emitting elements ED may have a micrometer-scale diameter and/or length.

In one example, the light-emitting element ED may be an inorganic light-emitting diode. The inorganic light-emitting diode may include semiconductor layers. In one example, the inorganic light-emitting diode may include a semiconductor layer of a first conductivity type (e.g., an n type), a semiconductor layer of a second conductivity type (e.g., a p type), and an active semiconductor layer interposed between the semiconductor layer of the first conductivity type and the semiconductor layer of the second conductivity type. The active semiconductor layer may receive holes and electrons from the semiconductor layer of the first conductivity type and the semiconductor layer of the second conductivity type, respectively, and the holes and the electrons may combine together in the active semiconductor layer. As a result, the light-emitting element ED may emit light.

In one example, the semiconductor layers of the light-emitting element ED may be sequentially stacked on each other in the length direction of the light-emitting element ED. As illustrated in FIG. 6, the light-emitting element ED may include a first semiconductor layer 31, a device active layer 33, and a second semiconductor layer 32, which may be sequentially stacked on each other in the length direction of the light-emitting element ED. The first semiconductor layer 31, the device active layer 33, and the second semiconductor layer 32 may be the semiconductor layer of the first conductivity type, the active semiconductor layer, and the semiconductor layer of the second conductivity type, respectively.

The first semiconductor layer 31 may be doped with a dopant of the first conductivity type. The dopant of the first conductivity type may be Si, Ge, or Sn. In one example, the first semiconductor layer 31 may be n-GaN doped with an n-type dopant such as Si.

The second semiconductor layer 32 may be spaced apart from the first semiconductor layer 31 by the device active layer 33. The second semiconductor layer 32 may be doped with a dopant of the second conductivity type. In one example, the second semiconductor layer 32 may be p-GaN doped with a p-type dopant such as Mg.

The device active layer 33 may include a material having a single- or multi-quantum well structure. As described above, as electrical signals may be applied through the first and second semiconductor layers 31 and 32, the device active layer 33 may emit light due to the combination of electron-hole pairs.

In some embodiments, the device active layer 33 may have a structure in which a semiconductor material having large bandgap energy and a semiconductor material having small bandgap energy may be alternately stacked on each other, and may include different group-III, group-IV, and group-V semiconductor materials depending on the wavelength of light to be emitted.

Light may be emitted from the device active layer 33 not only through the outer surfaces, in the length direction, of the light-emitting element ED, but also through the side surface of the light-emitting element ED. For example, the direction in which light may be emitted from the device active layer 33 is not particularly limited.

The light-emitting element ED may further include a device electrode layer 37. The device electrode layer 37 may be in contact with the second semiconductor layer 32. The device electrode layer 37 may be an ohmic contact electrode, but the disclosure is not limited thereto. In other embodiments, the device electrode layer 37 may be a Schottky contact electrode.

In case that end portions of the light-emitting element ED and electrodes may be electrically connected to apply electrical signals to the first and second semiconductor layers 31 and 32, the device electrode layer 37 may be disposed between the second semiconductor layer 32 and the electrodes and may reduce resistance. The device electrode layer 37 may include at least one of Al, Ti, indium (In), Au, Ag, ITO, IZO, and indium tin zinc oxide (ITZO). The device electrode layer 37 may include a semiconductor material doped with an n- or p-type dopant.

The light-emitting element ED may further include a device insulating film 38, which may surround the outer circumferential surfaces of the first semiconductor layer 31, the second semiconductor layer 32, the device active layer 33, and/or the device electrode layer 37. The device insulating film 38 may be disposed to surround the outer surfaces of at least the device active layer 33 and may extend in the direction in which the light-emitting element ED extends. The device insulating film 38 may protect the first semiconductor layer 31, the second semiconductor layer 32, the device active layer 33, and/or the device electrode layer 37. As the device insulating film 38 may be formed of a material having an insulating property, the device insulating film 38 can prevent any short circuit that may occur in case that the light-emitting element ED is placed in contact with an electrode to which electrical signals may be transmitted. Also, as the device insulating film 38 protects the outer circumferential surfaces of the first and second semiconductor layers 31 and 32 as well as the outer circumferential surface of the device active layer 33, the device insulating film 38 can prevent any degradation in emission efficiency.

Figure 7:
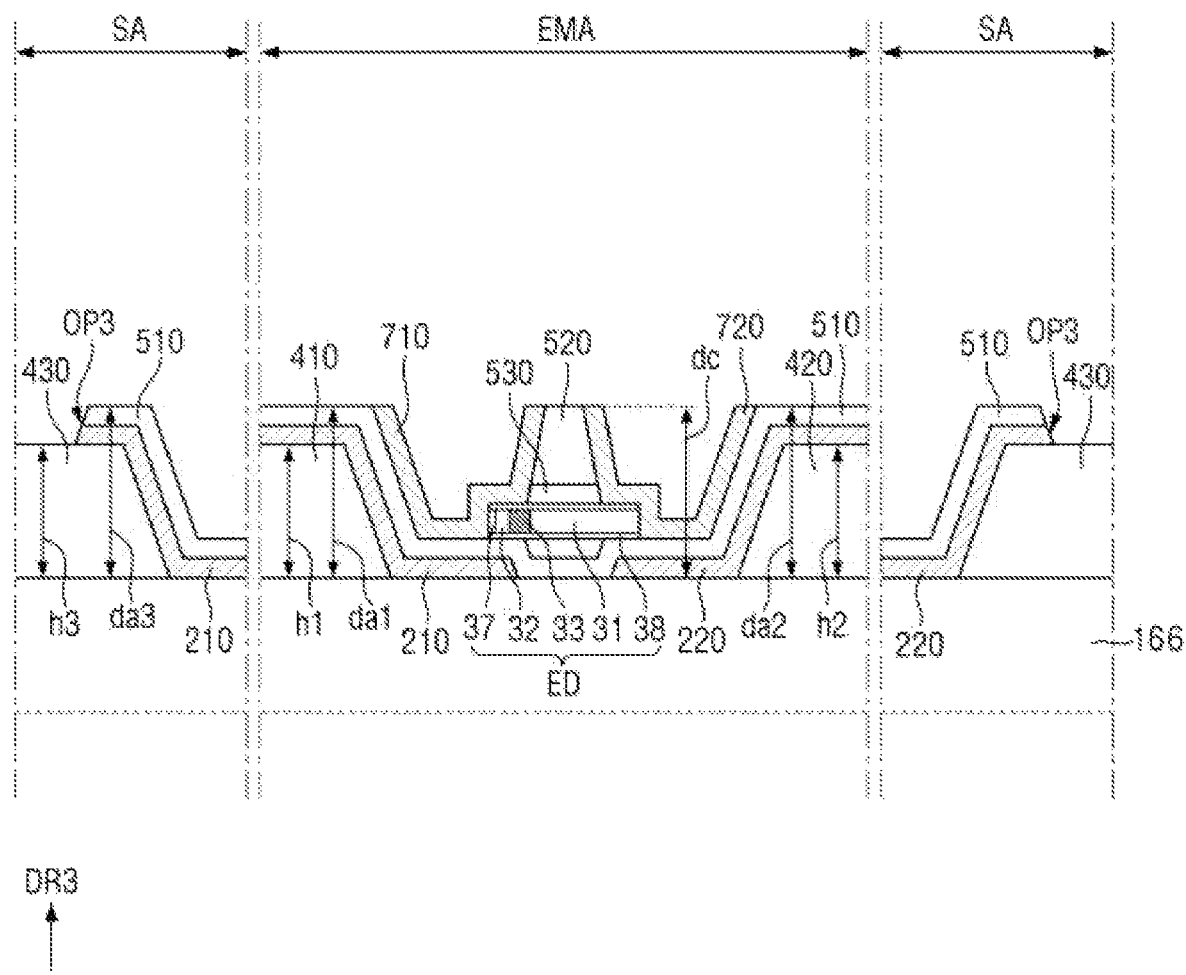
FIG. 7 is an enlarged schematic cross-sectional view of the display device of FIG. 5.

FIG. 7 is an enlarged schematic cross-sectional view of the display device of FIG. 5.

The heights of multiple members in the light-emitting element layer and the alignment direction of the light-emitting elements ED will hereinafter be described with reference to FIG. 7.

Referring to FIG. 7, the light-emitting elements ED may be disposed to extend parallel to the top surface of the substrate SUB (or the top surface of the via layer 166). Semiconductor layers may be sequentially arranged in each of the light-emitting elements ED in a direction parallel to the top surface of the substrate SUB. In one example, a first semiconductor layer 31, a device active layer 33, and a second semiconductor layer 32 of each of the light-emitting elements ED may be sequentially arranged parallel to the top surface of the via layer 166.

Specifically, in a cross-sectional view taken from an end portion to another end portion of each of the light-emitting elements ED, the first semiconductor layer 31, the device active layer 33, the second semiconductor layer 32, and the device electrode layer 37 may be sequentially formed in a direction parallel to the top surface of the via layer 166.

The light-emitting elements ED may be disposed such that the first end portions and the second end portions of the light-emitting elements ED may be placed on the first and second electrodes 210 and 220, respectively. The second semiconductor layer 32 and/or the device electrode layer 37 may be disposed in the first end portions of the light-emitting elements ED on the first electrode 210, and the first semiconductor layer 31 may be disposed in the second end portions of the light-emitting elements ED on the second electrode 220. However, the disclosure is not limited thereto. In other embodiments, the first semiconductor layer 31 may be disposed in the first end portions of the light-emitting elements ED, and the second semiconductor layer 32 and/or the device electrode layer 37 may be disposed in the second end portions of the light-emitting elements ED.

As will be described later, the first and second contact electrodes 710 and 720 may be formed by chemical mechanical polishing (CMP). In order that the first and second contact electrodes 710 and 720 may be formed by CMP without a requirement of an additional mask process from the alignment line division process, a proper relationship needs to be set between the heights of the top surfaces of the first bank 400, the height difference compensation pattern 430, and the second insulating layer 520. The relationship between the heights of the top surfaces of the first bank 400, the height difference compensation pattern 430, and the second insulating layer 520 will hereinafter be described.

A height h1 of the first sub-bank 410 and a height h2 of the second sub-bank 420 may be the same. A height h3 of the height difference compensation pattern 430 may be the same as the heights h1 and h2 of the first and second sub-banks 410 and 420, but the disclosure is not limited thereto. In other embodiments, the height h3 of the height difference compensation pattern 430 may be greater than the heights h1 and h2 of the first and second sub-banks 410 and 420.

A height dc of the top surface of the second insulating layer 520 on the light-emitting elements ED may be substantially the same as a height da1 of the top surface of part of the first insulating layer 510 on the top surface of the first sub-bank 410. The height dc of the top surface of the second insulating layer 520 on the light-emitting elements ED may be substantially the same as a height da2 of the top surface of part of the first insulating layer 510 on the top surface of the second sub-bank 420. The height dc of the top surface of the second insulating layer 520 on the light-emitting elements ED may be substantially the same as a height da3 of the top surface of part of the first insulating layer 510 on the height difference compensation pattern 430. However, the disclosure is not limited thereto. In other embodiments, the height dc of the top surface of the second insulating layer 520 on the light-emitting elements ED may be greater than the height da1 of the top surface of the part of the first insulating layer 510 on the top surface of the first sub-bank 410 and the height da2 of the top surface of the part of the first insulating layer 510 on the top surface of the second sub-bank 420.

The height h3 of the height difference compensation pattern 430 may be similar to the height dc of the top surface of the second insulating layer 520. The height h3 of the height difference compensation pattern 430 is illustrated as being the same as the heights h1 and h2 of the first and second sub-banks 410 and 420 and being smaller than the height dc of the top surface of the second insulating layer 520, but the disclosure is not limited thereto. In other embodiments, the height h3 of the height difference compensation pattern 430 may be greater than the heights h1 and h2 of the first and second sub-banks 410 and 420 and may be the same as the height dc of the top surface of the second insulating layer 520.

The heights of end portions of the first and second contact electrodes 710 and 720 on the side surfaces of the second insulating layer 520 may be the same. Specifically, the height of a first end portion of the first contact electrode 710 on a first side surface of the second insulating layer 520 may be the same as the height of a first end portion of the second contact electrode 720 on a second side surface of the second insulating layer 520. Also, the height of a second end portion of the first contact electrode 710 on a side surface of the first sub-bank 410 may be the same as the height of the first end portion of the first contact electrode 710. Similarly, the height of a second end portion of the second contact electrode 720 on a side surface of the second sub-bank 420 may be the same as the height of the first end portion of the second contact electrode 720. The first and second contact electrodes 710 and 720, which may be located at the same height at both ends thereof, may be obtained by the contact electrode division process that removes parts of the contact electrode material layer 700'.

The height difference compensation pattern 430, which has a thickness to have the same height as, or a similar height to, the second insulating layer 520, may be disposed in the subarea SA, and the alignment line layer 200' may be disposed on the height difference compensation pattern 430. As part of the alignment line layer 200' where the alignment line division process may be performed may be located at a level increased by as much as the thickness of the height difference compensation pattern 430, the alignment line layer 200' may be exposed by the third opening OP3, even if CMP for forming the first and second contact electrodes 710 and 720 may be performed. Thus, an additional mask process for the alignment line division process may not be needed, and as a result, the manufacturing efficiency of the display device 10 can be improved.

A method of fabricating the display device 10 will hereinafter be described. Descriptions of the structures of the elements of the display device 10 and how to form the elements of the display device 10 will be simplified, and instead, the order in which processes of the method of fabricating the display device 10 may be performed will hereinafter be described.

Figure 12:
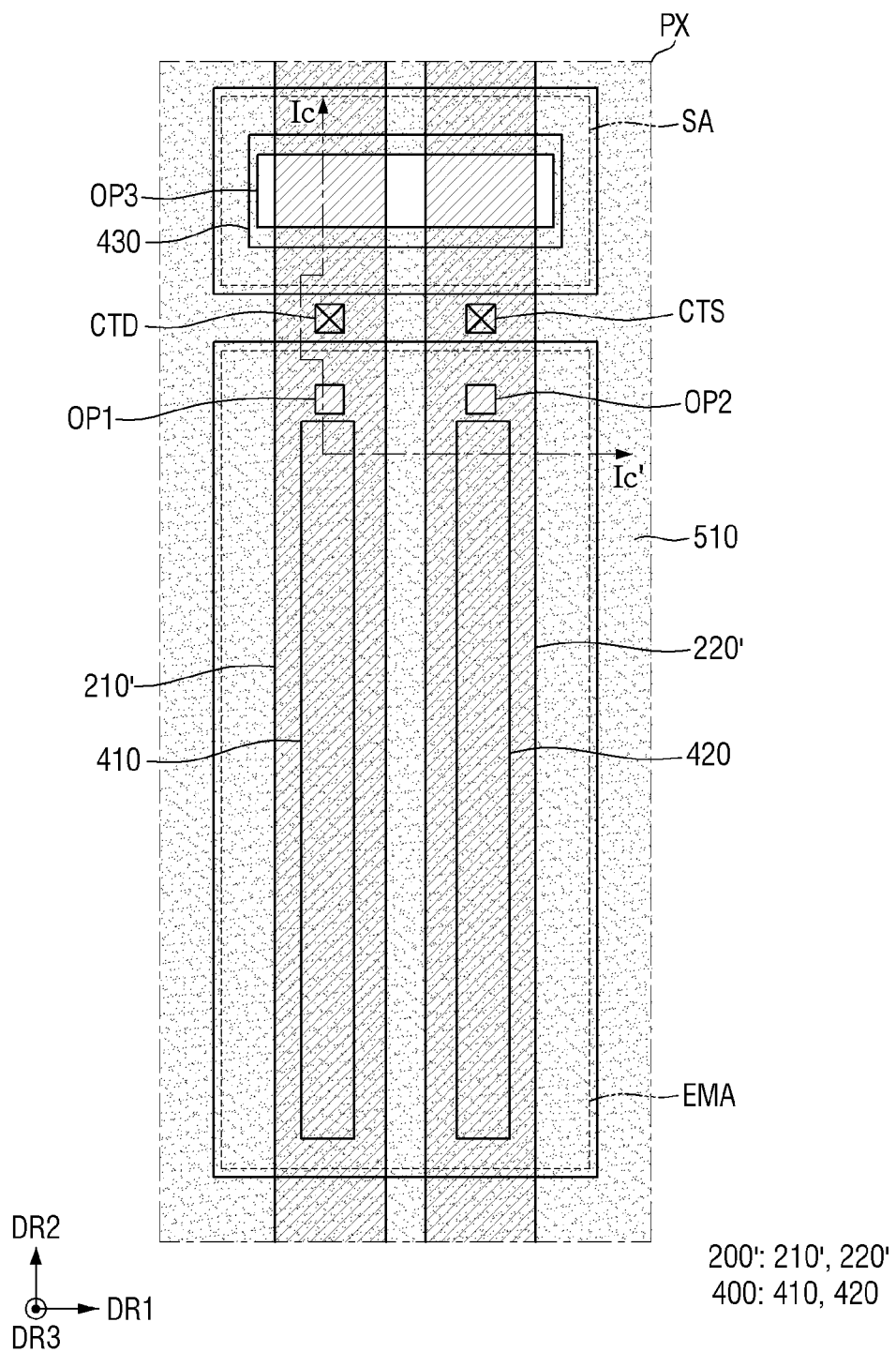
Figure 13:
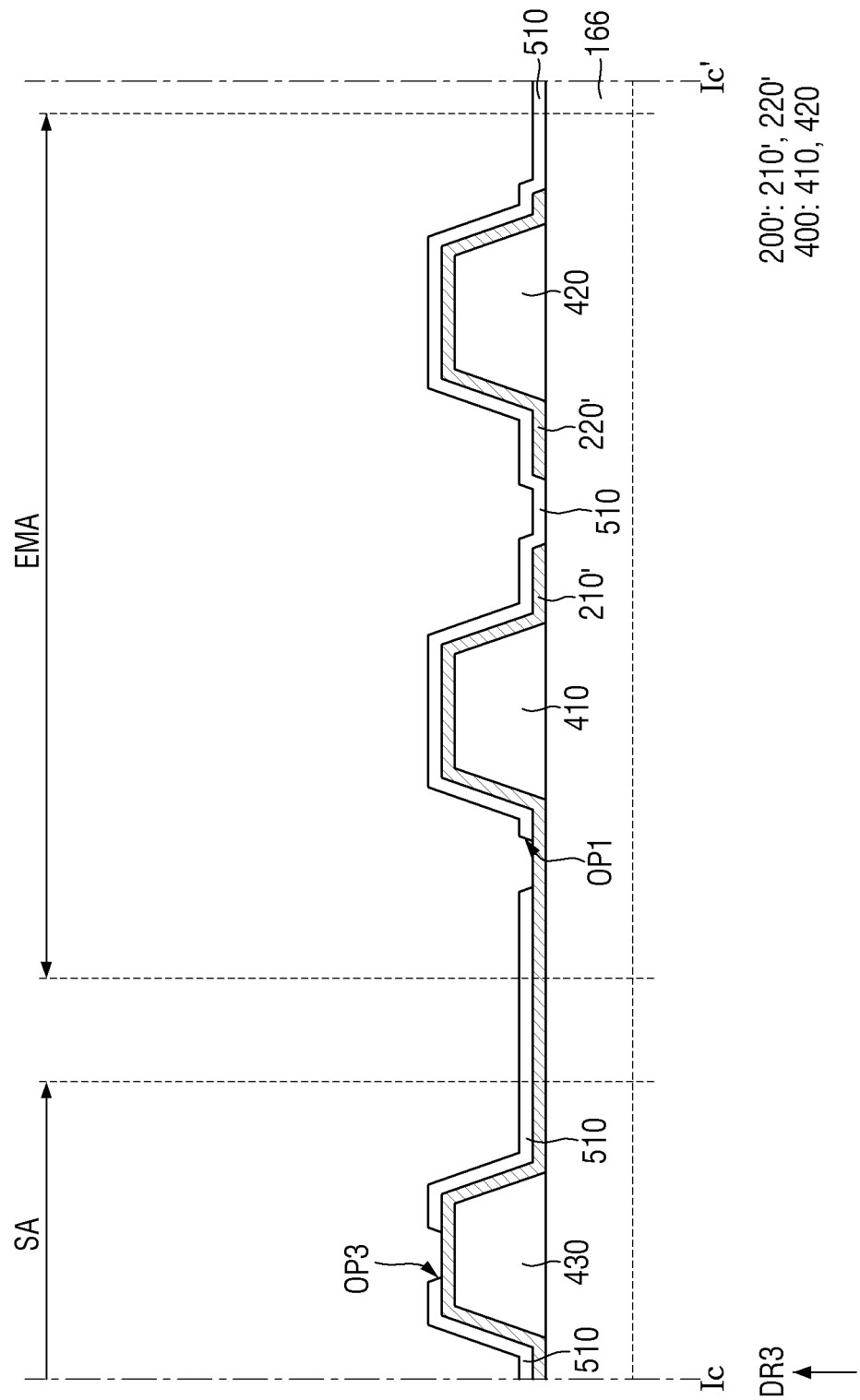
Figure 14:
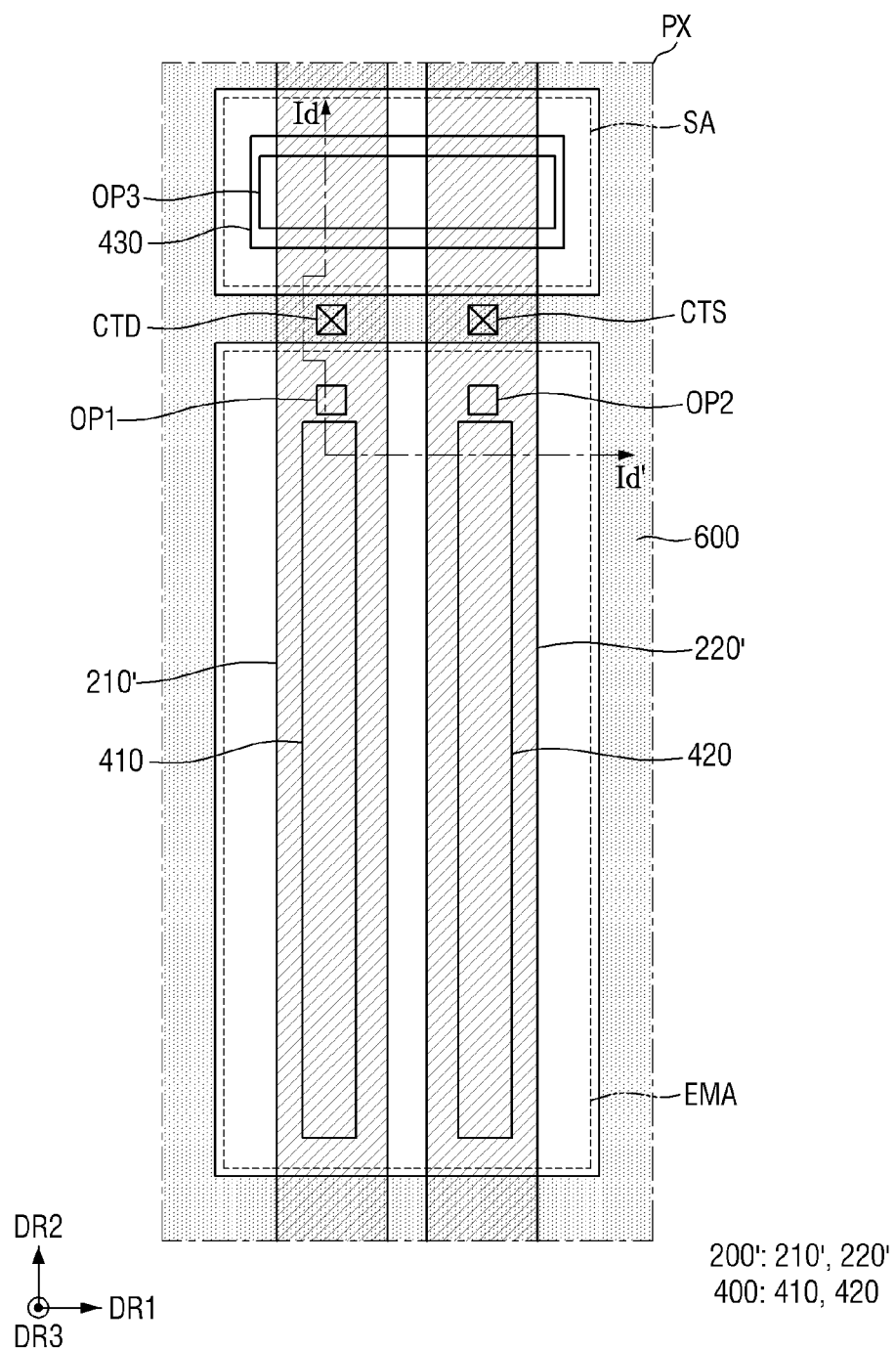
Figure 15:
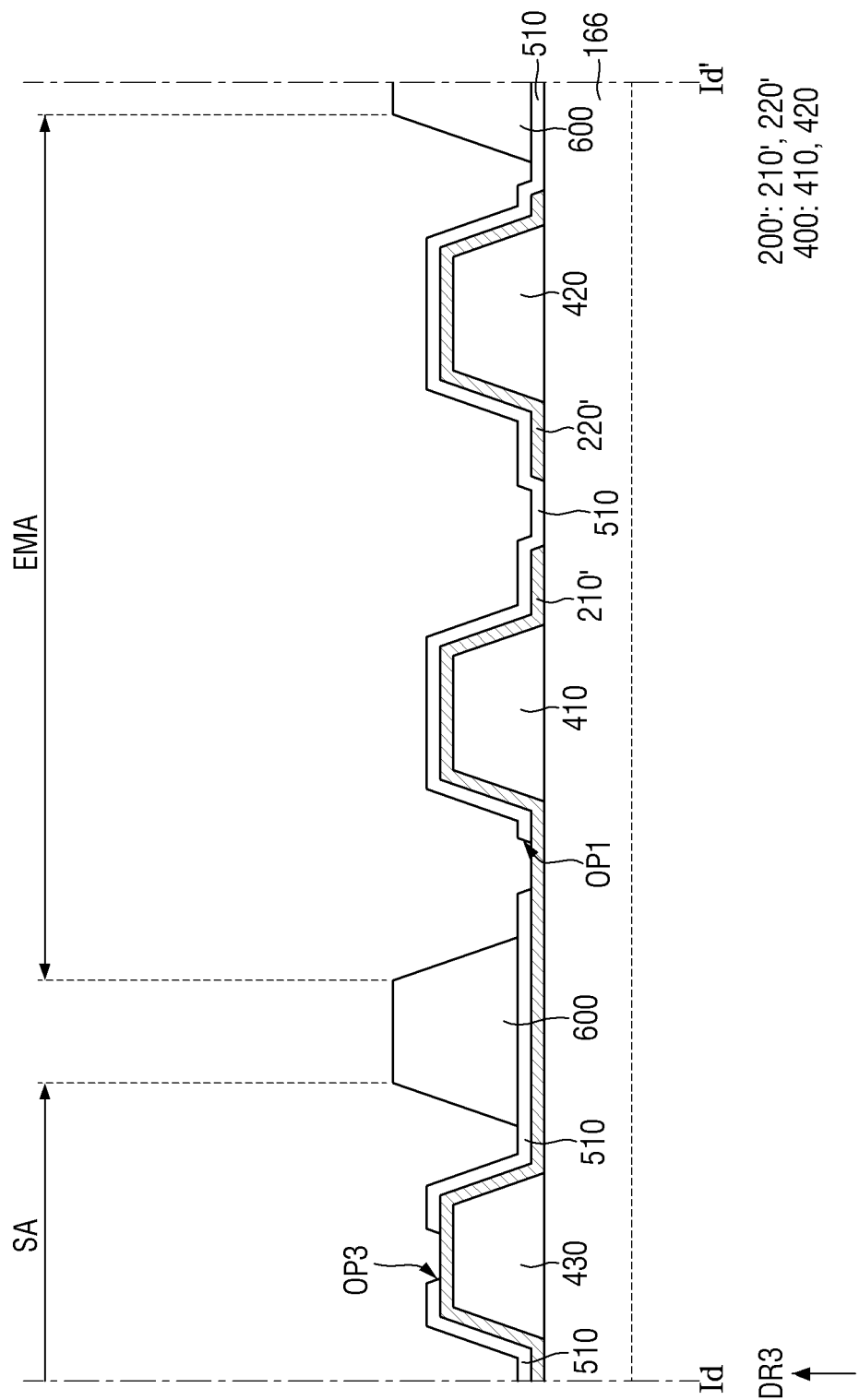
Figure 16:
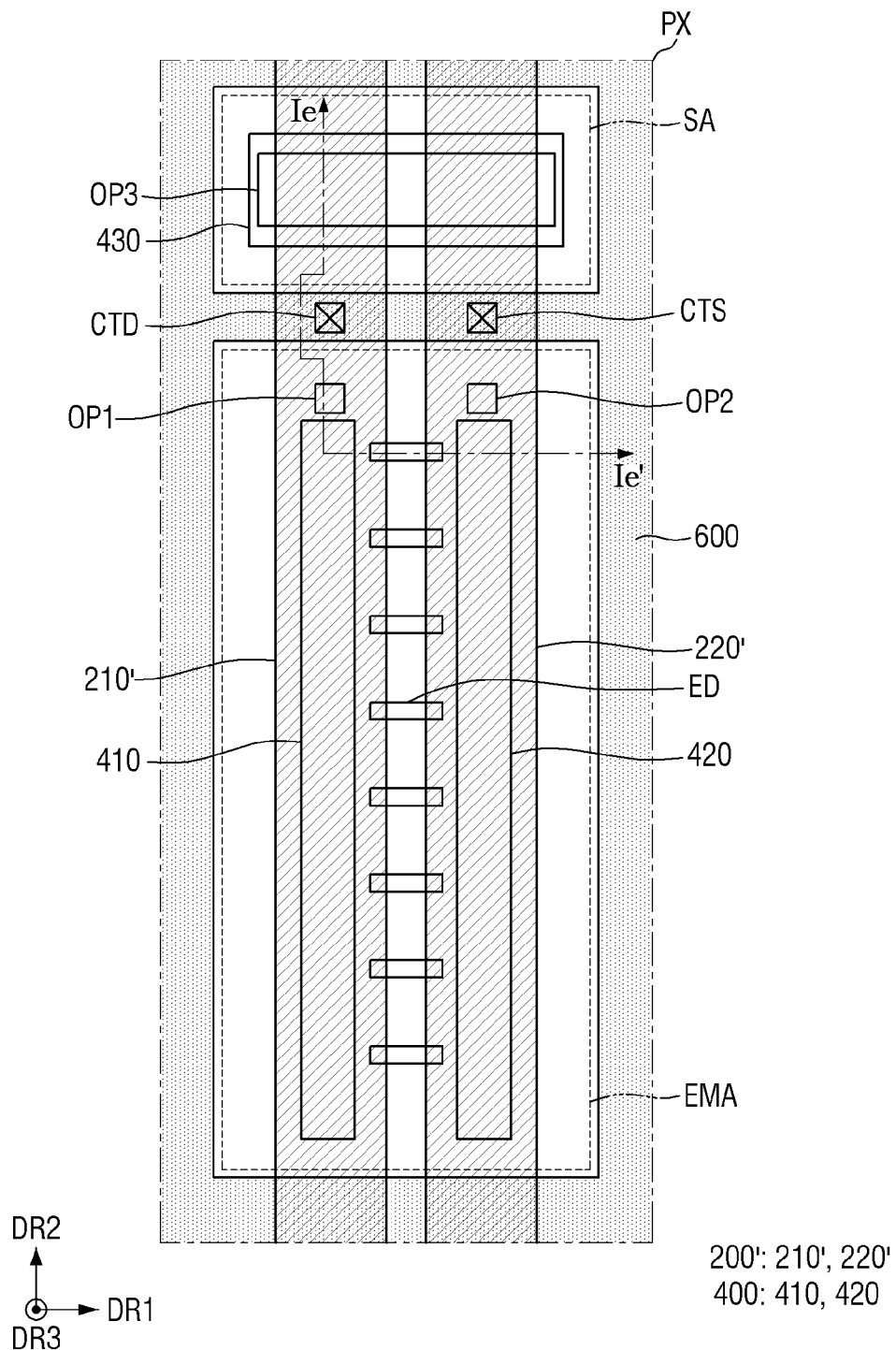
Figure 17:
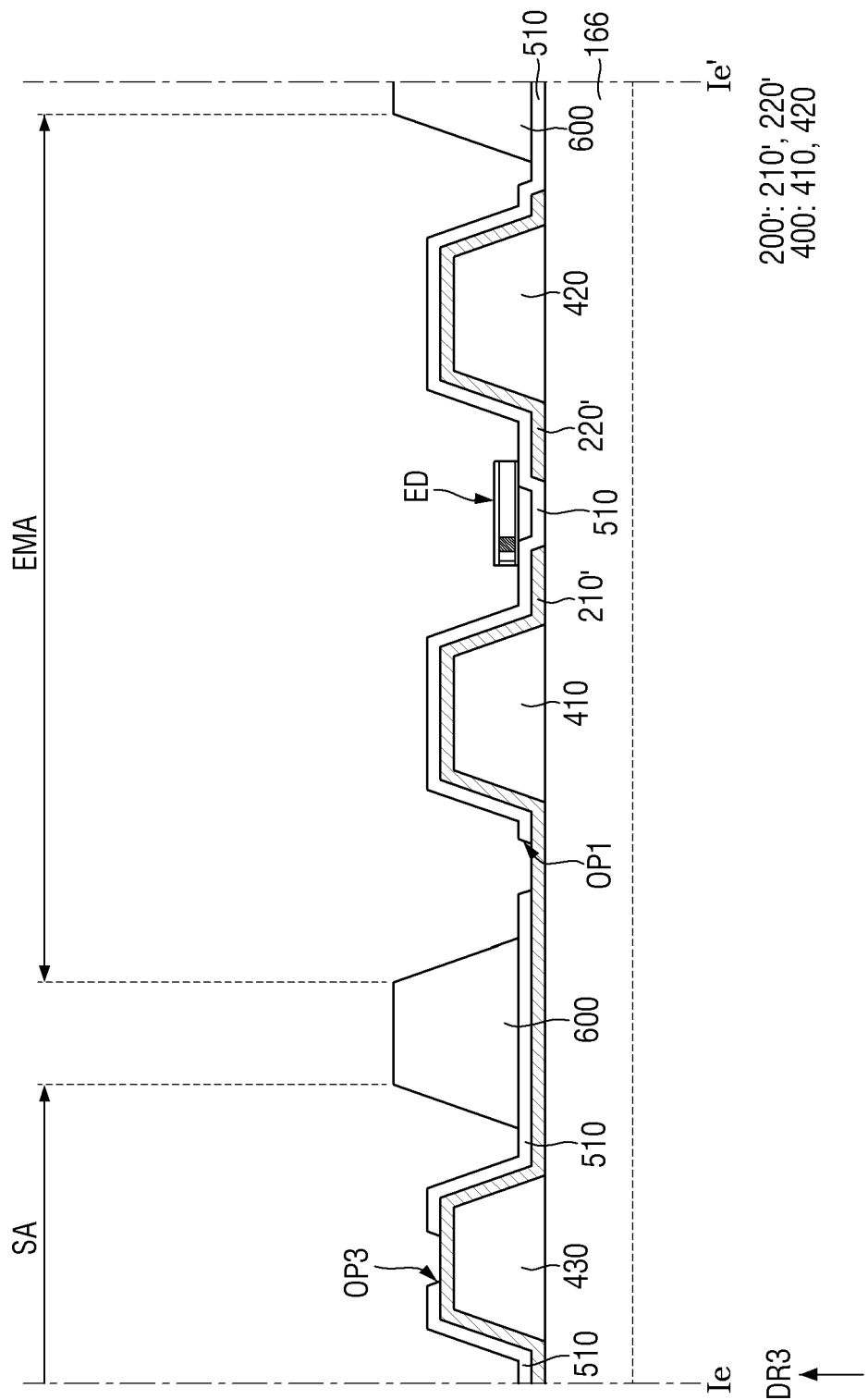
Figure 18:
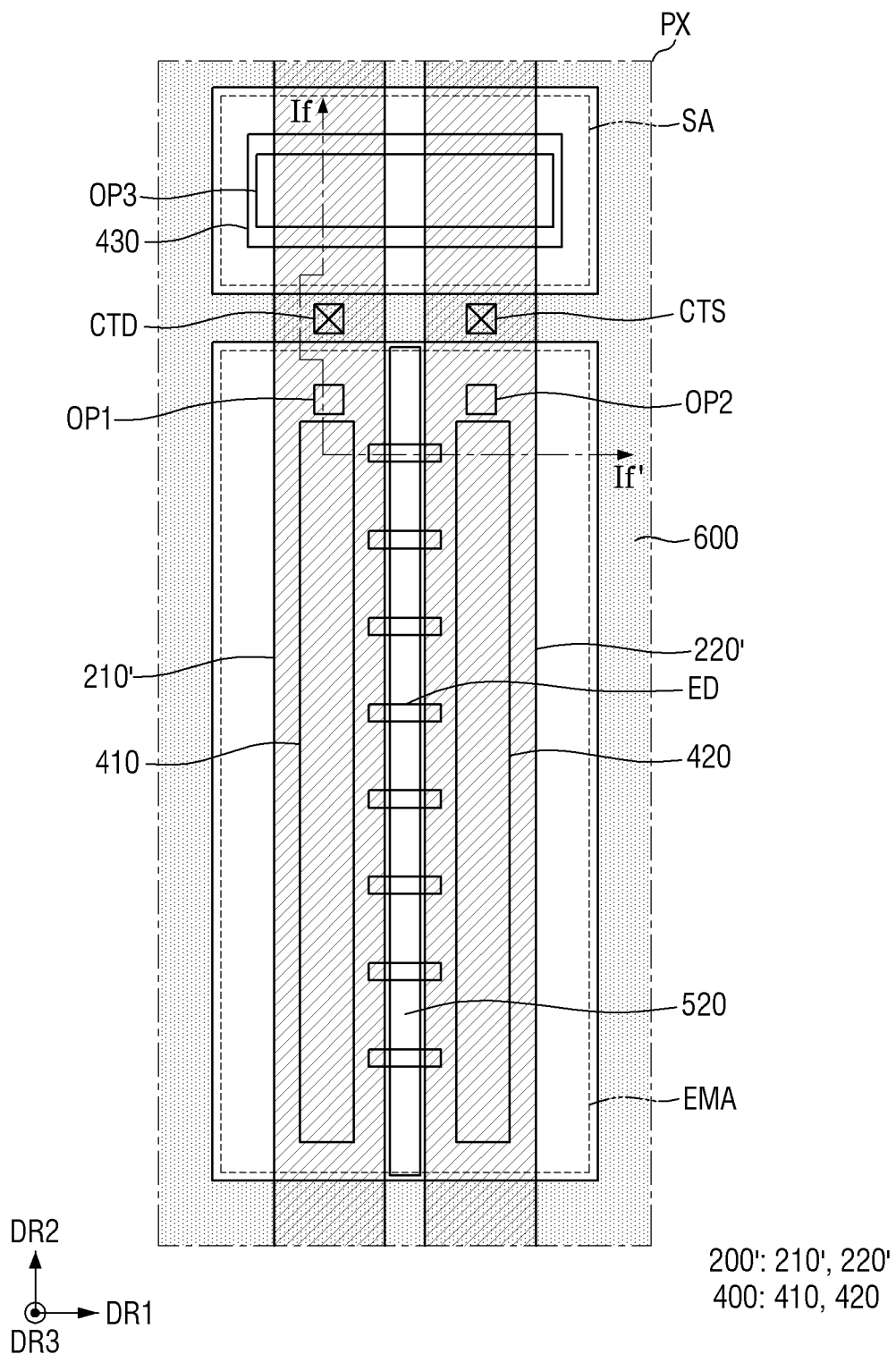
Figure 19:
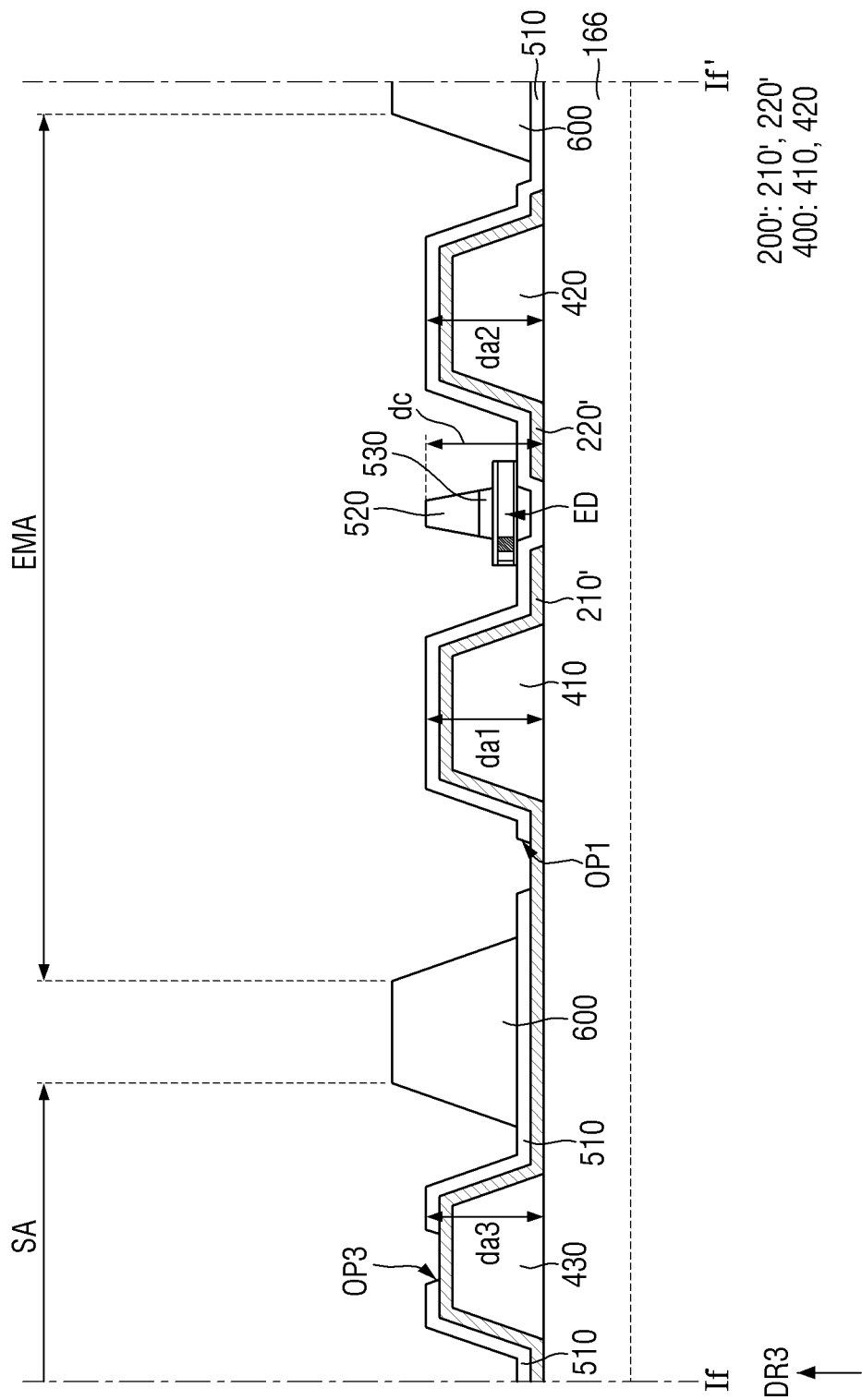
Figure 21:
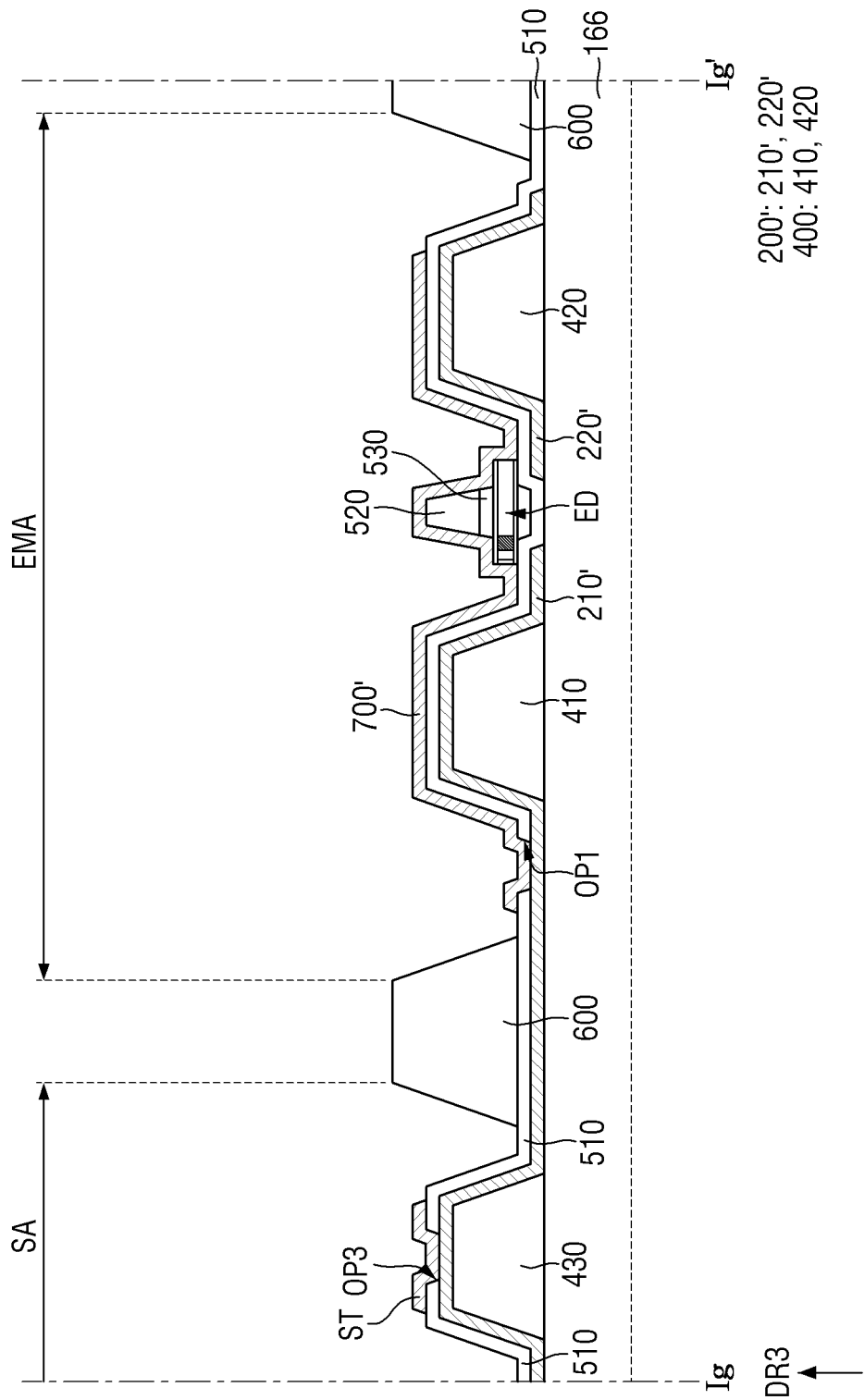
Figure 22:
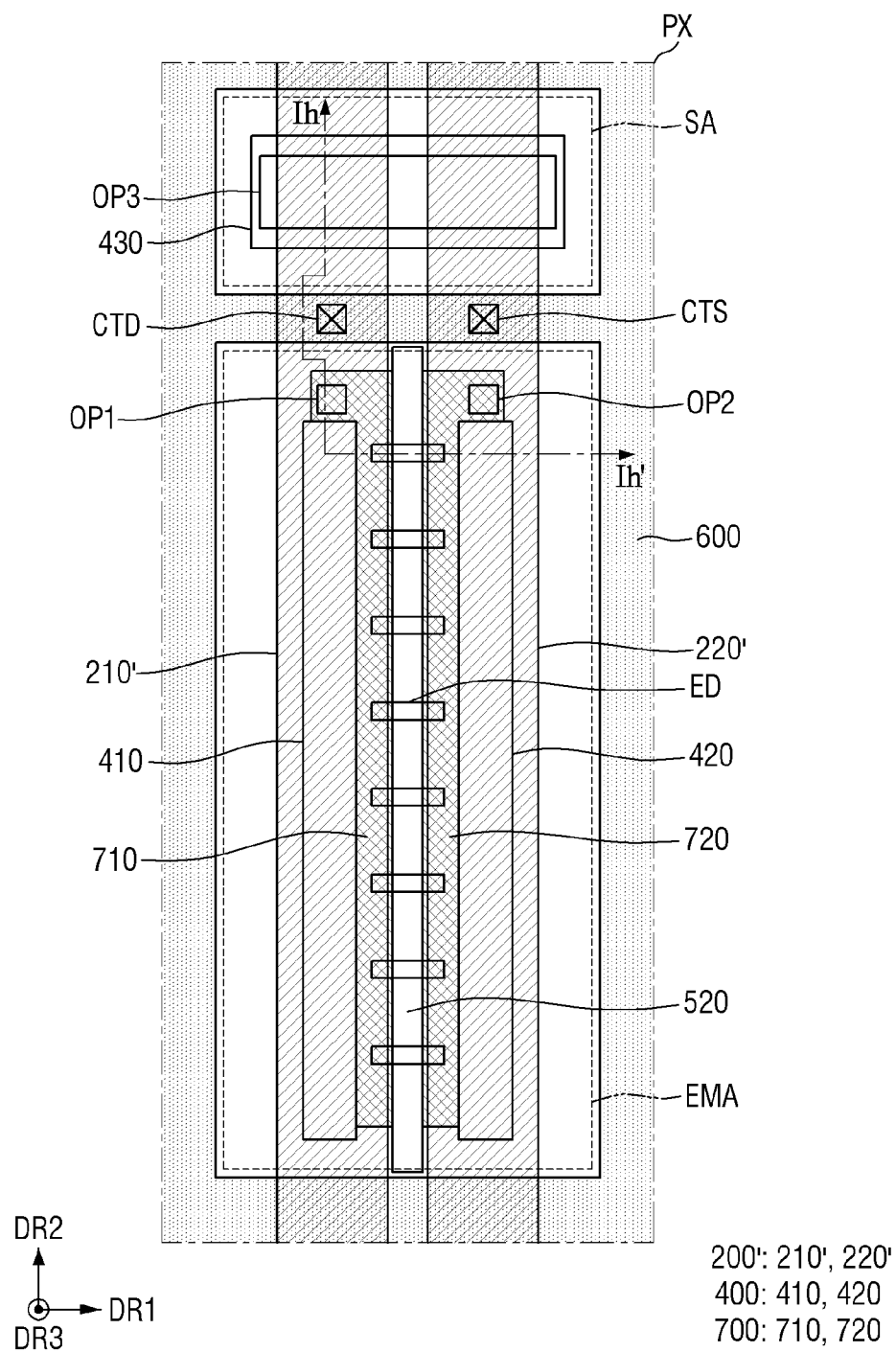

FIGS. 8 through 28 are schematic plan views or cross-sectional views illustrating steps of a method of fabricating the display device of FIG. 5. FIGS. 8 through 28 do not illustrate how to form the substrate SUB and the circuit element layer CCL on the substrate SUB, but illustrate how to form the light-emitting element layer on the via layer 166 of the circuit element layer CCL. Also, FIGS. 8 through 28 illustrate plan views of the display device 10 of FIG. 5, which correspond to the plan view of the display device 10 of FIG. 2, and illustrate cross-sectional views, taken along line Q3-Q3' of FIG. 2, of the display device 10 of FIG. 5. Specifically, FIG. 9 is a cross-sectional view taken along line Ia-Ia' of FIG. 8, FIG. 11 is a cross-sectional view taken along line Ib-Ib' of FIG. 8, FIG. 13 is a cross-sectional view taken along line Ic-Ic' of FIG. 12, FIG. 15 is a cross-sectional view taken along line Id-Id' of FIG. 14, FIG. 17 is a cross-sectional view taken along line Ie-Ie' of FIG. 16, FIG. 19 is a cross-sectional view taken along line If-If' of FIG. 18, FIG. 21 is a cross-sectional view taken along line Ig-Ig' of FIG. 20, FIGS. 23 through 25 are cross-sectional views taken along line Ih-Ih' of FIG. 22, and FIGS. 27 and 28 are cross-sectional views taken along line Ii-Ii' of FIG. 26.

Figure 8:
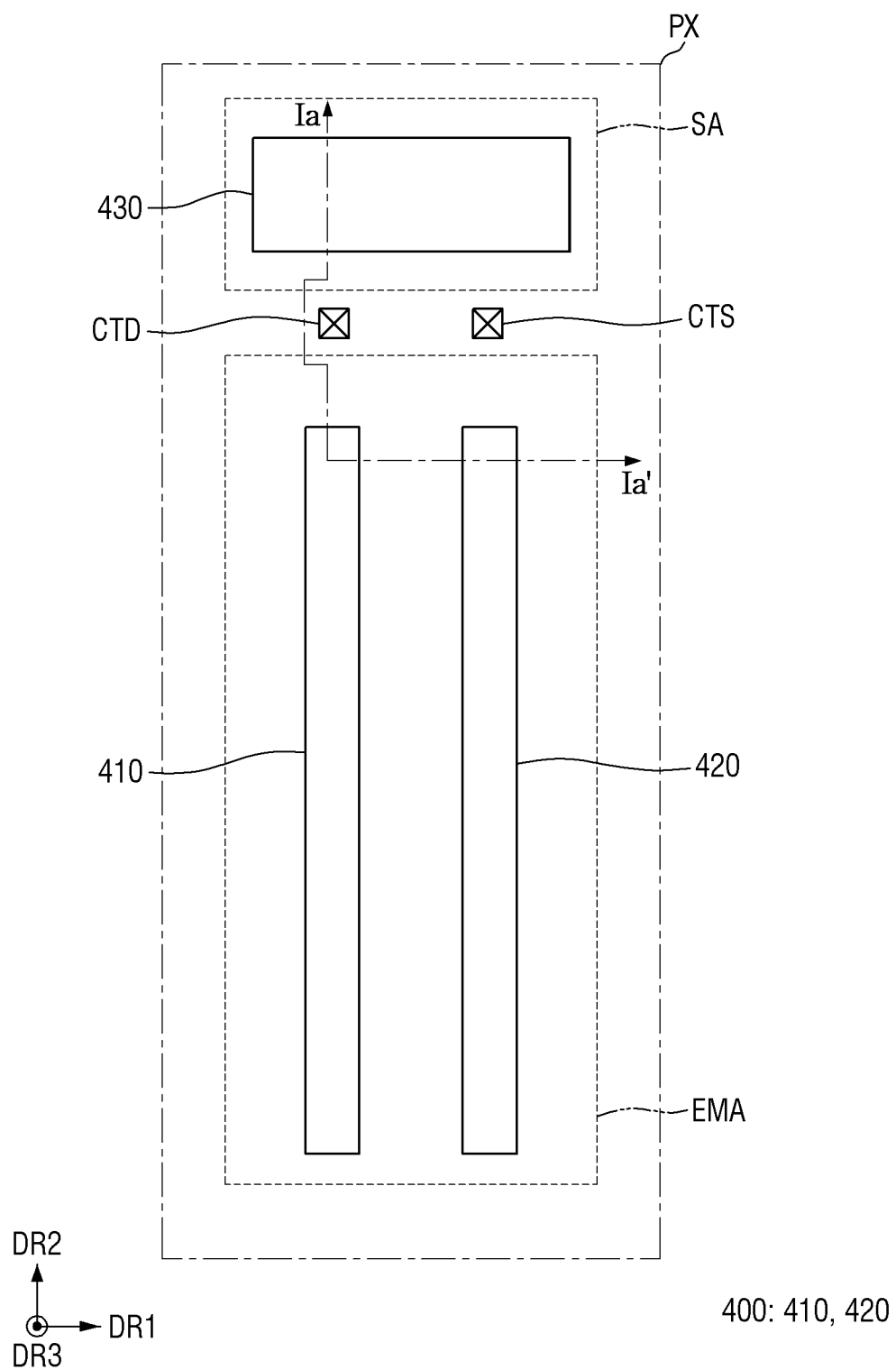
FIGS. 8 through 28 are schematic plan views or cross-sectional views illustrating steps of a method of fabricating the display device of FIG. 5.
Figure 9:
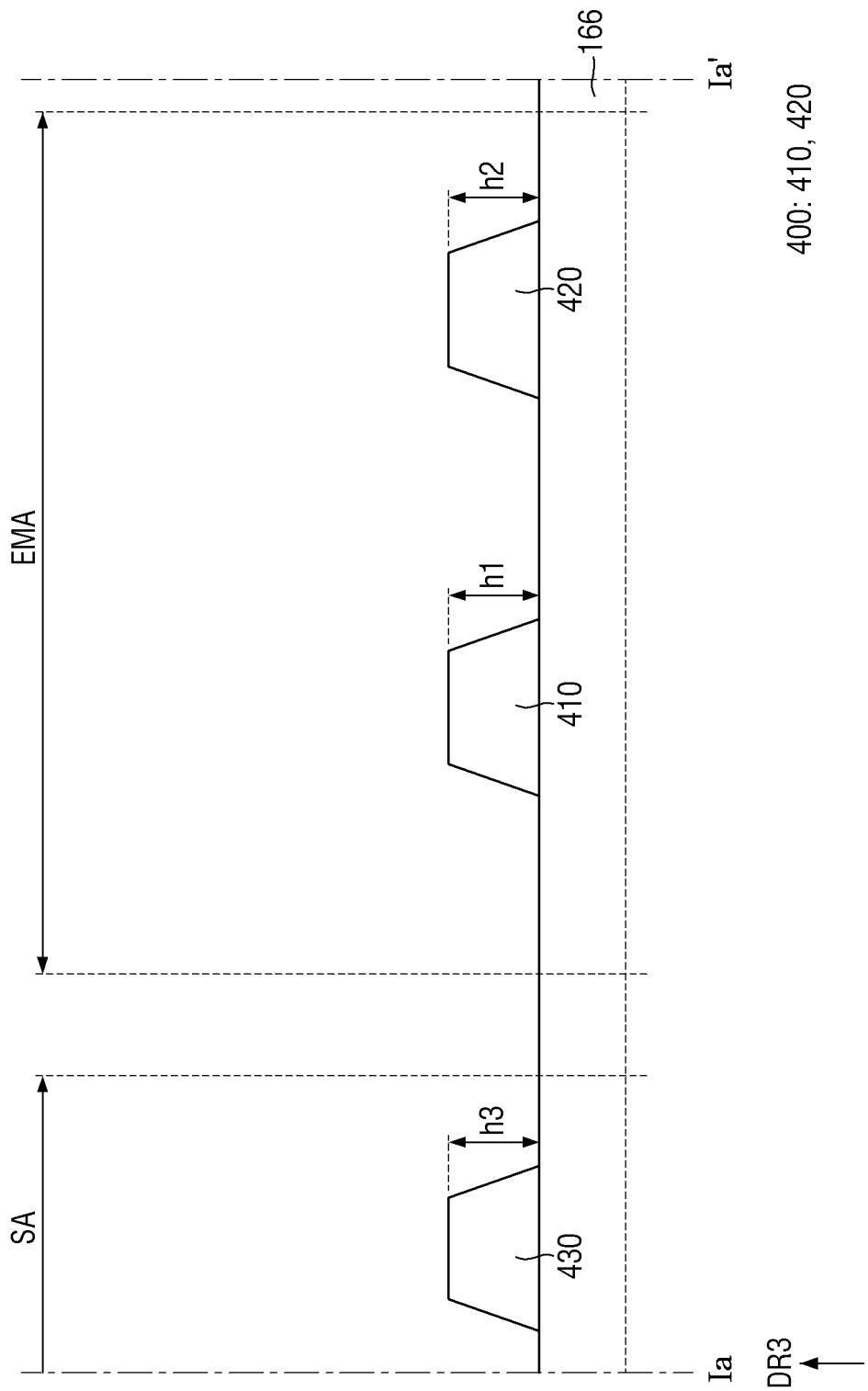

Referring to FIGS. 8 and 9, the first bank 400, which may be patterned, and the height difference compensation pattern 430 may be formed on the via layer 166. The first bank 400 may include patterned sub-banks, i.e., the first and second sub-banks 410 and 420, and the heights h1 and h2 of the first and second sub-banks 410 and 420 may be the same. The heights h1 and h2 of the first and second sub-banks 410 and 420 may be the same as the height h3 of the height difference compensation pattern 430. Thus, the heights h1 and h2 of the first and second sub-banks 410 and 420 and the height h3 of the height difference compensation pattern 430 may all be the same.

In one example, the first bank 400 and the height difference compensation pattern 430 may be formed by the same process. In one example, the first bank 400 and the height difference compensation pattern 430 may include an organic insulating material. In this example, the first bank 400 and the height difference compensation pattern 430 may be formed by applying a first organic material layer on the via layer 166 and subjecting the first organic material layer to exposure and development. The first bank 400 and the height difference compensation pattern 430, which may be formed by the same process, may have the same height. As the first bank 400 and the height difference compensation pattern 430 may be formed by a single process, an additional process for forming the height difference compensation pattern 430 may not be needed, and thus, the efficiency of the formation of the first bank 400 and the height difference compensation pattern 430 can be improved. Also, as the first bank 400 and the height difference compensation pattern 430 may be formed by the same process, the first bank 400 and the height difference compensation pattern 430 can be easily formed to have the same height. However, the disclosure is not limited thereto. In other embodiments, the first bank 400 and the height difference compensation pattern 430 may be formed by different processes.

Figure 10:
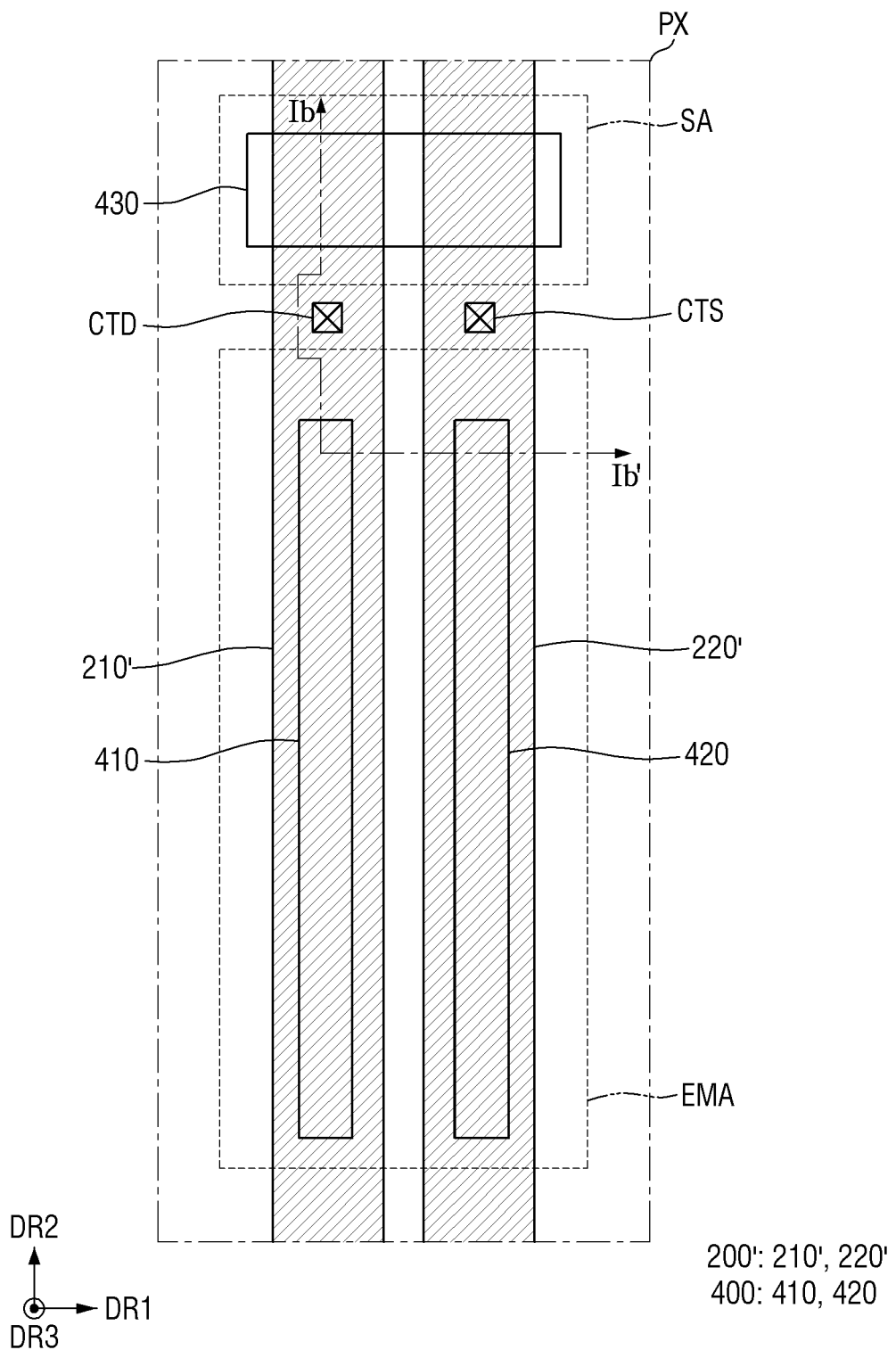
Figure 11:
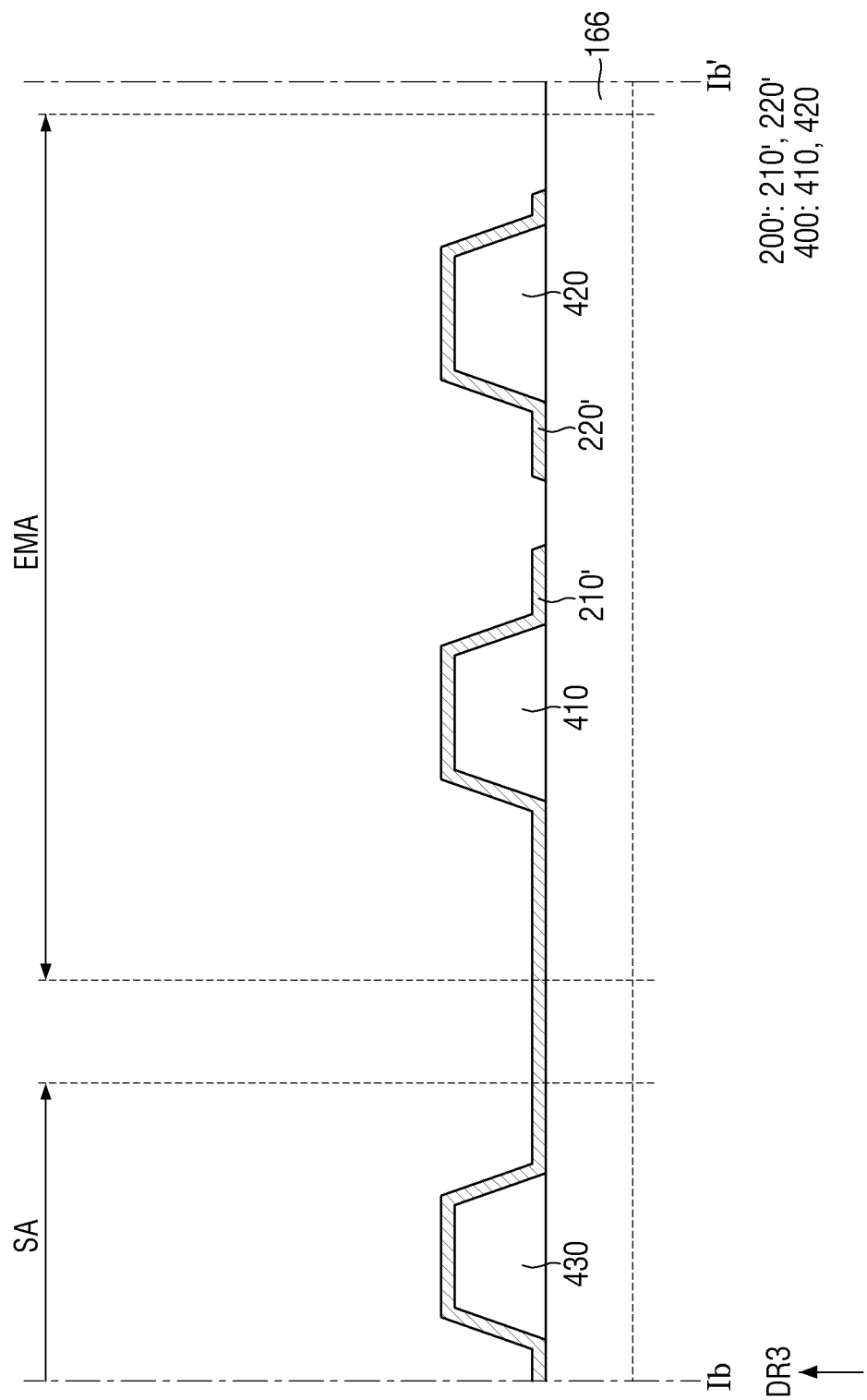

Thereafter, referring to FIGS. 10 and 11, the alignment line layer 200', which may be patterned, may be formed on the first bank 400 and the height difference compensation pattern 430. Alignment signals for aligning the light-emitting elements may be applied to the alignment line layer 200'. As the alignment signals may be applied to the alignment line layer 200', an electric field may be formed on alignment lines included in the alignment line layer 200'.

The alignment line layer 200', which may be patterned, may include alignment lines that may be spaced apart from each other. Specifically, the alignment line layer 200' may include first and second alignment lines 210' and 220'. The first and second alignment lines 210' and 220' may extend in the second direction DR2 and may be spaced apart from each other in the first direction DR1. The first and second alignment lines 210' and 220' may be disposed in the pixel PX. In one example, the first and second alignment lines 210' and 220' may be disposed in a column including the pixel PX, and another first alignment line 210' and another second alignment line 220' may be disposed in another column.

The first alignment line 210' may be disposed on the first sub-bank 410, in the emission area EMA, and may extend in the second direction DR2 to be disposed on the height difference compensation pattern 430, in the subarea SA. The second alignment line 220' may be disposed on the second sub-bank 420, in the emission area EMA, and may extend in the second direction DR2 to be disposed on the height difference compensation pattern 430, in the subarea SA. The first and second alignment lines 210' and 220' may be spaced apart from each other in the first direction DR1. In the emission area EMA, the first and second alignment lines 210' and 220' may be spaced apart from each other in the first direction DR1 on part of the via layer 166 exposed by the first and second sub-banks 410 and 420. In the subarea SA, the first and second alignment lines 210' and 220' may be spaced apart from each other in the first direction DR1 on the height difference compensation pattern 430. The first and second alignment lines 210' and 220' may correspond to the first and second electrodes 210 and 220, respectively, but may continuously extend in the second direction DR2 into neighboring pixels PX adjacent to the pixel PX in the second direction DR2.

The alignment line layer 200' may be formed to have a uniform thickness on the first bank 400, the height difference compensation pattern 430, and the via layer 166. Thus, the alignment line layer 200' may have a surface shape that reflects the underlying height differences. The alignment line layer 200' may have different heights in different regions. The height of the alignment line layer 200' may be measured as the distance from a reference surface or plane such as the top surface of the substrate SUB or the via layer 166 to the top surface of the alignment line layer 200'.

Parts of the alignment line layer 200' formed on the top surfaces of the first sub-bank 410, the second sub-bank 420, and the height difference compensation pattern 430 may have a first height, and part of the alignment line layer 200' formed on the top surface of the via layer 166 may have a second height, which may be smaller than the first height. As the height difference compensation pattern 430, which has the same height as the first bank 400, in the subarea SA, may be formed and the alignment line layer 200' may be formed on the height difference compensation pattern 430, part of the alignment line layer 200' disposed in the subarea SA may be located higher than part of the alignment line layer 200' disposed on the top surface of the via layer 166 by as much as the height (h3, see FIG. 9) of the height difference compensation pattern 430.

The alignment line layer 200', which may be patterned, may be formed by a mask process. In one example, an alignment line material layer may be deposited on the first bank 400, the height difference compensation pattern 430, and part of the via layer 166 exposed by the first bank 400 and the height difference compensation pattern 430. The alignment line material layer may include the same material as the electrode layer 200. Although not specifically illustrated, the alignment line material layer may be deposited even on the inside of the first and second electrode contact holes CTD and CTS, which penetrate the via layer 166 and the passivation layer 165, and may thus be connected to the first conductive pattern CDP and the second voltage line VL2. Thereafter, a photoresist layer may be applied on the alignment line material layer and may be subjected to exposure and development, thereby forming a photoresist pattern. Thereafter, the alignment line material layer may be etched using the photoresist pattern as an etching mask. Thereafter, the photoresist pattern may be removed by stripping or ashing, thereby forming the alignment line layer 200', which may be patterned as illustrated in FIGS. 10 and 11.

Thereafter, referring to FIGS. 12 and 13, the first insulating layer 510 may be formed on the via layer 166 where the alignment line layer 200' may be formed. The first insulating layer 510 may be formed by depositing a first insulating material layer on the via layer 166 where the alignment line layer 200' may be formed and etching parts of the first insulating material layer to form openings that expose parts of the alignment line layer 200'. The openings may include the first, second, and third openings OP1, OP2, and OP3, which may be spaced apart from one another.

The first opening OP1 may expose part of the first alignment line 210', in the emission area EMA, the second opening OP2 may expose part of the second alignment line 220', in the emission area EMA, and the third opening OP3 may expose parts of the first and second alignment lines 210' and 220', in the subarea SA. The first opening OP1 may not overlap the first bank 400 (particularly, the first sub-bank 410) in the third direction DR3, and the second opening OP2 may not overlap the first bank 410 (particularly, the second sub-bank 420) in the third direction DR3. The third opening OP3 may overlap the height difference compensation pattern 430 in the third direction DR3. Specifically, the third opening OP3 may overlap the top surface of the height difference compensation pattern 430 in the third direction DR3 to expose part of the top surface of the height difference compensation pattern 430.

The depths of the first, second, and third openings OP1, OP2, and OP3, which expose parts of the alignment line layer 200', may vary depending on where the first, second, and third openings OP1, OP2, and OP3 may be formed. Specifically, the heights of the first and second openings OP1 and OP2, which may be formed in the emission area EMA, may be smaller than the height of the third opening OP3, which may be formed in the subarea SA. Thus, the heights of the parts of the alignment line layer 200' exposed by the first and second openings OP1 and OP2 may differ from the height of the part of the alignment line layer 200' exposed by the third opening OP3. In one example, the first and second openings OP1 and OP2 may expose parts of the alignment line layer 200' formed on the top surface of part of the via layer 166 exposed by the first bank 400, in the emission area EMA, and the third opening OP3 may expose part of the alignment line layer 200' formed on the top surface of the height difference compensation pattern 430, in the subarea SA. Thus, the height of the parts of the alignment line layer 200' exposed by the first and second openings OP1 and OP2 may be smaller than the height of the part of the alignment line layer 200' exposed by the third opening OP3.

The first, second, and third openings OP1, OP2, and OP3 included in the first insulating layer 510 may be formed by a mask process. In one example, the first insulating material layer may be deposited on the entire surface of the via layer 166 where the alignment line layer 200' may be formed. Thereafter, a photoresist pattern that exposes parts of the alignment line layer 200' may be formed on the first insulating material layer, and the first insulating material layer may be etched using the photoresist pattern as an etching mask, thereby forming the first, second, and third openings OP1, OP2, and OP3, which expose parts of the alignment line layer 200', as illustrated in FIGS. 12 and 13.

Thereafter, referring to FIGS. 14 and 15, the second bank 600, which may be patterned, may be formed on the first insulating layer 510. In one example, the second bank 600 may include an organic insulating material. In this example, the second bank 600 may be formed by applying a second organic material layer on the first insulating layer 510 and subjecting the second organic material layer to exposure and development.

The second bank 600 may be formed along the boundaries of the pixel PX and along the boundaries of each of the emission area EMA and the subarea SA, in the pixel PX. For example, the second bank 600 may be formed along the boundaries of each of the pixel, the emission area EMA, and the subarea SA, and the emission area EMA and the subarea SA may be defined by the second bank 600. The second bank 600 may expose the first bank 400, in the emission area EMA, and may expose the height difference compensation pattern 430, in the subarea SA.

The second bank 600 may be formed to have a greater height than the first bank 400 and the height difference compensation pattern 430. The second bank 600 may separate the emission area EMA and the subarea SA and may thus allow ink having the light-emitting elements ED dispersed therein to be properly sprayed into the emission area EMA without being mixed into neighboring pixels PX, during inkjet printing for aligning the light-emitting elements ED.

Thereafter, referring to FIGS. 16 and 17, the light-emitting elements ED may be disposed on the alignment line layer 200', in the emission area EMA. The light-emitting elements ED may be disposed between sub-banks, in the emission area EMA. In one example, the light-emitting elements ED may be disposed between the first and second sub-banks 410 and 420. As described above, the light-emitting elements ED may extend in one direction and may be disposed between the first and second alignment lines 210' and 220' such that the first end portions and the second end portions of the light-emitting elements ED may be placed on the first and second sub-banks 410 and 420, respectively.

The arrangement of the light-emitting elements ED may include spraying ink having the light-emitting elements ED dispersed therein into the emission area EMA and aligning the light-emitting elements ED on the alignment line layer 200' by applying alignment signals to the alignment line layer 200'. Specifically, the light-emitting elements ED may be sprayed onto the alignment line layer 200' in the emission area EMA in a state pf being dispersed in ink. In one example, the light-emitting elements ED may be prepared in a state of being dispersed in ink and may be sprayed onto the alignment line layer 200' through printing by an inkjet printing device. The sprayed ink may be settled on the first insulating layer 510, in the emission area EMA surrounded by the second bank 600.

Once ink having the light-emitting elements ED dispersed therein may be sprayed, alignment signals may be applied to the alignment line layer 200'. Specifically, a first alignment signal may be applied to the first alignment line 210', and a second alignment signal may be applied to the second alignment line 220'. As the first and second alignment signals may be applied to the first and second alignment lines 210' and 220', respectively, an electric field may be generated between the first and second alignment lines 210' and 220'. The light-emitting elements ED dispersed in ink may receive a dielectrophoretic force from the electric field generated between the first and second alignment lines 210' and 220'. As the alignment direction and location of the light-emitting elements ED change, the light-emitting elements may be aligned on the first insulating layer 510 such that end portions of each of the light-emitting elements ED may be placed on the first and second alignment lines 210' and 220'.

The first and second alignment lines 210' and 220' may extend in the second direction DR2 and may be disposed in the column including the pixel PX. For example, as the first and second alignment lines 210' and 220' may be disposed in the column including the pixel PX, the same alignment signals may be applied to multiple pixels belonging to the same column. Thus, the alignment of light-emitting elements ED can be performed in a column of multiple pixels PX simply by applying the same alignment signals to first and second alignment lines 210' and 220' corresponding to the column of multiple pixels PX, instead of applying alignment signals to each of the multiple pixels PX.

Thereafter, referring to FIGS. 18 and 19, the second and third insulating layers 520 and 530, which may be patterned, may be formed on the light-emitting elements ED. The formation of the second and third insulating layers 520 and 530 may include applying the third insulating material layer on the entire surface of the first insulating layer 510 where the light-emitting elements ED may be disposed, forming the second insulating layer 520 on the third insulating material layer, and forming the third insulating layer 530 by removing part of the third insulating material layer using the second insulating layer 520 as a mask.

In one example, the third insulating material layer may include an inorganic insulating material, and the second insulating material layer may include an organic insulating material. As the third insulating material layer, which includes an inorganic insulating material, may be formed and the second insulating layer 520, which includes an organic insulating material and may be patterned to cover the light-emitting elements ED, may be formed, the light-emitting elements ED can be prevented from deviating from the region between the first and second electrodes 210 and 220 due to the fluidity of an organic insulating material.

In one example, the third insulating material layer, which includes an inorganic insulating material, may be applied on the entire surface of the first insulating layer 510 where the light-emitting elements ED may be disposed. Thereafter, the second insulating material layer, which includes an organic insulating material, may be applied on the third insulating material layer and may be subjected to exposure and development, thereby forming the second insulating layer 520, which may be patterned. Thereafter, the third insulating layer 530, which may be patterned, may be formed by removing part of the third insulating material layer through etching using the second insulating layer 520 as a mask. As part of the third insulating material layer may be removed using the second insulating layer 520 as a mask, the second and third insulating layers 520 and 530 may generally have a similar pattern.

The second and third insulating layers 520 and 530 may be formed such that the height dc of the top surface of the second insulating layer 520 may be the same as the heights da1, da2, and da3 of the top surface of the first insulating layer 510 on the first sub-bank 410, the second sub-bank 420, and the height difference compensation pattern 430, respectively. For example, the thicknesses of the second and third insulating layers 520 and 530 may be controlled such that the height dc of the top surface of the second insulating layer 520 may be the same as, or similar to, the heights da1, da2, and da3 of the top surface of the first insulating layer 510 on the first sub-bank 410, the second sub-bank 420, and the height difference compensation pattern 430, respectively.

Thereafter, the contact electrode material layer 700', which may be patterned, and a stopper ST may be formed.

The contact electrode material layer 700' may be disposed in the emission area EMA. The contact electrode material layer 700' may be formed to completely cover the first bank 400, the light-emitting elements ED, and the second insulating layer 520. The contact electrode material layer 700' may be disposed on the first insulating layer 510, in an area where the contact electrode material layer 700' overlaps the side surfaces and the top surface of the first bank 400. Also, the contact electrode material layer 700' may cover end portions of each of the light-emitting elements ED exposed by the second insulating layer 520. The contact electrode material layer 700' may completely cover the side surfaces and the top surface of the second insulating layer 520. For example, the contact electrode material layer 700' may be formed as a single pattern to completely cover the outer surfaces of each of the first bank 400, the light-emitting elements ED, and the second insulating layer 520. The contact electrode material layer 700' may form an island pattern in the emission area EMA.

The contact electrode material layer 700' may be disposed on the first insulating layer 510 and may be deposited even on the inside of the first and second openings OP1 and OP2, which penetrate the first insulating layer 510, to be in contact with the first and second alignment lines 210' and 220'.

The stopper ST may be disposed in the subarea SA. The stopper ST may be disposed on the top surface of the height difference compensation pattern 430. The stopper ST may overlap the third opening OP3. The stopper ST may function as a polishing stopper during CMP that will be described later.

The contact electrode material layer 700' and the stopper ST may be formed by a mask process. In one example, the contact electrode material layer 700' may be deposited on the entire surface of the first insulating layer 510 where the second insulating layer 520 and the light-emitting elements ED may be formed. The contact electrode material layer 700' may include the same material as the contact electrode layer 700.

During the deposition of the contact electrode material layer 700', the contact electrode material layer 700' may be deposited even on the inside of the first and second openings OP1 and OP2, which penetrate the first insulating layer 510, and may thus be connected to the first and second alignment lines 210' and 220'. Thereafter, a photoresist layer may be applied on the contact electrode material layer 700' and may be subjected to exposure and development, thereby forming a photoresist pattern. Thereafter, the contact electrode material layer 700' may be etched using the photoresist pattern as a mask. Thereafter, the photoresist pattern may be removed by stripping or ashing, thereby forming the contact electrode material layer 700 and the stopper ST, which may be patterned as illustrated in FIGS. 20 and 21.

Thereafter, referring to FIGS. 22 through 25, the first and second contact electrodes 710 and 720, which may be spaced apart from each other, may be formed by removing part of the contact electrode material layer 700'.

The formation of the first and second contact electrodes 710 and 720 may include applying a photoresist layer PR1 on the contact electrode material layer 700' (see FIG. 23), forming a photoresist pattern PR2, which exposes part of the top surface of the contact electrode material layer 700', by removing part of the photoresist layer PR1 through CMP (see FIG. 24), and removing part of the contact electrode material layer 700' and the stopper ST using the photoresist pattern PR2 as an etching mask.

Figure 23:
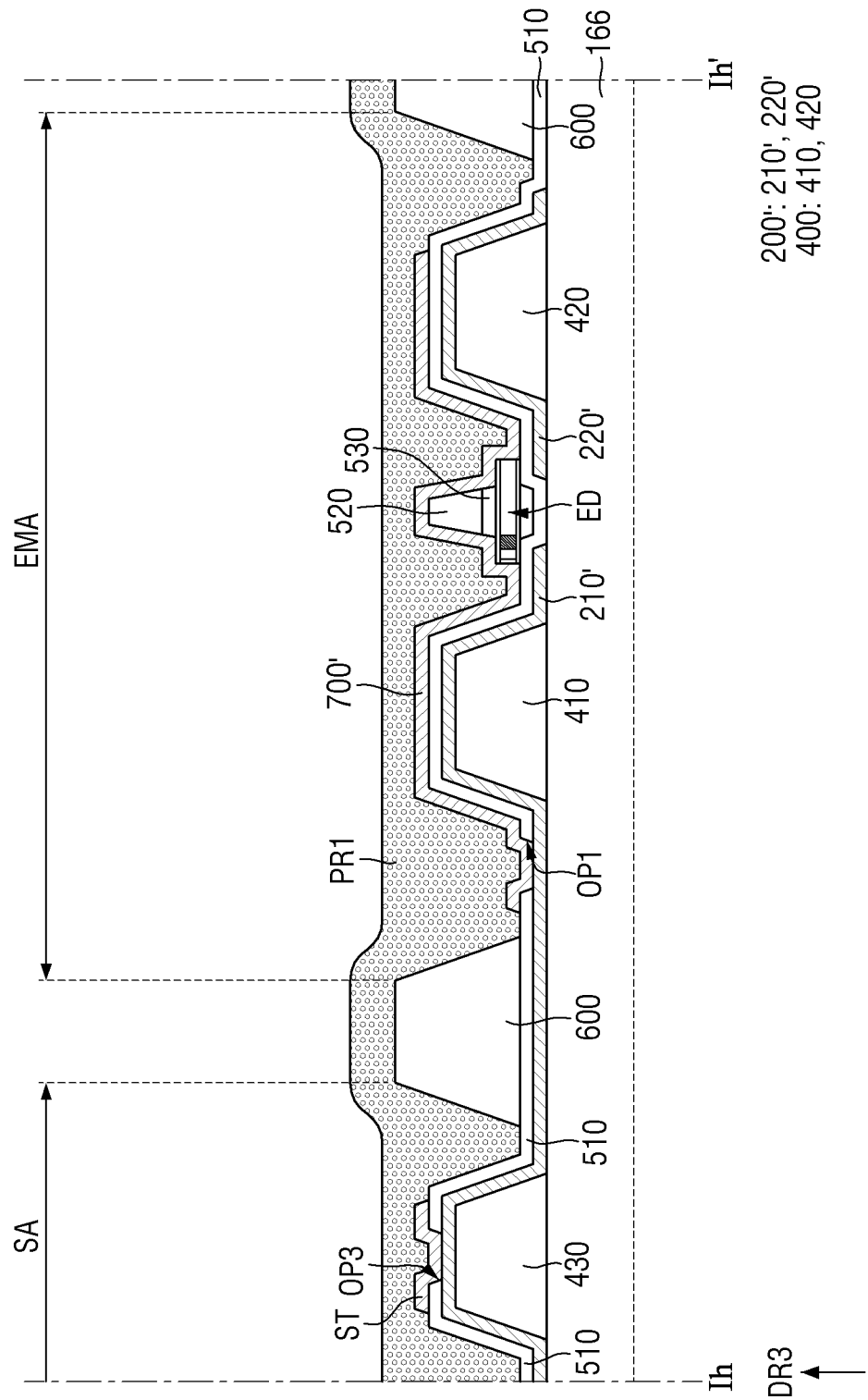

Specifically, referring to FIG. 23, the photoresist layer PR1 may be applied on the contact electrode material layer 700'. The photoresist layer PR1 may be applied on the entire surface of the contact electrode material layer 700'. The photoresist layer PR1 may include a different material from the contact electrode material layer 700'. In one example, the photoresist layer PR1 may include an organic material.

Figure 24:
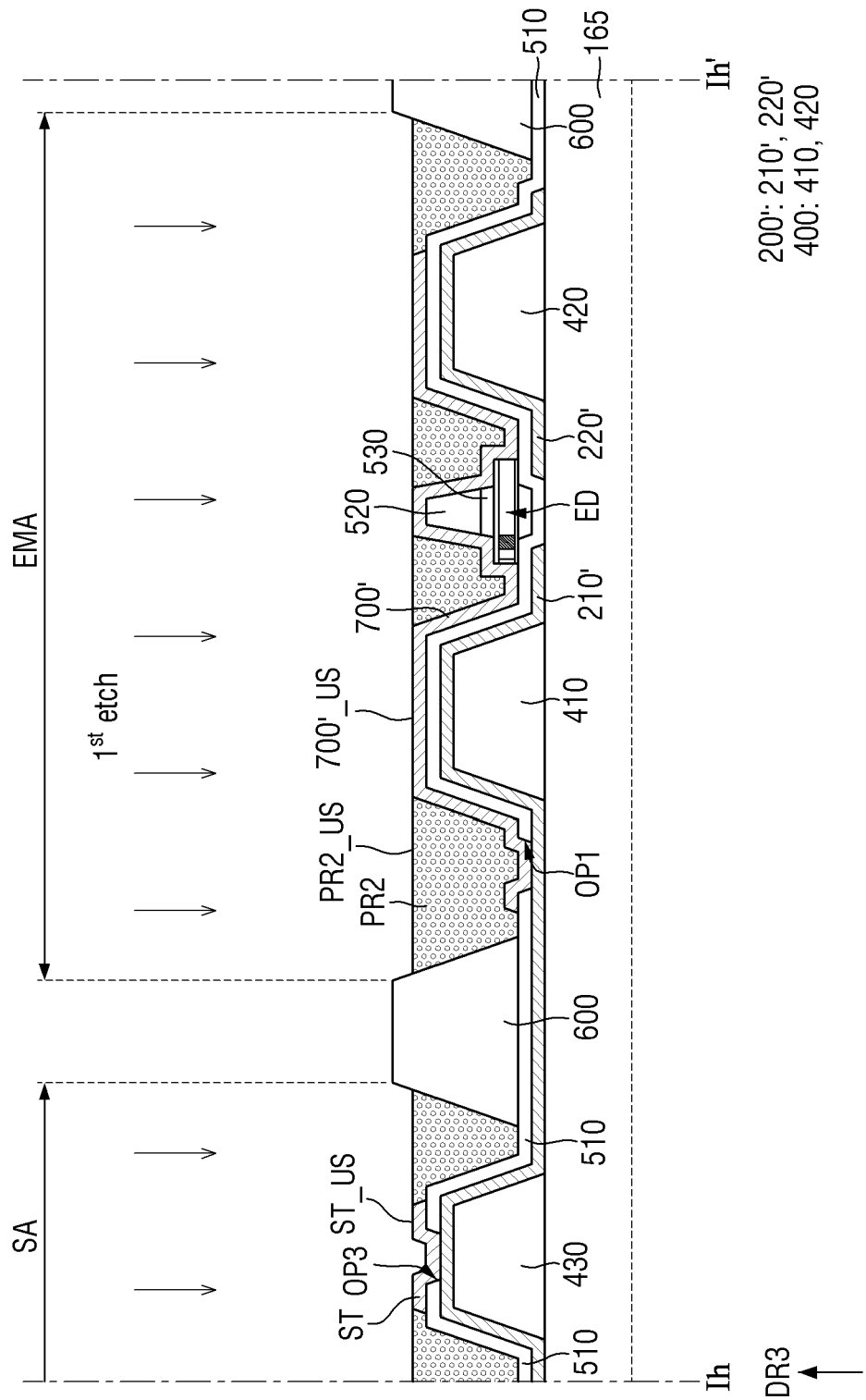

Thereafter, referring to FIGS. 23 and 24, the photoresist pattern PR2, which exposes part of the top surface of the contact electrode material layer 700', may be formed by removing part of the photoresist layer PR1 through CMP.

The contact electrode material layer 700' and the stopper ST may function as polishing stoppers during CMP. Thus, the photoresist layer PR1 may be polished until the top surfaces of the contact electrode material layer 700' and the stopper ST may be exposed by CMP. For example, CMP may be performed using the contact electrode material layer 700' and the stopper ST as polishing stoppers, until a top surface 700' US of the contact electrode material layer 700' on the first bank 400 and a top surface ST US of the stopper ST may be exposed. As the photoresist layer PR1 may be polished by CMP, the top surfaces (700' US) of parts of the contact electrode material layer 700' on the top surface of the first bank 400 and the top surface (ST US) of the stopper ST on the top surface of the height difference compensation pattern 430 may all fall on the same plane. Although not specifically illustrated, as part of the second bank 600 may be polished by CMP, the top surface of the second bank 600 and a top surface PR2 US of the photoresist pattern PR2 may both fall on the same plane.

As a result of CMP, parts of the contact electrode material layer 700' on the top surfaces of the first bank 400 and the second insulating layer 520, which generally have a similar height, and the stopper ST on the top surface of the height difference compensation pattern 430 may be exposed. Parts of the contact electrode material layer 700' on the side surfaces of the first bank 400 and on the side surfaces of the second insulating layer 520 may be covered by the photoresist pattern PR2. For example, due to height differences in the contact electrode material layer 700' that may be caused by the thicknesses of the first bank 400 and the second insulating layer 520, parts of the contact electrode material layer 700' at a relatively low level may be covered by the photoresist pattern PR2, and parts of the contact electrode material layer 700' at a relatively high level may be exposed by the photoresist pattern PR2.

Figure 25:
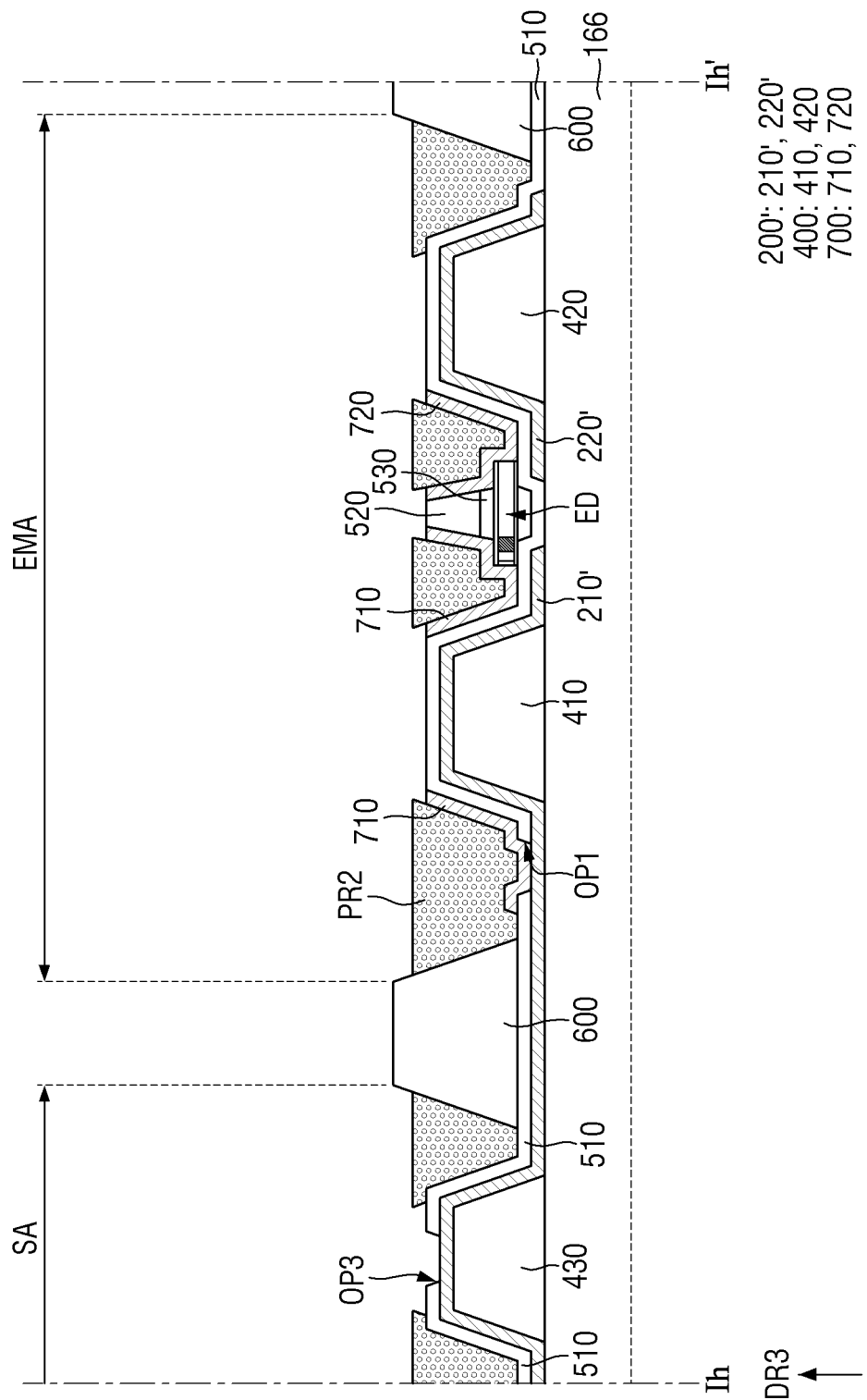

Thereafter, referring to FIGS. 24 and 25, parts of the contact electrode material layer 700' and the stopper ST may be removed using the photoresist pattern PR2 as an etching mask. As a result, parts of the contact electrode material layer 700' at the same height and the stopper ST may be removed.

Specifically, parts of the contact electrode material layer 700' that may be exposed by the photoresist pattern PR2 and overlap the top surface of the first bank 400, part of the contact electrode material layer 700' that may be exposed by the photoresist pattern PR2 and overlaps the top surface of the second insulating layer 520, and the stopper ST that may be exposed by the photoresist pattern PR2 and overlaps the top surface of the second insulating layer 520 may be removed from the emission area EMA. As part of the contact electrode material layer 700' formed on the second insulating layer 520 may be removed, the first and second contact electrodes 710 and 720, which may be spaced apart from each other, may be formed.

Also, the stopper ST exposed by the photoresist pattern PR2 may be removed from the subarea SA, and as a result, part of the alignment line layer 200' may be exposed by the third opening OP3.

Figure 26:
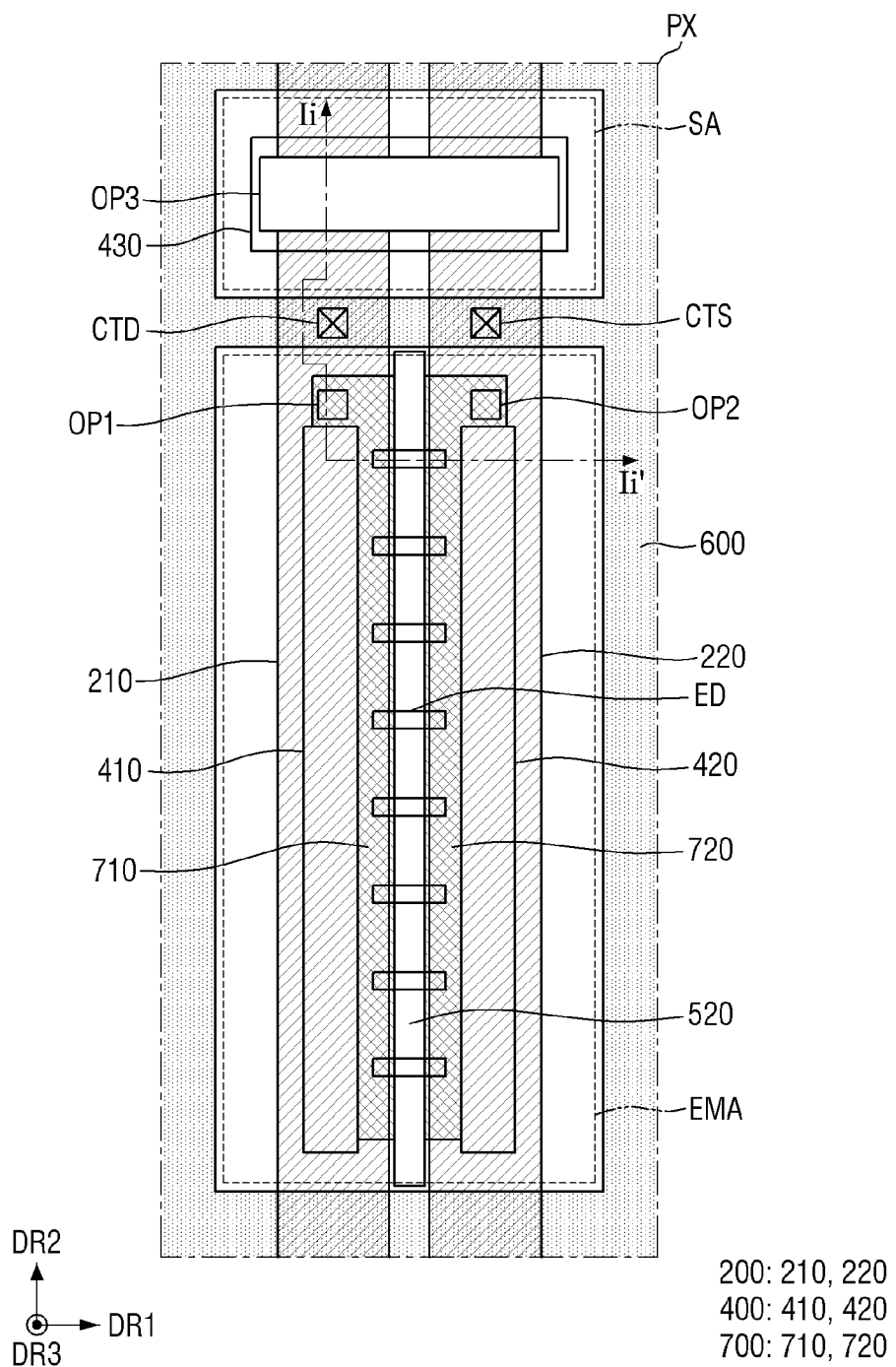
Figure 27:
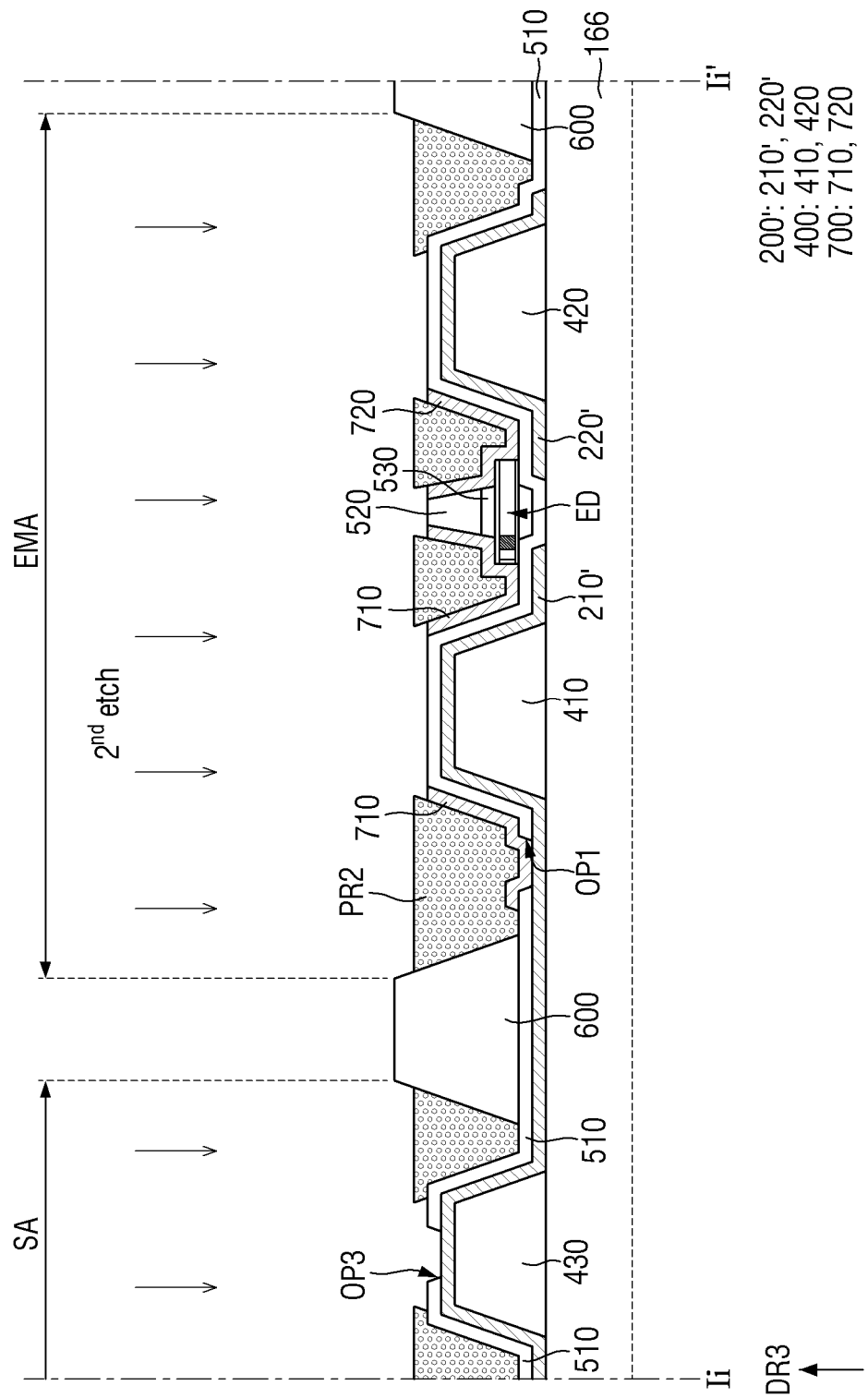
Figure 28:
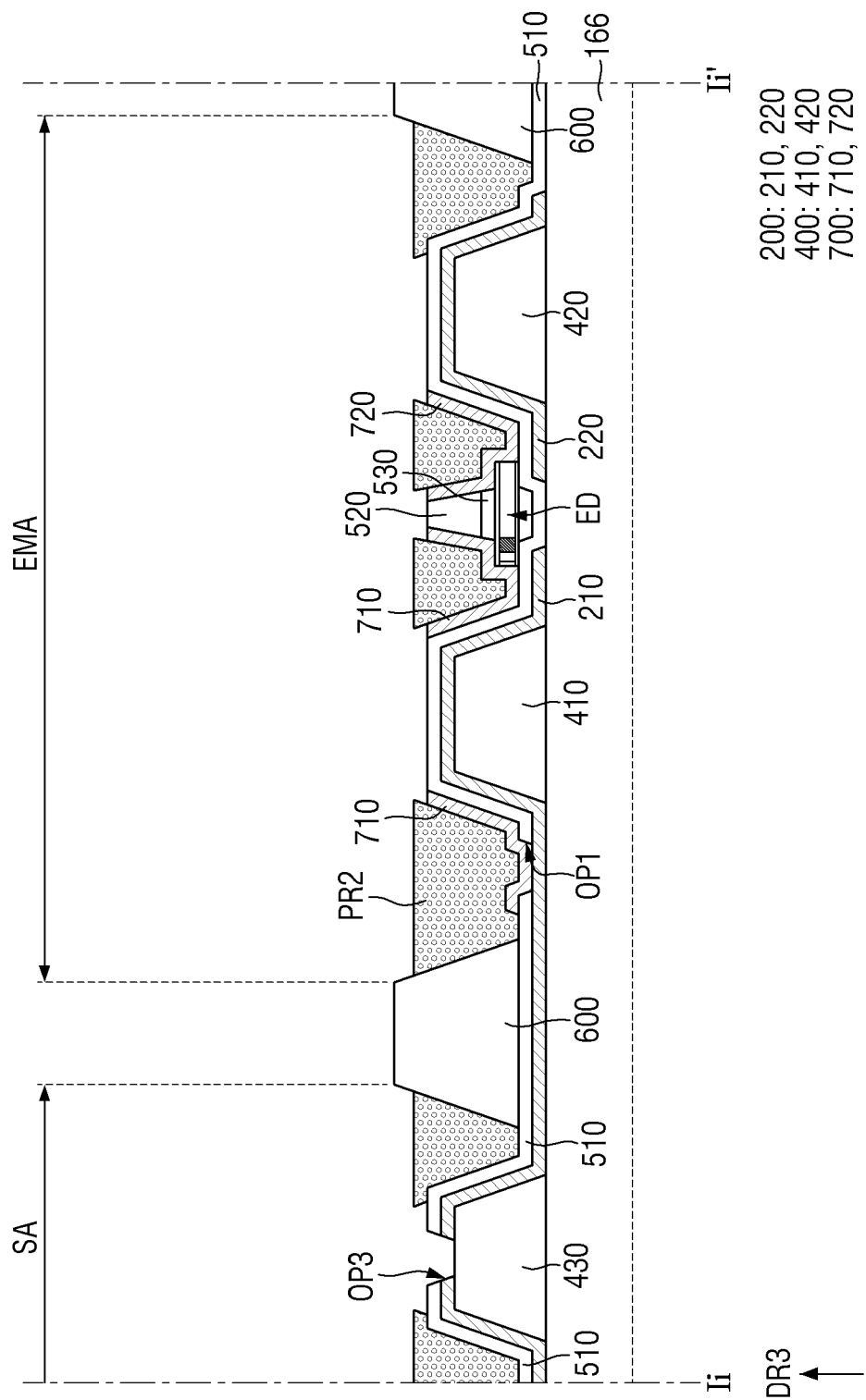

Thereafter, referring to FIGS. 26 through 28, the first and second electrodes 210 and 220 may be formed by cutting up the first and second alignment lines 210' and 220'.

Specifically, referring to FIG. 27, the first and second electrodes 210 and 220, which may be separate from each other, may be formed through etching that removes part of the alignment line layer 200' exposed by the third opening OP3. As the part of the alignment line layer 200' exposed by the third opening OP3 may be disposed the height difference compensation pattern 430, the part of the alignment line layer 200' exposed by the third opening OP3 may be located at a level increased by as much as the thickness of the height difference compensation pattern 430. Also, as the height difference compensation pattern 430 may be formed to have a thickness, the part of the alignment line layer 200' exposed by the third opening OP3 may not be covered, but exposed by the photoresist pattern PR2. Thus, as the part of the alignment line layer 200' exposed by the third opening OP3 may be removed without a requirement of an additional mask process, the first and second electrodes 210 and 220, which may be separate from each other as illustrated in FIGS. 26 and 28, can be formed.

Thereafter, the photoresist pattern PR2 may be removed by stripping or ashing, thereby obtaining the display device 10 of FIG. 5.

Figure 29:
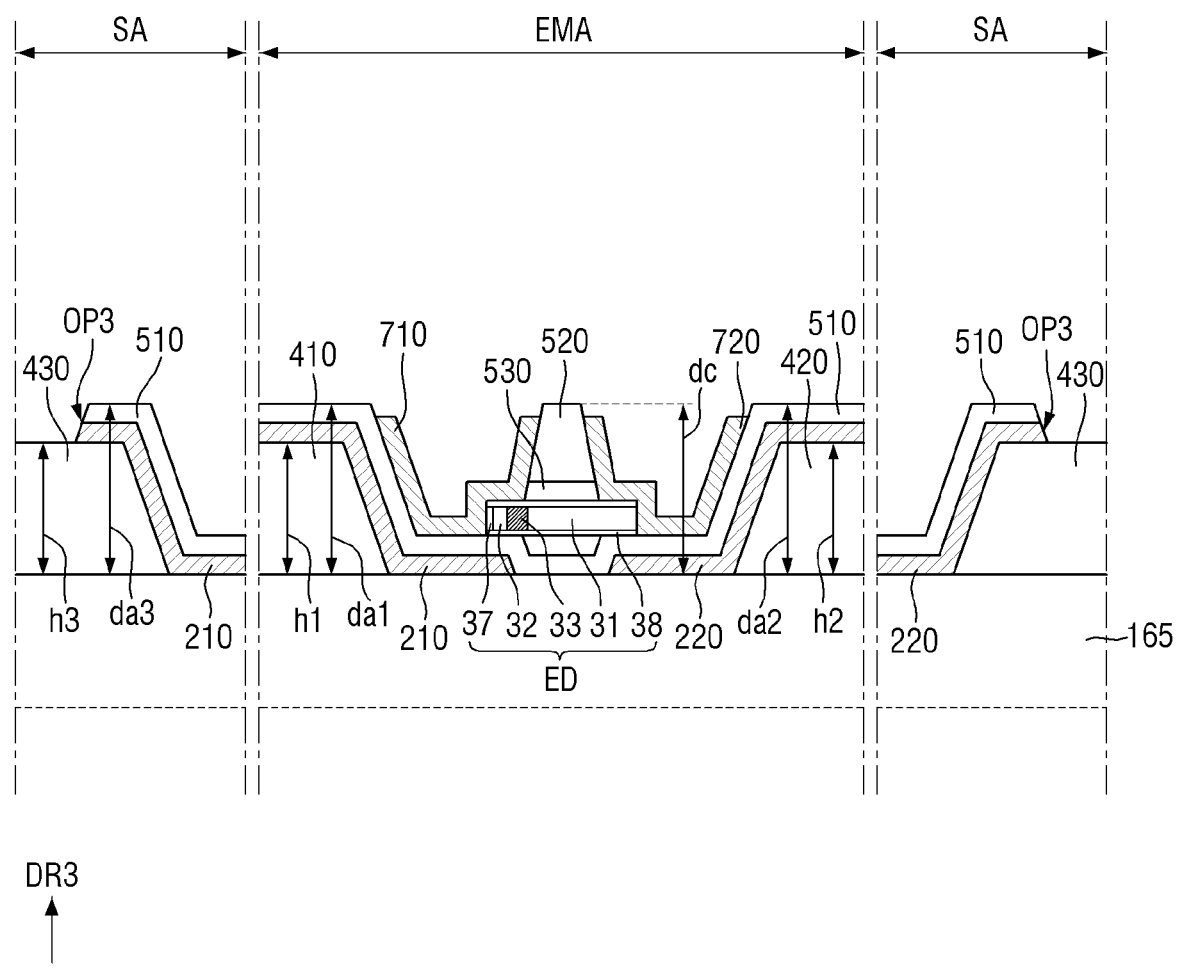
FIG. 29 is an enlarged schematic cross-sectional view of a display device according to another embodiment of the disclosure.

FIG. 29 is an enlarged schematic cross-sectional view of a display device according to another embodiment of the disclosure.

Referring to FIG. 29, the embodiment of FIG. 29 differs from the embodiment of FIG. 7 in that end portions of each of first and second contact electrodes 710 and 720 may be located lower than the top surface of a second insulating layer 520. Specifically, in a case where a contact electrode material layer 700' (see FIG. 24) may be etched for a sufficient amount of time, the contact electrode material layer 700' may be over-etched, in which case, the display device of FIG. 29 can be obtained.

Figure 30:
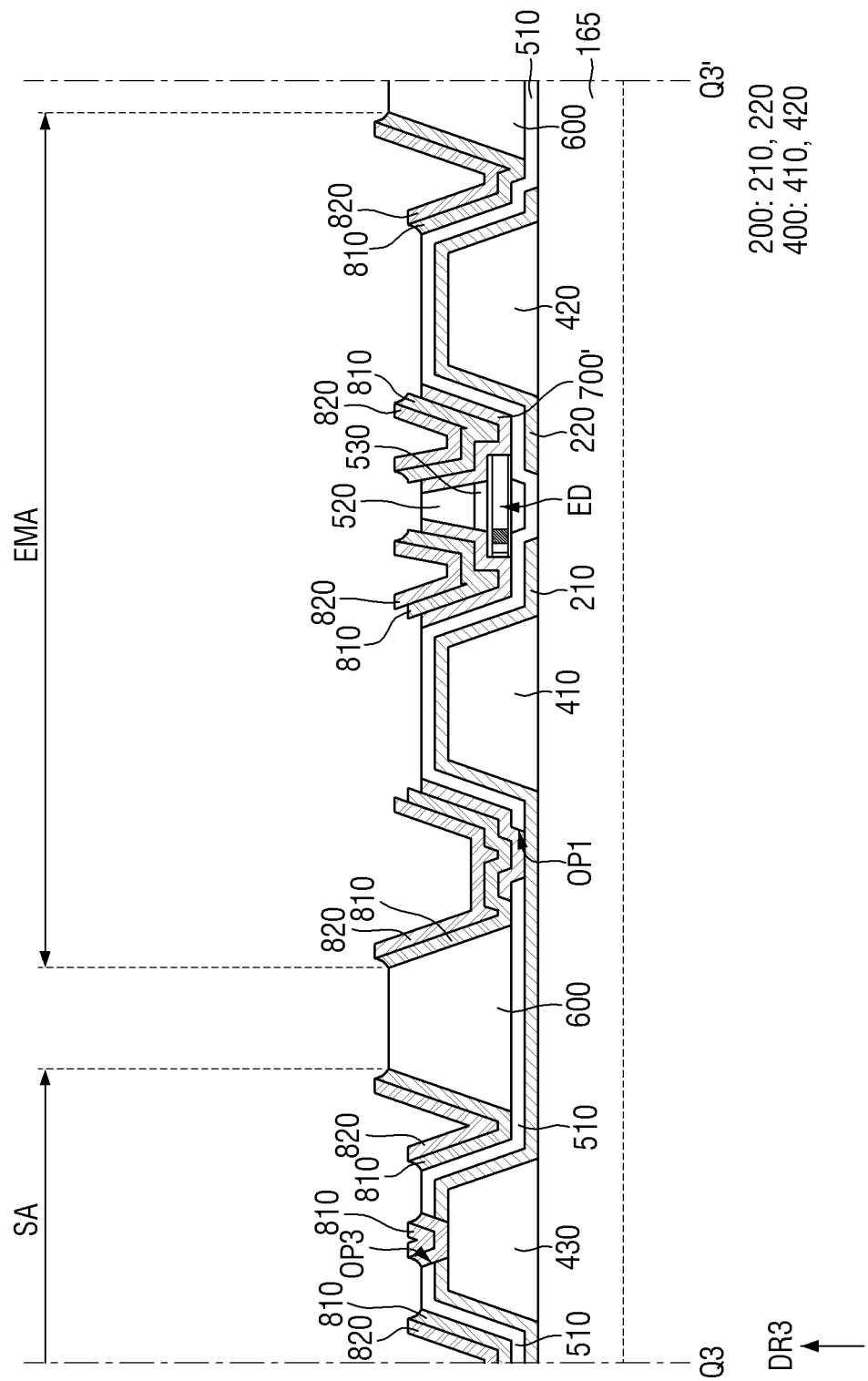
FIG. 30 is a schematic cross-sectional view taken along line Q3-Q3' of FIG. 2.

FIG. 30 is a schematic cross-sectional view taken along line Q3-Q3' of FIG. 2.

Referring to FIG. 30, the embodiment of FIG. 30 differs from the embodiment of FIG. 5 in that fourth and fifth insulating layers 810 and 820, which may be disposed on first and second contact electrodes 710 and 720 to cover the first and second contact electrodes 710 and 720, may further be provided.

Specifically, a display device 10 may further include the fourth and fifth insulating layers 810 and 820, which may be disposed on a contact electrode layer 700. The fourth and fifth insulating layers 810 and 820 may overlap the contact electrode layer 700 in a third direction DR3 to cover the contact electrode layer 700. The fourth and fifth insulating layers 810 and 820 may not be disposed on the top surfaces of a second insulating layer 520, a first bank 400, and a height difference compensation pattern 430.

The fourth and fifth insulating layers 810 and 820 may protect the elements disposed therebelow and may be used as etching masks during a contact electrode division process. Specifically, the contact electrode division process may be performed by CMP using the fourth insulating layer 710 as a polishing stopper and the fifth insulating layer 820 as a polishing layer.

The fourth and fifth insulating layers 810 and 820 may include an inorganic material. The fourth and fifth insulating layers 810 and 820 may include different materials. The fourth insulating layer 810 may include a material having a lower CMP selectivity than the fifth insulating layer 820. In one example, the fourth insulating layer 810 may include $SiN_x$, and the fifth insulating layer 820 may include silicon oxide $SiO_x$.

As the contact electrode division process may be performed by CMP using the fourth and fifth insulating layers 810 and 820, the first and second contact electrodes 710 and 720 can be formed by dividing the contact electrode material layer 700' without a requirement of an additional mask or design process.

FIGS. 31 through 38 are schematic plan views or cross-sectional views illustrating steps of a method of fabricating the display device of FIG. 30.

Figure 31:
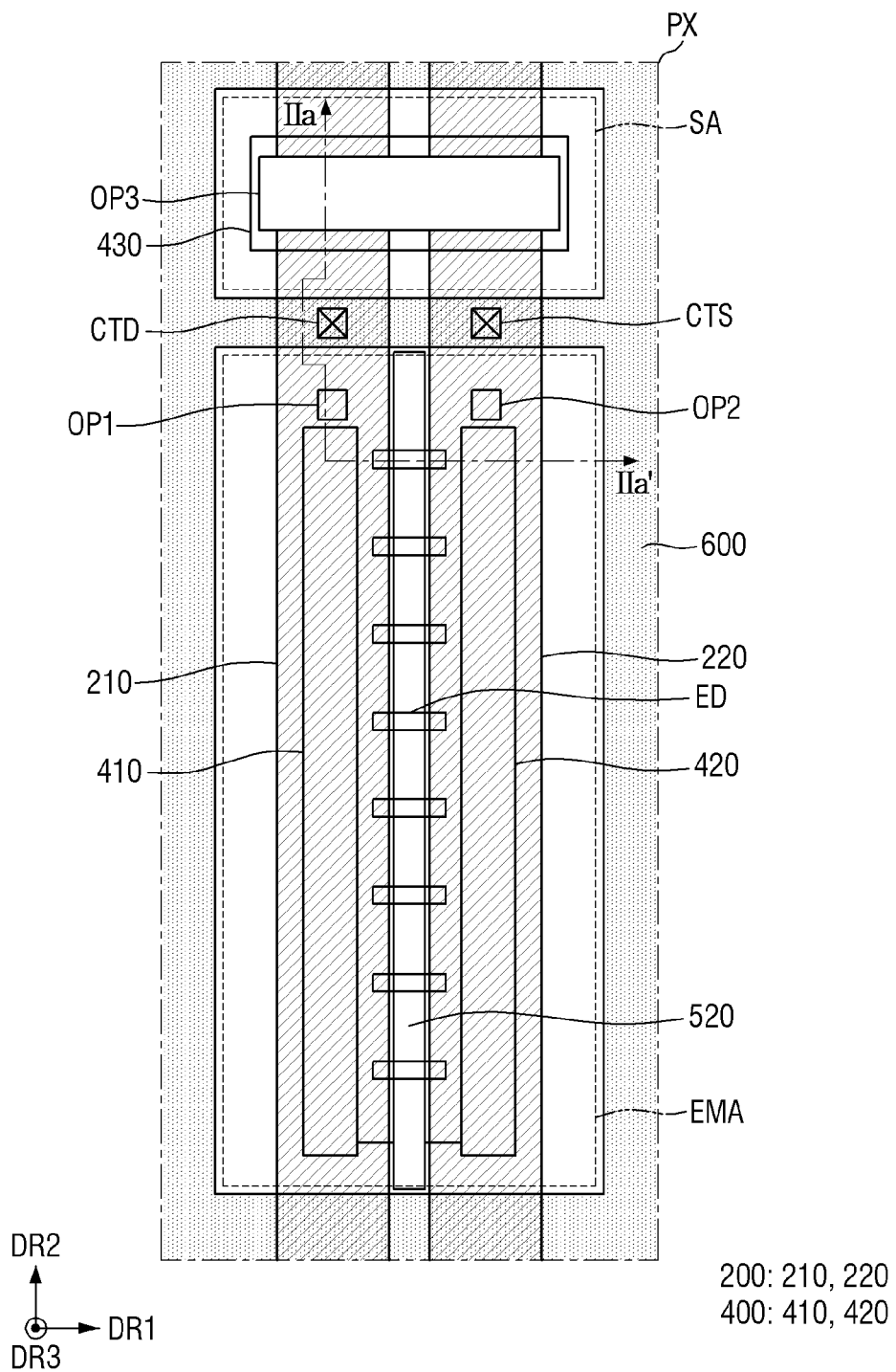
Figure 32:
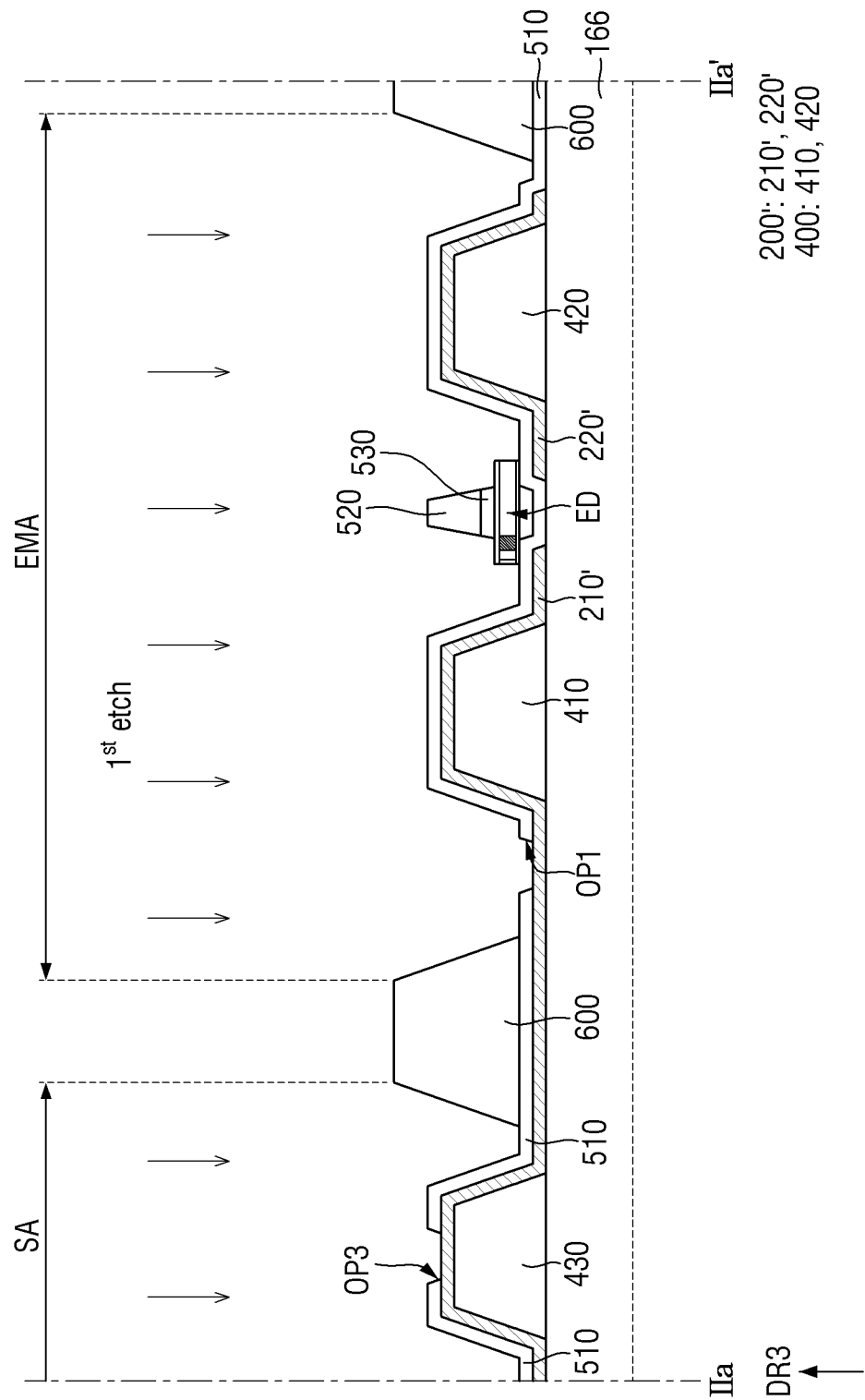
Figure 33:
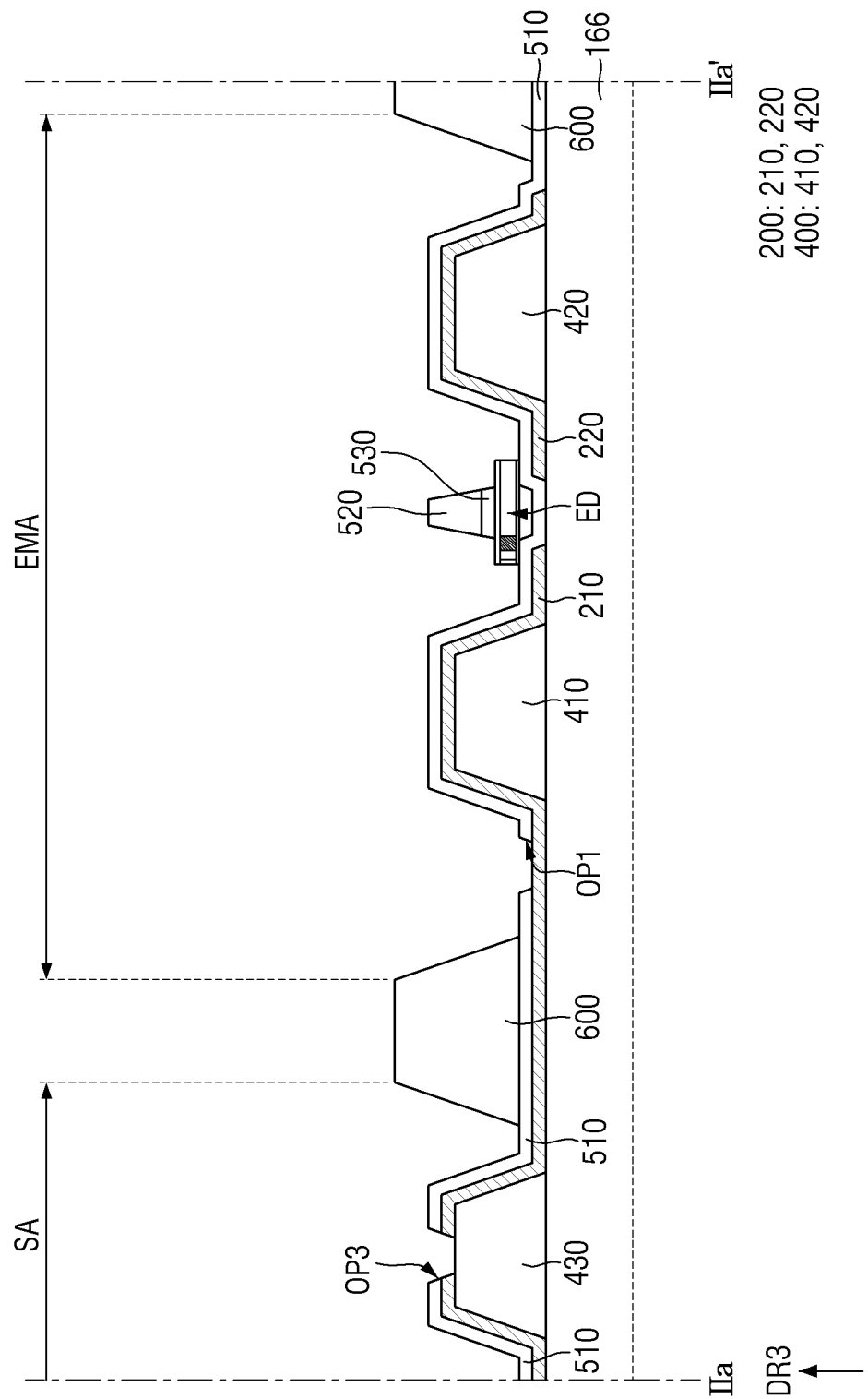

FIGS. 31 through 38 illustrate plan views of the display device 10 of FIG. 30, which correspond to the plan view of the display device 10 of FIG. 2, and illustrate cross-sectional views, taken along line Q3-Q3' of FIG. 2, of the display device 10 of FIG. 30. Specifically, FIGS. 32 and 33 are cross-sectional views taken along line IIa-IIa' of FIG. 31, and FIGS. 35 through 38 are cross-sectional views taken along line IIb-IIb' of FIG. 34.

FIGS. 31 and 32 illustrate steps or processes to be performed after the formation of the second and third insulating layers 520 and 530 during the fabrication of the display device 10 of FIG. 30. A detailed description of how to fabricate the display device of FIG. 30 will be omitted, and the embodiment of FIGS. 31 through 38 will hereinafter be described, focusing on the differences with the embodiment of FIGS. 8 through 28.

Referring to FIGS. 31 through 33, the first and second electrodes 210 and 220 may be formed by cutting up the first and second alignment lines 210' and 220'.

Specifically, the first and second electrodes 210 and 220, which may be separate from each other, are formed by removing part of the alignment line layer 200' exposed by the third opening OP3. As the part of the alignment line layer 200' exposed by the third opening OP3 may be disposed on the height difference compensation pattern 430, the part of the alignment line layer 200' exposed by the third opening OP3 may be located at a level increased by as much as the thickness of the height difference compensation pattern 430. As a result, damage that may be caused by etching to other elements can be minimized. Thus, as the part of the alignment line layer 200' exposed by the third opening OP3 may be removed without a requirement of an additional mask process, the first and second electrodes 210 and 220, which are separate from each other as illustrated in FIG. 33, can be formed.

Figure 34:
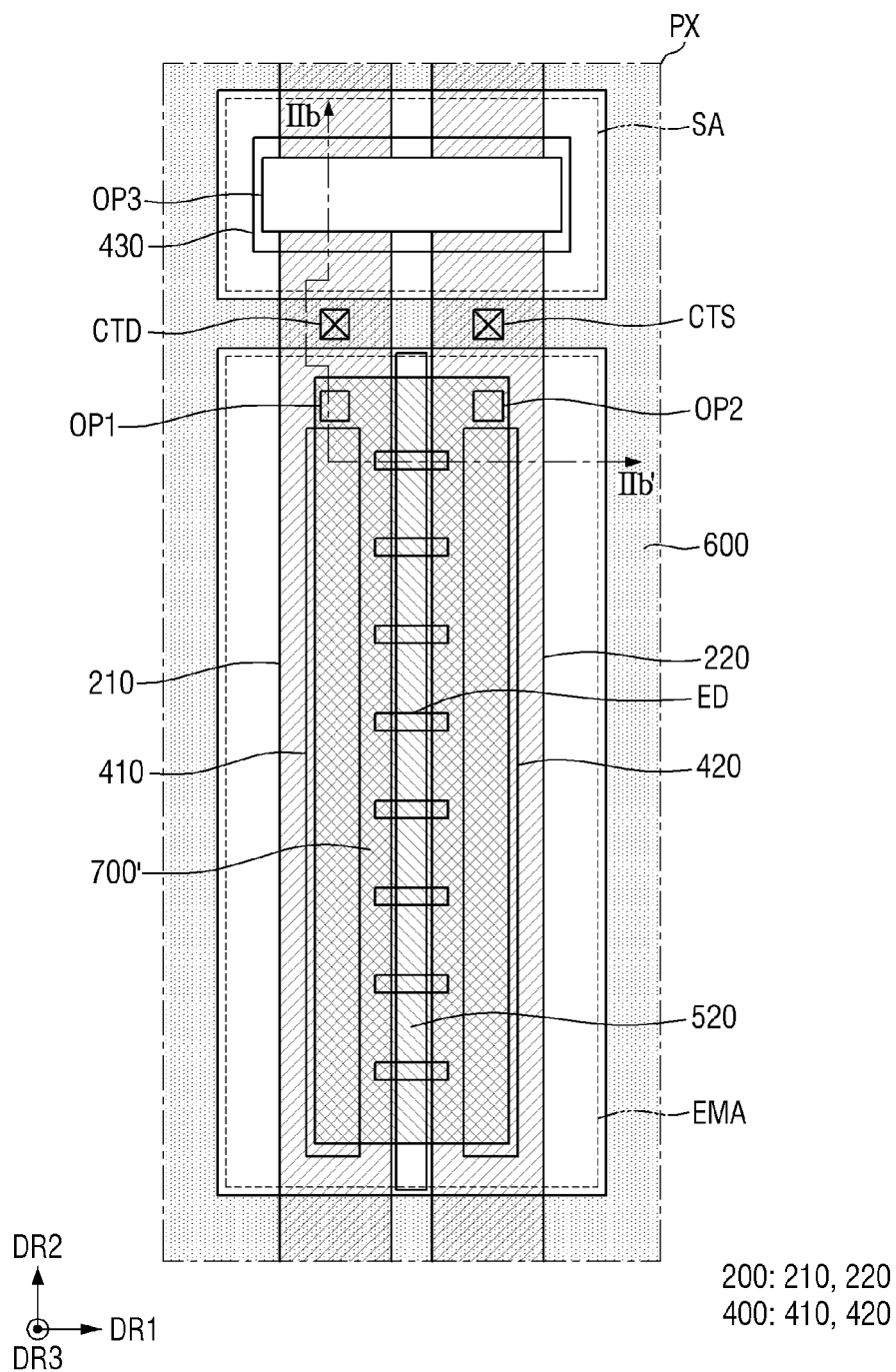
Figure 35:
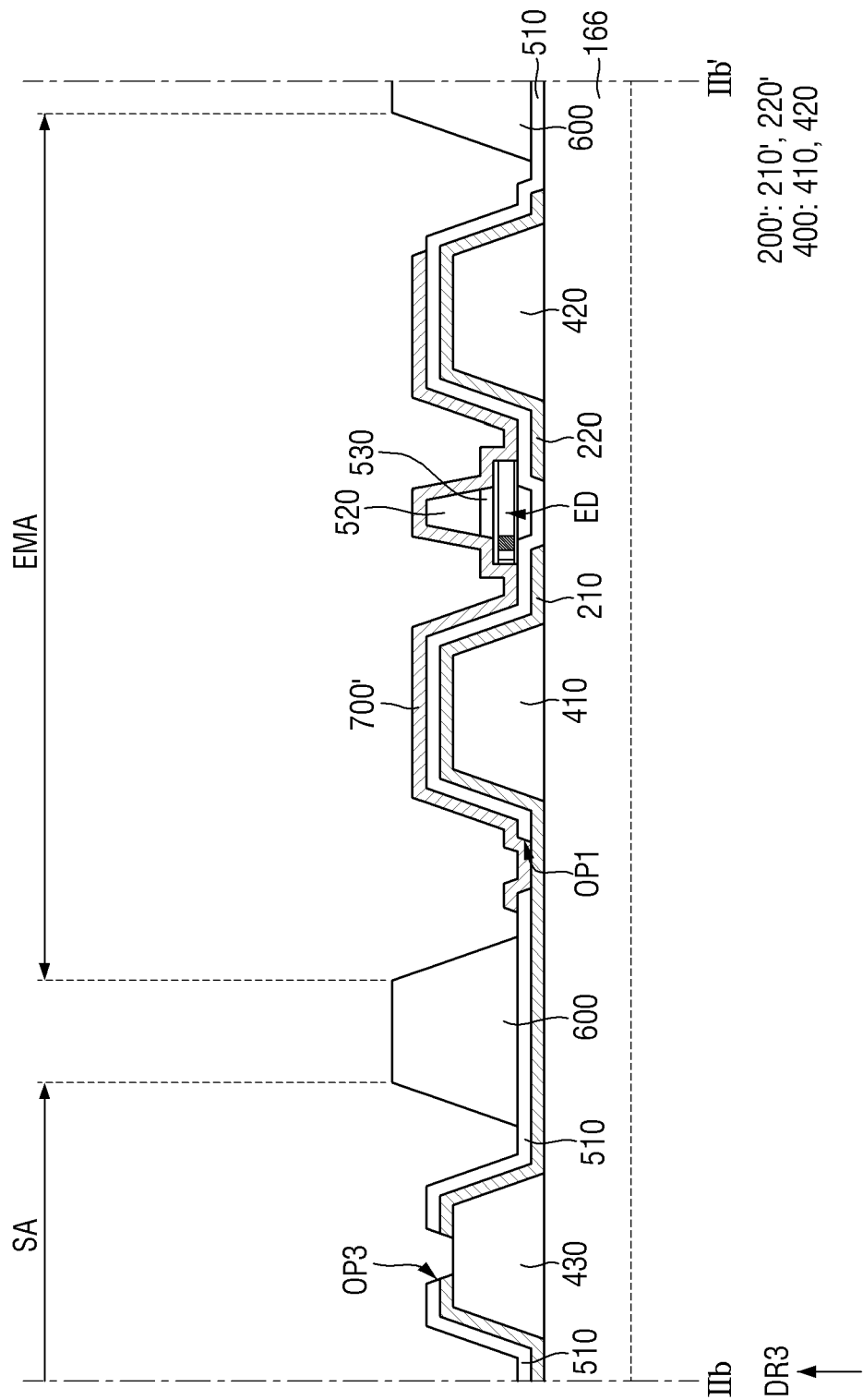

Thereafter, referring to FIGS. 34 and 35, the contact electrode material layer 700', which may be patterned, may be formed in the emission area EMA.

The contact electrode material layer 700 may be disposed in the emission area EMA. The contact electrode material layer 700' may have a shape and structure illustrated in FIG. 35. As the alignment line division process may be performed before the contact electrode division process, a stopper ST may not be formed in the subarea SA.

Figure 36:
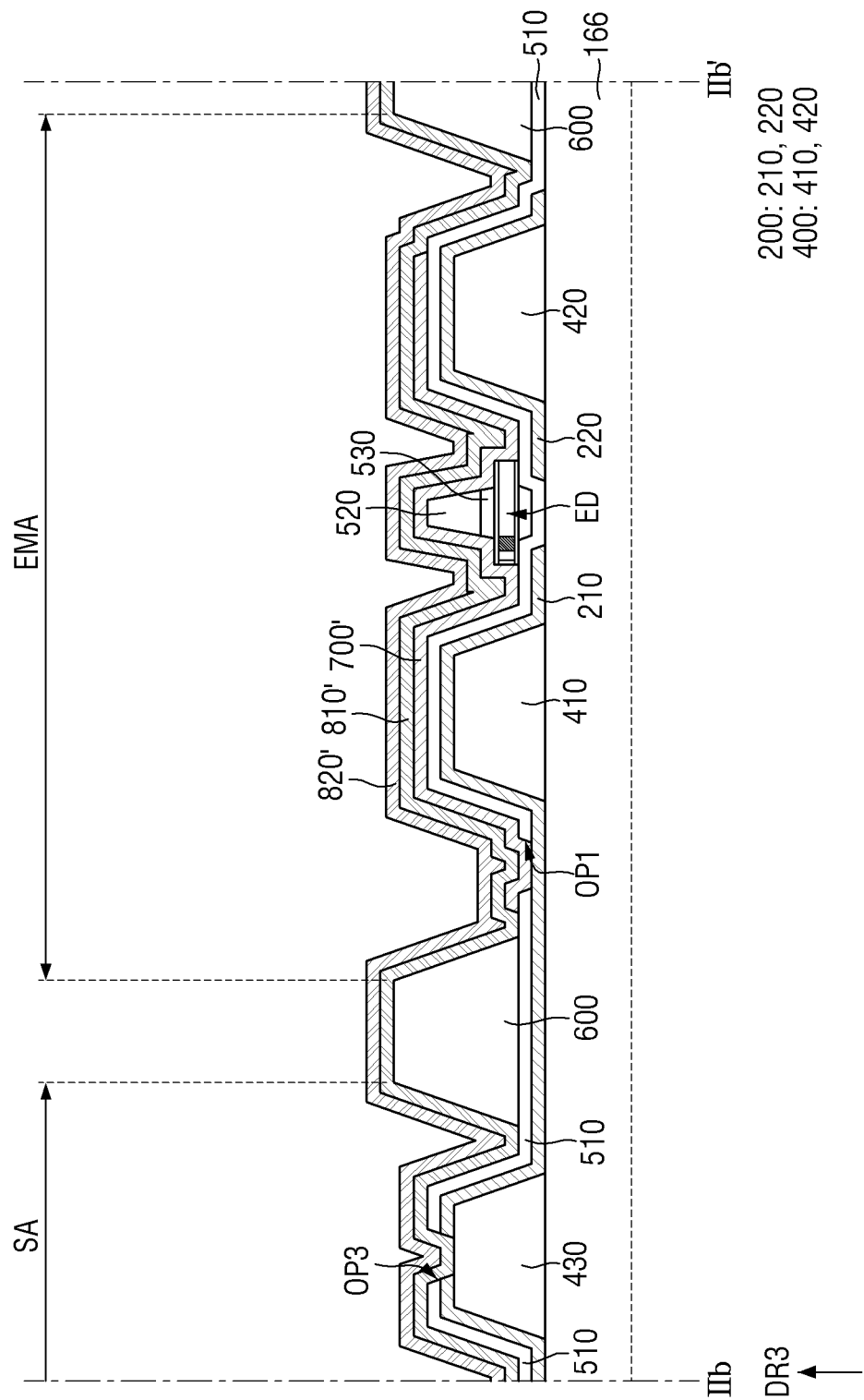

Thereafter, referring to FIG. 36, fourth and fifth insulating material layers 810' and 820' may be sequentially stacked on each other on the entire surface of the via layer 166 where the contact electrode material layer 700' may be formed. The fourth and fifth insulating material layers 810' and 820' may correspond to the fourth and fifth insulating layers 810 and 820, respectively. Thus, the fourth and fifth insulating material layers 810' and 820', like the fourth and fifth insulating layers 810 and 820, may include different materials. In one example, the fourth insulating material layer 810' may include $SiN_x$, and the fifth insulating material layer 820' may include $SiO_x$.

Figure 37:
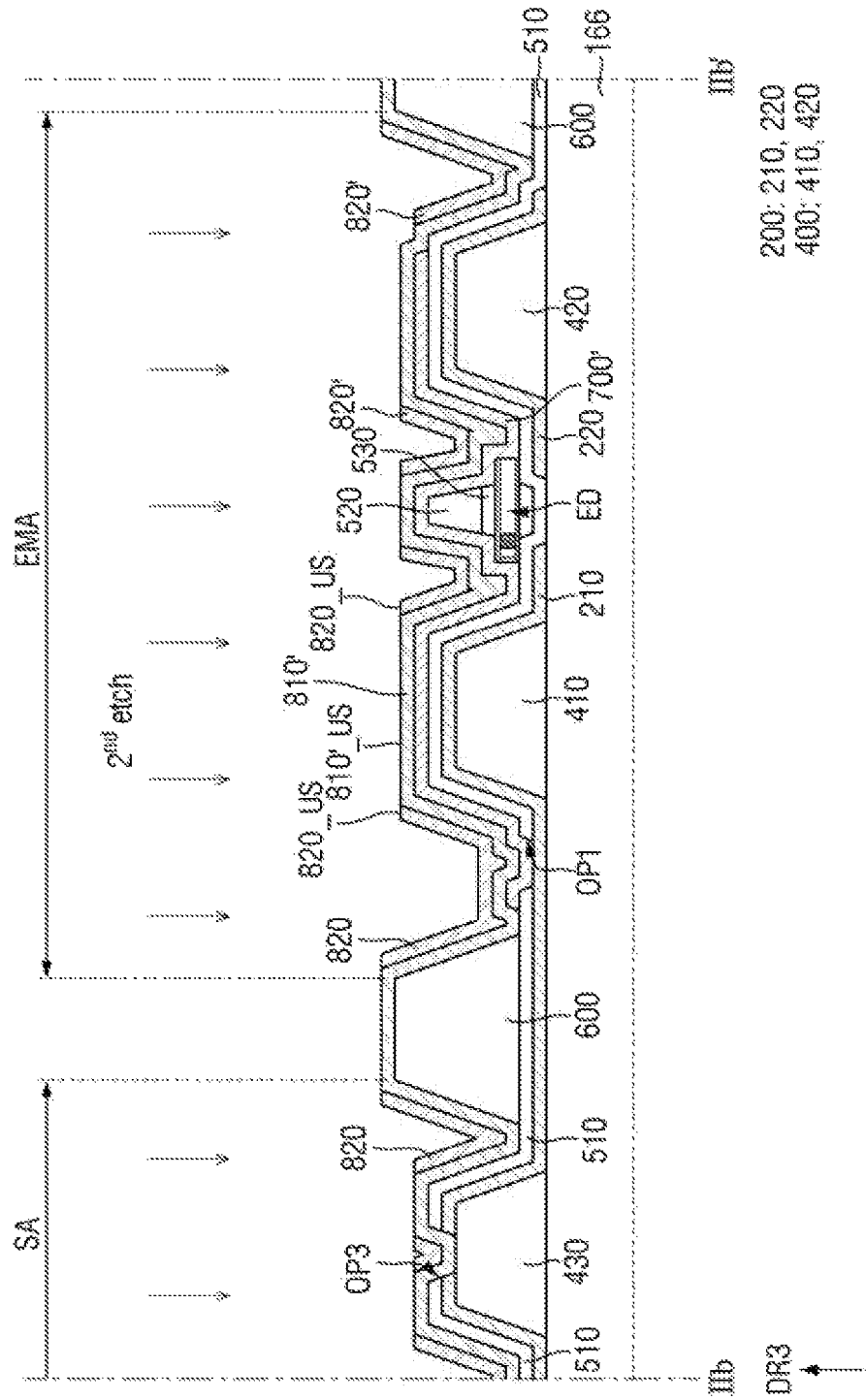

Thereafter, referring to FIG. 37, part of the fifth insulating material layer 820' may be removed by CMP, thereby forming the fifth insulating layer 820, which exposes part of the fourth insulating material layer 810'.

Specifically, the fourth insulating material layer 810' may function as a polishing stopper during CMP. Thus, the fifth insulating material layer 820' may be polished until the top surface of the fourth insulating material layer 810' may be exposed by CMP. For example, CMP may be performed using the fourth insulating material layer 810' as a polishing stopper, until parts of the fourth insulating material layer 810 on the first bank 400 and on the top surface of the second insulating layer 520 may be exposed. As a result of CMP, a top surface 820 US of the fifth insulating layer 820, which may be obtained by polishing the fifth insulating material layer 820', and a top surface 810' US of the fourth insulating material layer 810 on the top surface of the first bank 400 and on the top surface of the second insulating layer 820 may fall on the same plane.

Thereafter, referring to FIGS. 37 and 38, the fourth insulating layer 810 may be formed by removing part of the fourth insulating material layer 810' through etching using the fifth insulating layer 820 as an etching mask.

Specifically, etching may be performed using the fifth insulating layer 820 as an etching mask. During etching, part of the fourth insulating material layer 810' exposed by the fifth insulating layer 820 may be removed. Specifically, part of the fourth insulating material layer 810' on the top surface of the second insulating layer 820 may be removed so that part of the contact electrode material layer 700' on the first insulating layer 510 may be removed. Here, dry etching may be performed on the fifth insulating layer 820, but the disclosure is not limited thereto.

Parts of the fourth insulating material layer 810' on the top surface of the first bank 400, on the top surface of the second bank 600, and on the top surface of the height difference compensation pattern 430 may also be removed. For example, as parts of the fourth insulating material layer 810' at a height may be exposed by the fifth insulating layer 820 and may thus be etched away, the fourth insulating layer 810, which has a top surface covered by the fifth insulating layer 820, as illustrated in FIG. 38, may be formed.

Thereafter, referring to FIG. 38, part of the contact electrode material layer 700' may be removed by performing etching using the fourth and fifth insulating layers 810 and 820 as etching masks, thereby forming the first and second contact electrodes 710 and 720, which may be patterned.

Specifically, the fourth and fifth insulating layers 810 and 820 may expose part of the contact electrode material layer 700' on the top surface of the second insulating layer 520. Thus, as etching may be performed using the fourth and fifth insulating layers 810 and 820 as etching masks, part of the contact electrode material layer 700' exposed by the fourth and fifth insulating layers 810 and 820 may be removed. Here, wet etching may be performed, but the disclosure is not limited thereto. As the part of the contact electrode material layer 700' on the top surface of the second insulating layer 520, exposed by the fourth and fifth insulating layers 810 and 820, may be removed, the first and second contact electrodes 710 and 720, which may be spaced apart from each other with the second insulating layer 820 interposed therebetween, may be formed.

A contact electrode division process for forming a contact electrode material layer formed on a second insulating layer into first and second contact electrodes that may be spaced apart from each other with the second insulating layer interposed therebetween may be performed by CMP. Specifically, a photoresist pattern may be formed by performing CMP using the contact electrode material layer on the second insulating layer as an etching stopper, and as a result, the first and second contact electrodes may be formed by stably dividing the contact electrode material layer. Thus, as the first and second contact electrodes can be stably formed by CMP, the process margin for a display device can be improved. Also, as a height difference separation pattern may be formed in a subarea to have the same height as, or a similar height to, the top surface of the second insulating layer and an alignment line layer may be formed on the height difference separation pattern, the alignment line layer can be divided into first and second electrodes without a requirement of an additional mask process during an alignment line division process. Thus, the manufacturing efficiency for a display device can be improved.

In other embodiments, the contact electrode division process may be performed by CMP using first and second inorganic films having different materials. Specifically, the first and second inorganic films may be sequentially formed on the contact electrode material layer on the second insulating layer, the second inorganic film may be polished using the first inorganic film as a polishing stopper, and part of the second inorganic film exposed by the first inorganic film may be removed. Accordingly, the contact electrode material layer can be stably divided, thereby forming the first and second contact electrodes.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
    a substrate including an emission area and a subarea adjacent to the emission area;
    a bank disposed in the emission area of the substrate;
    a height difference compensation pattern disposed in the subarea of the substrate;
    a first electrode and a second electrode that are disposed on the bank, the first electrode and the second electrode being spaced apart from each other; and
    a light-emitting element disposed in the emission area, between the first electrode and the second electrode.

2. The display device of claim 1, wherein a top surface of the bank and a top surface of the height difference compensation pattern are on a same level.

3. The display device of claim 2, wherein
    the bank includes a first sub-bank and a second sub-bank which are spaced apart from each other, and
    the first electrode and the second electrode are disposed on the first sub-bank and the second sub-bank, respectively.

4. The display device of claim 3, further comprising:
    a first insulating layer disposed on the first electrode and the second electrode; and
    a second insulating layer disposed on the light-emitting element, the second insulating layer exposing end portions of the light-emitting element,
    wherein the light-emitting element is disposed on the first insulating layer.

5. The display device of claim 4, wherein a top surface of the second insulating layer and a top surface of part of the first insulating layer on the top surface of the bank are on a same level.

6. The display device of claim 4, further comprising:
    a first contact electrode electrically connected to the first electrode and a first end portion of the light-emitting element; and
    a second contact electrode electrically connected to the second electrode and a second end portion of the light-emitting element, wherein
    the first contact electrode and the second contact electrode are spaced apart from each other, and
    the second insulating layer is disposed between the first contact electrode and the second contact electrode.

7. The display device of claim 6, wherein the first contact electrode and the second contact electrode are not disposed on the top surface of the bank and on a top surface of the second insulating layer.

8. The display device of claim 6, further comprising:
    a third insulating layer disposed on the first contact electrode and the second contact electrode; and
    a fourth insulating layer disposed on the third insulating layer,
    wherein the third insulating layer and the fourth insulating layer include different materials.

9. The display device of claim 8, wherein the third insulating layer and the fourth insulating layer are not disposed on the top surface of the bank and on a top surface of the second insulating layer.

10. The display device of claim 8, wherein
    the third insulating layer includes silicon nitride ($SiN_x$), and
    the fourth insulating layer includes silicon oxide ($SiO_x$).

11. The display device of claim 1, wherein
    the first electrode and the second electrode extend to be disposed on the height difference compensation pattern, and
    the first electrode and the second electrode expose parts of a top surface of the height difference compensation pattern.

12. The display device of claim 1, further comprising:
    a first insulating layer disposed on the first electrode and the second electrode, wherein the light-emitting element is disposed on the first insulating layer, and
    the first insulating layer includes:
        a first opening exposing part of the first electrode in the emission area;
        a second opening exposing part of the second electrode in the emission area; and
        a third opening exposing part of a top surface of the height difference compensation pattern in the subarea.

13. The display device of claim 12, wherein the third opening does not overlap the first electrode and the second electrode in the subarea.

14. The display device of claim 12, wherein the third opening is located higher than the first opening and the second opening in a cross-sectional view of the display device.

15. The display device of claim 13, wherein the bank and the height difference compensation pattern are formed in a same layer.

* * * * *